United States Patent [19]
Tsuda et al.

[11] Patent Number: 6,076,394
[45] Date of Patent: Jun. 20, 2000

[54] ELECTRIC COMPONENT TRANSFERRING APPARATUS HAVING FUNCTION OF TESTING NEGATIVE-PRESSURE SUCTION, AND APPARATUS AND METHOD FOR TESTING NEGATIVE-PRESSURE SUCTION

[75] Inventors: Mamoru Tsuda, Okazaki; Zenichi Nagatomo, Anjo; Toshikatsu Terashima, Aichi-ken, all of Japan

[73] Assignee: Fuji Machine Mfg. Co., Ltd., Chiryu, Japan

[21] Appl. No.: 08/921,607

[22] Filed: Sep. 2, 1997

[30] Foreign Application Priority Data

Sep. 2, 1996 [JP] Japan .................................. 8-232288

[51] Int. Cl.[7] .............................. H05K 3/30; B23P 19/00; G01M 3/02; B65H 5/08
[52] U.S. Cl. ................................. 73/37; 73/37.6; 29/743; 29/834; 414/752; 414/225; 901/40; 294/64.1
[58] Field of Search ....................... 73/37, 37.6; 414/737, 414/752, 225; 29/740, 743, 833, 834; 901/40; 294/64.1

[56] References Cited

U.S. PATENT DOCUMENTS

| | | | |
|---|---|---|---|
| 4,393,699 | 7/1983 | Seiler, Jr. | 73/150 A |
| 4,624,050 | 11/1986 | Hawkswell | 29/740 |
| 4,683,654 | 8/1987 | Schotten et al. | 29/832 |
| 4,898,507 | 2/1990 | Hawkswell | 414/225 |
| 4,995,157 | 2/1991 | Hall | 29/740 |
| 5,086,559 | 2/1992 | Akatsuchi | 29/834 |
| 5,274,908 | 1/1994 | Suzuki et al. | 29/740 |
| 5,287,727 | 2/1994 | Nickerson, Jr. | 73/37 |
| 5,449,265 | 9/1995 | Leegrady et al. | 414/412 |
| 5,501,005 | 3/1996 | Onitsutra | 29/833 |
| 5,588,195 | 12/1996 | Asai et al. | 29/33 M |
| 5,814,720 | 9/1998 | Visscher | 73/37 |

FOREIGN PATENT DOCUMENTS 4-177896  6/1992  Japan .

Primary Examiner—Hezron Williams
Assistant Examiner—J. David Wiggins
Attorney, Agent, or Firm—Oliff & Berridge, PLC

[57] ABSTRACT

An electric-component transferring apparatus having a suction testing function, including at least one suction device which sucks and holds an electric component by a negative pressure; a suction-device moving device which moves the suction device; a negative-pressure control device which controls the negative pressure supplied to the suction device; a negative-pressure measuring device which measures the negative pressure of the suction device; and a test control device which controls the suction-device moving device, the negative-pressure control device, and the negative-pressure measuring device so that the suction-device moving device moves the suction device to a position where the negative-pressure measuring device is present and the measuring device measures the negative pressure of the suction device.

44 Claims, 22 Drawing Sheets

ELECTRIC COMPONENT TRANSFERRING APPARATUS HAVING FUNCTION OF TESTING NEGATIVE-PRESSURE SUCTION, AND APPARATUS AND METHOD FOR TESTING NEGATIVE-PRESSURE SUCTION

BACKGROUND OF INVENTION

1. Field of the Invention

The present invention relates to an electric component transferring apparatus which includes a suction device for sucking and holding, by a negative pressure, an electric component (i.e., component employed in an electric or electronic circuit) and transfers the suction device holding the component, and particularly relates to the art of testing the sucking function of the suction device.

2. Related Art Statement

There is known an electric component ("EC") transferring apparatus which includes (a) at least one suction device which applies a negative pressure ("NP") to an EC and thereby sucks and holds the EC; a suction-device moving device which moves the suction device; and an NP control device which controls the NP supplied to the suction device. The suction device is moved by the suction-device moving device to an EC sucking position, and is supplied with the NP under control of the NP control device. The suction device applies the NP to the EC and thereby sucks and holds the EC. Subsequently, the suction device is moved by the suction-device moving device to transfer the EC and pass the EC to, e.g., an object such as a printed circuit board ("PCB"). When the suction device passes the EC to the PCB, the suction device is communicated with the atmosphere to release the EC. The suction device which applies the NP to the EC can suck and hold the EC without any possibility to damage the EC, unlike an EC holding device which holds an EC with a chuck having a plurality of grasping hands which may damage the EC.

The EC transferring apparatus may include a single suction device or a plurality of suction devices. For example, there is known an EC transferring and mounting apparatus which is employed in an EC mounting system for mounting one or more ECs on a PCB and which includes a movable member, a movable-member moving device for moving the movable member, and one or more suction devices provided on the movable member.

At any rate, the suction device which applies an NP to an EC for sucking up the EC may not apply a sufficiently high NP (i.e., NP having a sufficiently great absolute value) to the EC, for example, if dust or foreign matter enters an NP supply passage in the suction device and clogging occurs to the suction device. In this case, the suction device fails to suck the EC with stability or hold the EC with stiffness. Clogging may occur to not only the passage in the suction device, but also a passage which is provided in a holder head for holding the suction device and which supplies the NP to the suction device, but also a passage which supplies the NP to the holder head. If the suction device has wearing or deformation in a suction surface thereof at which the suction device sucks, the suction surface may not be brought into close contact with the EC, so that the NP may leak from between the suction device and the EC. In this case, too, the suction device cannot apply an appropriate NP to the EC. In the case where the suction device is held by the holder head such that the suction device is slideable relative to the head, and is iteratively slid or moved relative to the head when the suction device sucks ECs, the suction device and the holder head may suffer from wearing at their sliding surfaces, so that NP may leak through the worn surfaces. The leakage of NP may occur because of, e.g., damage of the passage which supplies the NP to the suction device.

Conventionally, an operator applies an NP sensor to the suction device to measure the NP supplied thereto, while the suction device is supplied with the NP. If the NP sensor does not read a sufficiently high NP value, the operator replaces the suction device with another, or takes other appropriate measures. In this way, the suction device is prevented from failing to suck ECs with stability. From the measurement result, the operator should estimate which one of the above-indicated possible causes has lead to the abnormality, and confirm whether his or her estimation is correct.

However, it needs one or more persons to perform the operation of applying the NP sensor to the suction device and measuring the NP supplied thereto. In addition, this operation is very cumbersome for the person or persons. Moreover, this operation may disable full automatization of the EC transferring task as a whole. In particular, in the case where an EC transferring apparatus which has a number of suction devices is used, it is very cumbersome and time-consuming and needs many persons, to apply an NP sensor to each of the suction devices and measure the NP supplied thereto.

SUMMARY OF THE INVENTION

It is therefore an object of the present invention to provide an electric component transferring apparatus which automatically measures a negative pressure of a suction device and automatically examines the suction device with respect to its sucking function.

It is another object of the present invention to provide an electric component transferring apparatus which automatically measures the negative pressure of the suction device by utilizing the operation of the suction device for picking up an electric component from an electric component supply device.

It is another object of the present invention to provide an electric component transferring apparatus which automatically measures the negative pressure of the suction device by utilizing the operation of the suction device for picking up an electric component from an electric component supply device including a plurality of electric component supply cartridges.

It is another object of the present invention to provide an electric component transferring apparatus which automatically measures the negative pressure of the suction device and which can estimate what cause has lead to an insufficiently low negative pressure of the suction device.

It is another object of the present invention to provide a negative-pressure-suction testing apparatus which is suitable for any of the above-indicated transferring apparatuses.

It is another object of the present invention to provide a negative-pressure-suction testing method which is suitable for any of the above-indicated transferring apparatuses.

The present invention provides an electric component transferring apparatus, and a negative-pressure-suction testing apparatus and method suitable for the electric component transferring apparatus, which have one or more of the technical features which are described below in respective paragraphs given parenthesized sequential numbers (1) to (42). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed.

(1) According to a first feature of the present invention, there is provided an electric-component transferring apparatus having a suction testing function, comprising at least one suction device which sucks and holds an electric component by a negative pressure; a suction-device moving device which moves the suction device; a negative-pressure control device which controls the negative pressure supplied to the suction device; a negative-pressure measuring device which measures the negative pressure of the suction device; and a test control device which controls the suction-device moving device, the negative-pressure control device, and the negative-pressure measuring device so that the suction-device moving device moves the suction device to a position where the negative-pressure measuring device is present and the measuring device measures the negative pressure of the suction device. In the present electric-component ("EC") transferring apparatus, the suction device is automatically moved to the negative-pressure ("NP") measuring device by the suction-device moving device, so that the NP of the suction device which is being supplied thereto under control of the NP control device is automatically measured by the NP measuring device. Therefore, an operator need not apply an NP sensor to the suction device for measuring the NP of the suction device. The present apparatus can easily measure the NP of the suction device, without needing any manual operation of the operator, and accordingly can automatically perform the EC transferring task as a whole even if it measures the NP of the suction device during the EC transferring task. The operator has only to input a command to start the NP measurement. In particular, in the case where the present EC transferring apparatus has a plurality of suction devices, the present invention largely contributes to facilitating and automatizing the NP measurement and reducing the number of operators. Thus, the NP measurement can be performed in a very short time.

(2) According to a second feature of the invention which includes the first feature (1), the EC transferring apparatus comprises a plurality of suction devices, and further comprises an output device which outputs respective negative pressure values measured by the negative-pressure measuring device from the plurality of suction devices, such that each of the measured negative pressure values is related to a corresponding one of the suction devices. The measured NP values may be output in various manners. For example, the output device may include a recording device which records data representative of the obtained NP values on a recording medium such as a recording sheet, or may include a display device, such as a CRT (cathode ray tube) display or a liquid-crystal display, which displays the obtained NP values on an image screen. Otherwise, the output device may include a sound generating device which outputs voice representative of the obtained NP values. The NP values recorded on the recording medium can be easily seen by the operator and can be easily maintained. The obtained NP values may be stored in a memory such as a magnetic disk or an optical disk.

(3) According to a third feature of the invention which includes the first or second feature (1) or (2), the negative-pressure measuring device comprises a base frame; a negative-pressure measure passage which is formed in the base frame and has an opening in an outer surface of the base frame; and a negative-pressure sensor which measures a negative pressure in the measure passage. In the present apparatus, the suction device is contacted with the outer surface of the base frame of the NP measure passage, when the negative pressure of the suction device is measured. Thus, the opening of the NP measure passage is closed by the suction device, and the base frame substantially prevents, in place of the EC, the NP leakage from the suction device. The passage in the suction device is communicated with the NP measure passage, so that an NP substantially equal to the NP in the suction device is created in the NP measure passage. The NP sensor can measure the NP of the suction device by measuring the NP in the NP measure passage.

(4) According to a fourth feature of the invention which includes the third feature (3), the base frame comprises a main frame member; and an opening-defining member which defines the opening of the negative-pressure measure passage and a portion of the measure passage which is contiguous with the opening, the opening-defining member being produced independent of the main frame member and detachably attached to the main frame member. It is possible to employ a plurality of opening-defining members which have respective passages which have different diameters and each of which defines the opening and contiguous portion of the NP measure passage. Each of the opening-defining members can be attached to the main frame member. As will be described on the preferred embodiments of the present invention, one of the defining members is selected and attached to the main frame member in such a manner that the diameter of the passage of the selected defining member is equal to the inner diameter of an EC sucking portion of the suction device. Otherwise, it is possible to employ a single opening-defining member which has a plurality of passages having different diameters and which is attached to the main frame member such that the defining member is displaceable relative to the main frame member. When the defining member is displaced, one of the passages is selected and positioned at an operating position where the selected passage defines the opening of the NP measure passage. The opening-defining member may be a linearly movable one, a rotatable one, or a pivotable or swingable one. The opening-defining member may be a manually displaceable one which is manually displaced by an operator, or an automatically displaceable one which is automatically displaced by a moving device.

(5) According to a fifth feature of the invention which includes the third or fourth feature (3) or (4), the negative-pressure sensor is fixed to the base frame in a state in which the sensor can measure the negative pressure in the negative-pressure measure passage. In the present apparatus, the NP measure passage can be so shortened that an NP substantially equal to the NP of the suction device is created quickly in the NP measure passage.

(6) According to a sixth feature of the invention which includes the fifth feature (5), the negative-pressure sensor is airtightly fit in the base frame via an adaptor including a portion which defines at least a portion of the negative-pressure measure passage.

(7) According to a seventh feature of the invention which includes the fifth feature (5), the negative-pressure sensor comprises a housing including a portion which is airtightly fit in the base frame and which defines at least a portion of the negative-pressure measure passage.

(8) According to an eighth feature of the invention which includes any one of the second to seventh features (2) to (7), the negative-pressure control device comprises a negative-pressure-supply switch device which is switchable to a supply state in which the switch device permits the negative pressure to be supplied to each of the plurality of suction devices and to a non-supply state in which the switch device inhibits the negative pressure from being supplied to the each suction device.

(9) According to a ninth feature of the invention which includes the eighth feature (8), the negative-pressure-supply switch device comprises a plurality of switch valves each of which is movable with a corresponding one of the plurality of suction devices and includes a switch member which is mechanically movable to a first position corresponding to a supply state of the each switch valve in which the each switch valve permits the negative pressure to be supplied to the one suction device and to a second position corresponding to a non-supply state of the each switch valve in which the each switch valve inhibits the negative pressure from being supplied to the one suction device; and a component-receiving-position switch operating device which is provided at a component receiving position and which switches the each switch valve to the supply state thereof, and wherein the negative-pressure measuring device comprises a measuring-device-side switch operating device which switches the each switch valve which has been passed through the component receiving position, to the non-supply state thereof. A representative of the non-supply state of each switch valve is a release state in which the switch valve connects the suction device to the atmosphere. Otherwise, the non-supply state may be a positive-pressure supply state in which the switch valve permits a positive pressure to be supplied to the suction device for positively or quickly releasing the EC.

(10) According to a tenth feature of the invention which includes the ninth feature (9), the switch member of the each switch valve is movable in a direction intersecting a circle having a center at an axis line about which each of the suction devices is rotatable, and wherein the measuring-device-side switch operating device comprises a base frame and a switch-member drive member which is attached to the base frame and which has an operative surface having such a shape that a more downstream portion of the operative surface in a direction in which the each suction device is rotated is nearer to the switch member in the direction in which the switch member is moved, the switch-member drive member being engageable with the switch member to switch the each switch valve to the non-supply state thereof.

(11) According to an eleventh feature of the invention which includes the tenth feature (10), the switch-member drive member comprises a roller which is rotatable about an axis line which is perpendicular to a direction tangent to a locus of rotation of the each switch valve at a position where the measuring-device-side switch operating device is present and is substantially perpendicular to the direction of movement of the switch member of the each switch valve, the roller having an outer circumferential surface providing the operative surface.

(12) According to a twelfth feature of the invention which includes the tenth or eleventh feature (10) or (11), the switch-member drive member is attached to the base frame such that the drive member is movable in a direction substantially parallel to the direction of movement of the switch member of the each switch valve at a position where the measuring-device-side switch operating device is present, and wherein the measuring-device-side switch operating device further comprises a biasing device which biases the switch-member drive member toward an advanced position where the drive member is engageable with the switch member and which permits the drive member to be retracted from the advanced position after the switch member has been moved to a position beyond which the switch member is not movable.

(13) According to a thirteenth feature of the invention which includes any one of the first to twelfth feature (1) to (12), the EC transferring apparatus further comprises an electric-component supply device which includes a component-supply portion and which supplies, from the component-supply portion, a plurality of electric components one by one to the suction device, wherein the negative-pressure measuring device includes a contact portion which is contactable with the suction device and which is provided at a position corresponding to the component-supply portion of the electric-component supply device. In the present apparatus, the suction device is moved by the suction-device moving device to the component-supply portion of the EC supply device so as to suck up an EC from therefrom. Since the NP measuring device includes the contact portion which is contactable with the suction device and which is provided at the position corresponding to the component-supply portion of the EC supply device, the suction device is contacted with the contact portion, for measuring the NP of the suction device, in the same movement manner as that in which the suction device is moved for sucking up an EC. Thus, the NP measurement can be easily performed by utilizing the movement of the suction device made for sucking the EC.

(14) According to a fourteenth feature of the invention which includes the thirteenth feature (13), the test control device comprises component-supply-dependent control means for performing at least a portion of the control of the negative-pressure measuring device based on an operation of a component-supply control device to control the electric-component supply device to supply the electric components to the suction device. The EC supply device carries a number of ECs and supplies the ECs one by one to the suction device. After one EC is supplied to the suction device, another EC to be supplied next is positioned at the component-supply portion. The component-supply control device controls the EC supply device to supply the ECs to the suction device in synchronism with the EC sucking operation of the suction device. For example, when the suction device sucks an EC, the EC must be positioned at the component-supply portion; and when the suction device picks up the EC from the component-supply portion, the picking up of the EC must be permitted. Since the component-supply-dependent control means performs at least a portion of the control of the NP measuring device based on the operation of the component-supply control device, the NP measuring device can measure the NP of the suction device at an appropriate timing corresponding to a time period in which the suction device sucks the EC present at the component-supply portion, the leakage of NP is substantially prevented because of the closure of an opening of the suction device by the EC, and the NP takes the highest level in the suction device.

(15) According to a fifteenth feature of the invention which includes the fourteenth feature (14), the component-supply-dependent control means comprises reading control means for performing reading of the negative pressure value measured by the negative-pressure measuring device, based on the operation of the component-supply control device. In the present apparatus, the NP measuring device may be one which is operable in a state in which it continuously measures NP values, and the supply-dependent control reading control means can read in the NP values measured by the measuring device, at an appropriate timing. Since the present apparatus does not perform any useless NP reading, and obtains necessary data only, it can more easily evaluate the obtained data.

(16) According to a sixteenth feature of the invention which includes the fourteenth or fifteenth feature (14) or (15), the electric-component supply device comprises at least one of (a) a carrier-tape feeding device which feeds, at a predetermined feeding pitch, a carrier tape including a holder tape having a plurality of holder pockets which are arranged, in an array, at a predetermined interval of distance and each of which accommodates an electric component, and a cover tape which covers respective openings of the holder pockets of the holder tape, and (b) a cover-tape peeling device which peels the cover tape from the holder tape of the carrier tape, and wherein the component-supply-dependent control means comprises at least one of (c) feeding-dependent control means for performing at least a portion of the control of the negative-pressure measuring device based on the operation of the carrier-tape feeding device and (d) peeling-dependent control means for performing at least a portion of the control of the negative-pressure measuring device based on the operation of the, cover-tape peeling device. Since the component-supply-dependent control means comprises at least one of the feeding-dependent control means and the peeling-dependent control means, the test control device can measure the NP of the suction device at an appropriate timing. As will be described on the preferred embodiments of the invention, the carrier-tape feeding device or the cover-tape peeling device may share a drive source with the suction-device moving device, or may be driven by an exclusive drive source.

(17) According to a seventeenth feature of the invention which includes the sixteenth feature (16), the electric-component supply device comprises a plurality of electric-component supply cartridges each of which comprises at least one of the carrier-tape feeding device and the cover-tape peeling device, the each cartridge comprising a supply driven member associated with the at least one of the carrier-tape feeding device and the cover-tape peeling device, the supply driven member being driven by a common drive member which is separate from the cartridges, so that the carrier tape is fed or the cover tape is peeled, and wherein the negative-pressure measuring device comprises a test driven member corresponding to the supply driven member of the each cartridge, the at least one of the feeding-dependent control means and the peeling-dependent control means comprises a test-driven-member-operation sensor which detects an operation of the test driven member. The test driven member is driven by the common drive member in the same manner as that in which the supply driven member is driven by the common drive member. The supply driven member is driven in synchronism with the EC sucking operation of the suction device. Therefore, the test driven member is driven in synchronism with the operation of the suction device. The test-driven-member-operation sensor detects the operation of the test driven member at a timing at which the leakage of NP from the suction device is substantially prevented and an NP substantially equal to the NP of the suction device is created in the NP measure passage. Thus, the feeding-dependent control means or the peeling-dependent control means can control the NP measuring device to measure the NP of the suction device at an appropriate timing.

(18) According to an eighteenth feature of the invention which includes the seventeenth feature (17), the test-driven-member-operation sensor comprises a position sensor which identifies that the test driven member is operated to a predetermined position; and a position adjuster for adjusting a relative position between the position sensor and the test driven member. The timing at which the position sensor detects the test driven member may be used to determine an appropriate timing at which the NP of the suction device is measured. The position sensor may be one of various known sensors such as a photoelectric sensor including a light emitter and a light receiver, a limit switch, or a proximity switch. In the case where the EC transferring apparatus or the EC supply device has assembling errors, the above-indicated predetermined position may be dislocated. However, this error may be removed by operating the position adjuster for adjusting the relative position between the position sensor and the test driven member. Thus, since the position sensor can accurately detect that the test driven member is operated to the predetermined position, the test control device can measure the NP of the suction device accurately at an appropriate timing.

(19) According to a nineteenth feature of the invention which includes any of the thirteen to eighteenth feature (13) to (18), the test control device comprises component-supply-dependent negative-pressure control means for performing at least a portion of the control over the negative-pressure control device, based on an operation of a component-supply control device to control the electric-component supply device to supply the electric components to the suction device. When the suction device sucks an EC, the NP is supplied to the suction device in synchronism with the movement of the suction device in the sucking operation, or in synchronism with the EC supplying operation of the EC supply device. Accordingly, the component-supply-dependent negative-pressure control means supplies, for the NP measurement, the NP to the suction device in the same manner as that in which the suction device sucks an EC. Thus, an NP substantially equal to the NP of the suction device is quickly created in the suction device, for measurement of the NP.

(20) According to a twentieth feature of the invention which includes any one of the thirteen to nineteenth feature (13) to (19), the electric-component supply device comprises a plurality of electric-component supply cartridges each of which carries a number of electric components of a corresponding one of a plurality of sorts and has a component-supply portion from which the each cartridge supplies the electric components one by one; a table which supports the cartridges such that the respective component-supply portions of the cartridges are arranged along a line; and a selecting device which moves at least one of the suction device and the table relative to each other so that the suction device is opposed to the component-supply portion of a selected one of the cartridges, and wherein the negative-pressure measuring device comprises a base frame which is attachable to the table by an attaching device which is usable to attach at least one of the cartridges to the table, the base frame including a contact portion which is contactable with the suction device and which is provided at a position corresponding to the component-supply portion of the each cartridge. In the present apparatus, the NP measuring device is attached to the table in the same manner as that in which each cartridge is attached to the table. When the NP measurement is carried out, the selecting device moves the NP measuring device so that the contact portion thereof is opposed to the suction device, in the same manner as that in which the component-supply portion of each cartridge is opposed to the suction device. Thus, the present apparatus can easily measure the NP of the suction device by utilizing the EC sucking operation of the suction device. An exclusive space for attachment of the NP measuring device may be provided on the table, so that the NP measuring device may be attached to the exclusive space. Alternatively, the NP measuring device may be attached to one of a plurality of cartridge-attachment spaces each for attachment of a cartridge. The exclusive space may be provided anywhere on the table. In the case where the exclusive space is provided at one end of the table, the exclusive space may be distant from one of the cartridge-attachment spaces which is adjacent to the exclusive space by a distance which is equal to a regular pitch at which the cartridges are attached to the table, or equal to several pitches, or a distance which is independent of the regular pitch. The EC supply cartridge may be one which feeds a carrier tape carrying ECs, one which includes a casing in which ECs are arranged in an array and a vibrator which vibrates the casing to feed the ECs, or one which includes a casing in which ECs are arranged in an array and a tilting device which tilts the casing to feed the ECs. Otherwise, the cartridge may be one which includes a casing in which ECs are arranged in an array and a blowing device which blows air flow to feed the ECs. The selecting device may be one which moves the table for selecting one of the ECs which is to be supplied next, that is, selecting one of the cartridges which carries an EC to be supplied next, or one which moves the suction device relative to the fixed table for selecting one of the ECs which is to be supplied next. In the latter case, a portion of the suction-device moving device which moves the suction device to a position where the suction device is opposed to the component-supply portion of each of the cartridges functions as the selecting device. The line along which the respective component-supply portions of the cartridges are arranged may be a linear line, a circle, an arc (i.e., a part-circle), a curve different from circle or arc, or a combination of two or more of those lines. In the case of the linear line, the table may be one which is moved along the linear line; in the case of the circle, the table may be a circular one which is rotated about an axis line; and in the case of the arc, the table may be a sector one which is rotated about an axis line.

(21) According to a twenty-first feature of the invention which includes the twentieth feature (20), the selecting device comprises a table moving device which moves the table along the line and positions the component-supply portion of the selected cartridge at a component supplying position where the component-supply portion of the selected cartridge is opposed to the suction device, the table moving device moving the negative-pressure measuring device to the component supplying position where the contact portion of the base frame of the measuring device is opposed to the suction device for measuring the negative pressure of the suction device.

(22) According to a twenty-second feature of the invention which includes the twentieth or twenty-first feature (20) or (21), the each cartridge comprises a base frame which corresponds to the base frame of the negative-pressure measuring device and which is attachable to the table by the attaching device which is usable to attach the base frame of the negative-pressure measuring device to the table, the base frame of the negative-pressure measuring device having a negative-pressure measure passage which opens in a portion thereof corresponding to the component-supply portion of the base frame of the each cartridge, the contact portion comprising the portion around the opening of the measure passage. In the present apparatus, the base frame of the NP measuring device can be treated like the base frame of each cartridge. As described above, the base frame of the NP measuring device can be attached to the table in place of, or in addition to, the base frame of each cartridge.

(23) According to a twenty-third feature of the invention which includes any one of the twentieth to twenty-second features (20) to (22), the suction-device moving device comprises a suction-device rotating device which rotates a plurality of the suction devices about a common axis line and sequentially positions each of the suction devices at a component receiving position above the component-supply portion of the selected cartridge, the suction-device rotating device sequentially positioning the each suction device at the component receiving position above the contact portion of the base frame of the negative-pressure measuring device, for measuring the negative pressure of the each suction device. As will be described on the preferred embodiments of the invention, the suction-device rotating device may be one which includes a plurality of rotary members which are rotatable about a common axis line independently of each other; and a rotating device which rotates each of the rotary members about the axis line. In this case, each of the rotary members carries a holder head which holds one or more suction devices. When the rotary members are rotated, the corresponding holder heads are sequentially moved to, and stopped at, an EC receiving position. Alternatively, the suction-device rotating device may be one which includes a rotatable table which is rotatable about an axis line, and a rotating device which rotates the rotatable table. A plurality of holder heads each of which holds one or more suction devices are provided on the rotatable table such that the holder heads are equiangular spaced from each other about the axis line. When the table is intermittently rotated at a predetermined angular pitch equal to the regular angular distance between each pair of adjacent two holder heads, the holder heads are sequentially moved to, and stopped, at an EC receiving position.

(24) According to a twenty-fourth feature of the invention which includes the twenty-third feature (23), the suction-device moving device comprises a suction-device lowering device which lowers the each suction device positioned at the component receiving position toward the component-supply portion of the selected cartridge, in a direction parallel to the axis line of rotation of the each suction device, the suction-device lowering device lowering the each suction device positioned at the component receiving position toward the contact portion of the base frame of the negative-pressure measuring device, so as to contact the contact surface and thereby measure the negative pressure of the each suction device.

(25) According to a twenty-fifth feature of the invention which includes the twenty-third or twenty-fourth feature (23) or (24), the suction-device moving device comprises a plurality of rotary heads each of which can hold a plurality of the suction devices and is rotatable about an axis line to position a selected one of the suction devices at an operating position, and wherein the suction-device rotating device rotates the each rotary head about the axis line and sequentially positions the each rotary head at the component receiving position where the selected suction device positioned at the operating position in the each rotary head is opposed to the component-supply portion of the selected cartridge at the component supplying position, the suction-device rotating device rotating the each rotary head and sequentially positioning the each rotary head at the component receiving position where the selected suction device positioned at the operating position in the each rotary head is opposed to the contact portion of the base frame of the negative-pressure measuring device, for measuring the negative pressure of the selected suction device. In the present apparatus, one of the suction devices is selected and used in each of the rotary heads on the suction-device moving device. Therefore, it is not needed to employ a storing device for storing plural sorts of suction devices, independent of the present EC transferring apparatus. In addition, the suction device can be changed with each other, without having to stop the operation of the present EC transferring apparatus. Thus, the present apparatus can suck and transfer the ECs with high efficiency. In the present apparatus, all the suction devices can be sequentially moved to the NP measuring device, for measurement of the NP of each suction device, by combination of the rotation of each of the rotary heads about the common axis line and the rotation of the suction devices about their axis line.

(26) According to a twenty-fifth feature of the invention which includes any one of the first to twenty-fifth features (1) to (25), the negative-pressure measuring device comprises a negative-pressure measure passage which is communicated with the suction device at least when the measuring device measures the negative pressure of the suction device; and a leakage control device which is selectively operable in a leakage-permitting state in which the control device permits air leakage to the negative-pressure measure passage and a leakage-inhibiting state in which the control device substantially inhibits the air leakage. In the present apparatus, an NP value is measured from the suction device in the two states, i.e., leakage-permitting state and leakage-inhibiting state. There are three possible cases; in the first case, an appropriate NP value is obtained in each of the two states; in the second case, an appropriate NP value is not obtained in the leakage-permitting state but an appropriate NP value is obtained in the leakage-inhibiting state; and in the third case, an appropriate NP value is not obtained in either of the two states. If the suction device does not have any abnormality and can apply a sufficiently high NP, an appropriate NP is obtained even if the NP is supplied in the leakage-permitting state, because the NP overcomes the leakage. Therefore, if an appropriate NP value is obtained in each of the two states, it can be judged that the suction device is normal. On the other hand, in each of the second and third cases, it can be judged that the suction device is abnormal. As will be described on the preferred embodiments of the invention, an operator can estimate what cause (e.g., clogging of a passage in the suction device, or wearing or deformation of a sucking surface of the suction device) has lead to the abnormality. Different causes of abnormality lead to different NP values each of which may, or may not, an appropriate NP value, even under the same NP measurement condition (i.e., measurement in the leakage-permitting state or in the leakage-inhibiting state). The operator can more quickly remove the abnormality based on the estimated cause of the abnormality. This estimation may be automatically performed by the test control device.

(27) According to a twenty-seventh feature of the invention, there is provided an apparatus for testing a suction device which sucks and holds an electric component by a negative pressure, for evaluating the sucking function of the suction device, comprising a base frame which has a negative-pressure measure passage which is communicated with the suction device at least when a negative pressure in the measure passage is measured; a negative-pressure sensor which measures the negative pressure of the measure passage; and a leakage control device which is selectively operable in a leakage-permitting state in which the control device permits air leakage to the negative-pressure measure passage and a leakage-inhibiting state in which the control device substantially inhibits the air leakage.

(28) According to a twenty-eighth feature of the invention which includes the twenty-seventh feature (27), the leakage control device comprises a communication-state changing device which is provided in a branch passage which communicates with the negative-pressure measure passage and which is selectively operable in a connecting state as the leakage-permitting state in which the changing device connects the branch passage to an external space via a restrictor passage and in a disconnecting state as the leakage-inhibiting state in which the changing device disconnects the branch passage from the external space.

(29) According to a twenty-ninth feature of the invention which includes the twenty-eighth feature (28), the communication-state changing device comprises a blind plug which is usable to substantially airtightly close an opening of the branch passage; and a restrictor member which is attachable to the opening of the branch passage in place of the blind plug and which has the restrictor passage having a predetermined flow area via which the branch passage is connectable to the external space. It is possible to employ a plurality of restrictor members which have respective restrictor passages having different flow areas, respectively. One of the restrictor members is selected and attached to the opening of the branch passage in such a manner that the flow area of the restrictor passage of the selected restrictor member corresponds to the flow area of a suction device to be tested. In this case, each of a plurality of suction devices having different flow areas, respectively, can be accurately examined with respect to its sucking function.

(30) According to a thirtieth feature of the invention which includes the twenty-eighth feature (28), the communication-state changing device comprises a switch device which is switchable to the connecting state in which the switch device connects the branch passage to the external space via the restrictor passage and in the disconnecting state in which the switch device disconnects the branch passage from the external space. The switch device may be one which is manually switchable to the connecting state and the disconnecting state, or one which is automatically switchable to the connecting state and the disconnecting state. In the latter case, the switch device may include a solenoid-operated shut-off valve for automatic switching to the connecting state and the disconnecting state. In the case where the automatic switch device is employed, the present testing apparatus can fully automatically measure an NP value of the suction device in each of the above-indicated two states.

(31) According to a thirty-first feature of the invention which includes the thirtieth feature (30), the switch device comprises a displaceable switch member which is provided at the opening of the branch passage and which is displaceable to a first position corresponding to the connecting state and to a second position corresponding to the disconnecting state. The displaceable switch member may be one which is linear movable, or one which is rotatable or pivotable. In addition, the displaceable switch member may be one which is manually displaced by an operator, or one which is automatically moved by a moving device.

(32) According to a thirty-second feature of the invention which includes the thirty-first feature (31), the displaceable switch member comprises a rotatable switch member which is attached to the base frame such that the rotatable switch member is rotatable about an axis line thereof and which has a plurality of restrictor passages having different flow areas, respectively, on a circle having a center at the axis line, the rotatable switch member being rotatable about the axis line to select one of the restrictor passages so that the selected restrictor passage connects the branch passage to the external space. Since the rotatable switch member needs only a minimum space in which the switch member is displaced for switching, the present testing apparatus can enjoy a compact construction.

(33) According to a thirty-third feature of the invention which includes the thirty-second feature (32), the rotatable switch member is fit in a receiving hole formed in the base frame such that the rotatable switch member is rotatable about the axis line and communicates with the branch passage, the rotatable switch member being rotatable about the axis line to select one of the restrictor passages so that the selected restrictor passage connects the branch passage to a release passage connected to the external space.

(34) According to a thirty-fourth feature of the invention which includes the thirty-second or thirty-third feature (32) or (33), the rotatable switch member comprises a manually rotatable switch member which is rotatable about the axis line manually by an operator.

(35) According to a thirty-fifth feature of the invention which includes any one of the thirty-second to thirty-fourth features (32) to (34), the communication-state changing device further comprises a positioning device which positions the rotatable switch member at each of a plurality of communication positions where a corresponding one of the restrictor passages connects the branch passage to the external space. Since the positioning device positions the rotatable switch member, the switch member is not moved when the NP measurement is performed. Thus, the NP measurement can be performed with accuracy under the selected leakage state corresponding to the selected restrictor passage.

(36) According to a thirty-sixth feature of the invention which includes the thirty-fifth feature (35), the positioning device comprises a first device including a plurality of positioning recesses which are provided on one of the base frame and the manually rotatable switch member such that the positioning recesses correspond to the restrictor passages, respectively; and a second device which is provided on the other of the base frame and the manually rotatable switch member and which cooperates with each of the positioning recesses to position, by snap action, the manually rotatable switch member at a corresponding one of the communication positions, and wherein the second device comprises a positioning member which engages the each positioning recess and thereby positions the manually rotatable switch member at the corresponding one communication position; a positioning-member holder which holds the positioning member such that the positioning member is movable to an operative position thereof where the positioning member engages the each positioning recess and to an inoperative position thereof where the positioning member does not engage the each positioning recess; and a biasing member which biases the positioning member toward the operative position. In this case, the operator can feel that the manually rotatable switch member has been positioned by the positioning device. Accordingly, the operator can easily select a desired restrictor passage.

(37) According to a thirty-seventh feature of the invention which includes any one of the twenty-eighth feature to thirty-sixth feature (28) to (36), the negative-pressure sensor is attached to the base frame via an adaptor which is airtightly fit in the base frame and which defines at least a portion of the branch passage.

(38) According to a thirty-eighth feature of the invention which includes any one of the twenty-eighth feature to thirty-sixth feature (28) to (36), the negative-pressure sensor comprises a housing including a portion which is airtightly fit in the base frame and which defines at least a portion of the branch passage.

(39) According to a thirty-ninth feature of the invention which includes any one of the twenty-seventh feature to thirty-eighth feature (27) to (38), the suction device sucks up the electric components from an electric-component supply device comprising a plurality of electric-component supply cartridges each of which carries a number of electric components of a corresponding one of a plurality of sorts and has a component-supply portion from which the each cartridge supplies the electric components one by one to the suction device; and a table which supports the cartridges such that the respective component-supply portions of the cartridges are arranged along a line, and wherein the base frame is attachable to the table such that the negative-pressure measure passage opens in alignment with the straight line.

(40) According to a fortieth feature of the invention which includes the thirty-ninth feature (39), the base frame corresponds to a base frame of the each cartridge and is attachable to the table by an attaching device which is usable to attach at least one of the cartridges to the table.

(41) According to a forty-first feature of the invention, there is provided a method of testing a suction device which sucks and holds, by a negative pressure, an electric component supplied from an electric-component supply device, for evaluating the sucking function of the suction device, comprising the steps of moving at least one of the suction device and a negative-pressure measuring device relative to each other in a same manner as a manner in which at least one of the suction device and the electric-component supply device is moved relative to each other when the suction device is supplied with the electric component from the supplying device, so that the suction device and the negative-pressure measuring device contact each other; measuring, using the negative-pressure measuring device, a negative pressure in the suction device; and evaluating the component sucking function of the suction device, based on the measured negative pressure.

(42) According to a forty-second feature of the invention which includes the thirty-first feature (41), the measuring step comprises measuring a negative pressure in the suction device in a first state in which a predetermined air leakage to a negative-pressure measure passage of the negative-pressure measuring device is permitted and in a second state in which the air leakage is not permitted. The testing apparatus which includes each one of the twenty-seventh feature to the fortieth feature (27) to (40) may be employed in the testing method which includes the forty-first feature or the forty-second feature (41) or (42).

BRIEF DESCRIPTION OF THE DRAWINGS

The above and optional objects, features, advantages and technical and industrial significance of this invention will be better understood by reading the following detailed description of presently preferred embodiments of the invention, when considered in connection with the accompanying drawings, in which.

DETAILED DESCRIPTION OF THE PREFERRED EMBODIMENTS

Referring first to FIGS. 1–15, there will be described an electric component mounting system including an electric component transferring and mounting apparatus 12 constructed according to one embodiment of the present invention.

Figure 1:
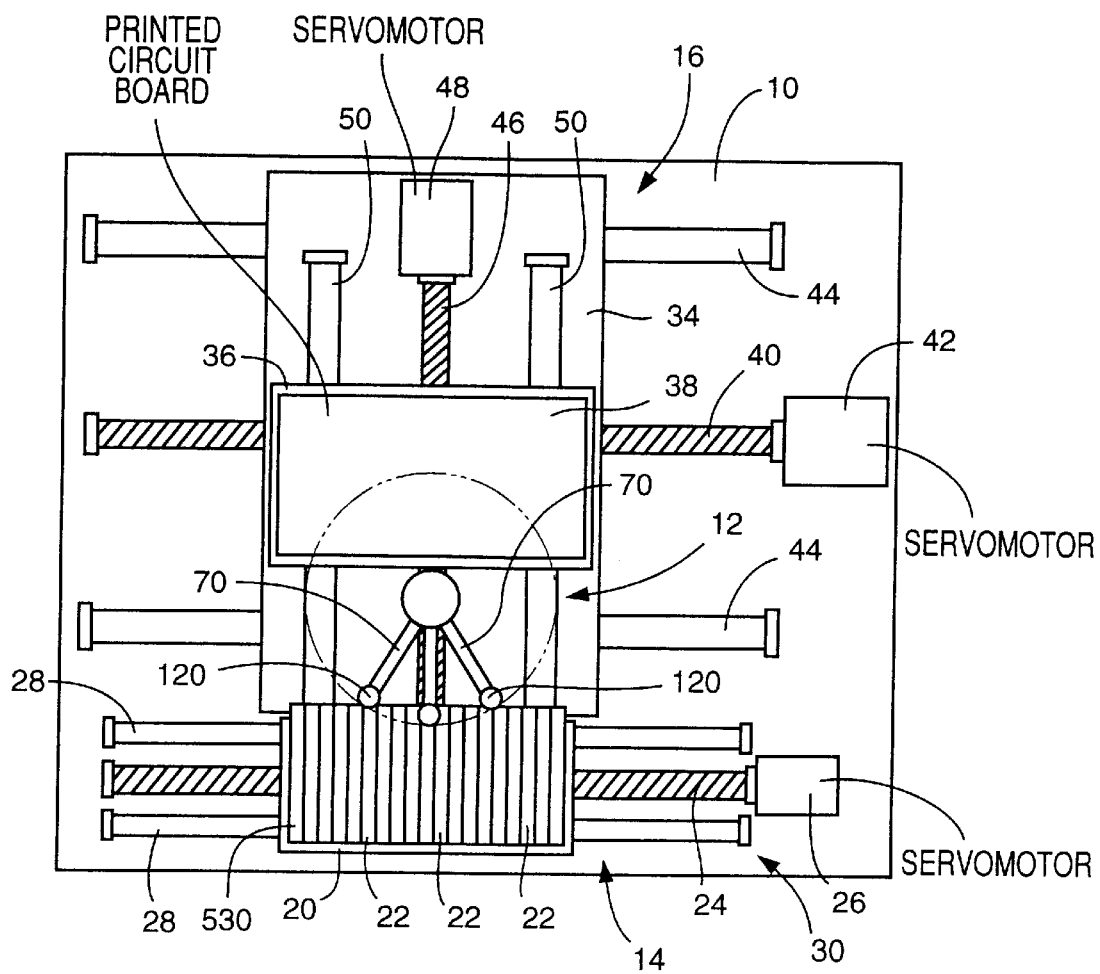
FIG. 1 is a plan view schematically showing an electric component ("EC") mounting system including an EC transferring and mounting apparatus equipped with one embodiment of an EC transferring apparatus of the invention.

In FIG. 1, reference numeral 10 denotes a base on which are mounted the electric component transferring and mounting apparatus 12, an electric component supply device 14, and a printed-circuit-board ("PCB") supporting and positioning device 16. The electric component supply device 14 includes a cartridge support block 20 which carries a multiplicity of component supply cartridges 22 (hereinafter referred to as "cartridges" 22) such that respective component-supply portions of the cartridges 22 are arranged along a straight line.

The cartridge support block 20 is provided with a nut (not shown) engaging a feed screw 24. When the feed screw 24 is rotated by a drive source in the form of a cartridge feed servomotor 26, the cartridge support block 20 is fed in an X-axis direction while it is guided by guide members in the form of a pair of straight guide rails 28. Thus, one of the cartridges 22 which are arranged in the X-axis direction is brought to a predetermined component supply position. The nut, feed screw 24 and cartridge feed servomotor 26 constitute a major portion of a cartridge feeding device 30 for feeding the cartridges 22 in the X-axis direction.

The PCB supporting and positioning device 16 is disposed at a level lower than that of the cartridges 22 of the electric component supply device 14. This device 16 includes an X-axis table 34 movable in the X-axis direction, and a Y-axis table 36 which is mounted on the X-axis table 34 and which is movable in a Y-axis direction which is perpendicular to the X-axis direction in a horizontal plane. The Y-axis table 36 has a PCB holding device (not shown) mounted thereon to position and hold a printed-circuit board ("PCB") 38 as an object on which electric components are to be mounted. The X-axis table 34 is moved in the X-axis direction while it is guided by guide members in the form of straight guide rails 44 when a feed screw 40 is rotated by a drive source in the form of an X-axis drive servomotor 42. The Y-axis table 36 is moved in the Y-axis direction while it is guided by guide members in the form of straight guide rails 50 when a feed screw 46 is rotated by a drive source in the form of a Y-axis drive servomotor 48. With the X-axis table 34 and the Y-axis table 36 being moved in the horizontal plane, the printed-circuit PCB 38 is positioned such that a multiplicity of component mounting portions of the PCB 38 are sequentially aligned with a predetermined component mounting position. The X-axis table 34 extends below the electric component transferring and mounting apparatus 12, and a portion of the table 34 is located below the cartridges 22. The PCB 38 is loaded and unloaded onto and from the PCB holding device of the PCB supporting and positioning apparatus 16, in the X-axis direction, by a PCB loading device and a PCB unloading device (not shown), respectively.

The electric component transferring and mounting apparatus 12 is disposed above the electric component supply device 14 and the PCB supporting and positioning device 16. The apparatus 12 is adapted to receive the electric components from the electric component supply device 14 and transfer the electric components onto the PCB 38, namely, mount the electric components on the PCB 38. Thus, the apparatus 12 serves not only as an electric component transferring apparatus, but also as an electric component mounting apparatus.

Figure 2:
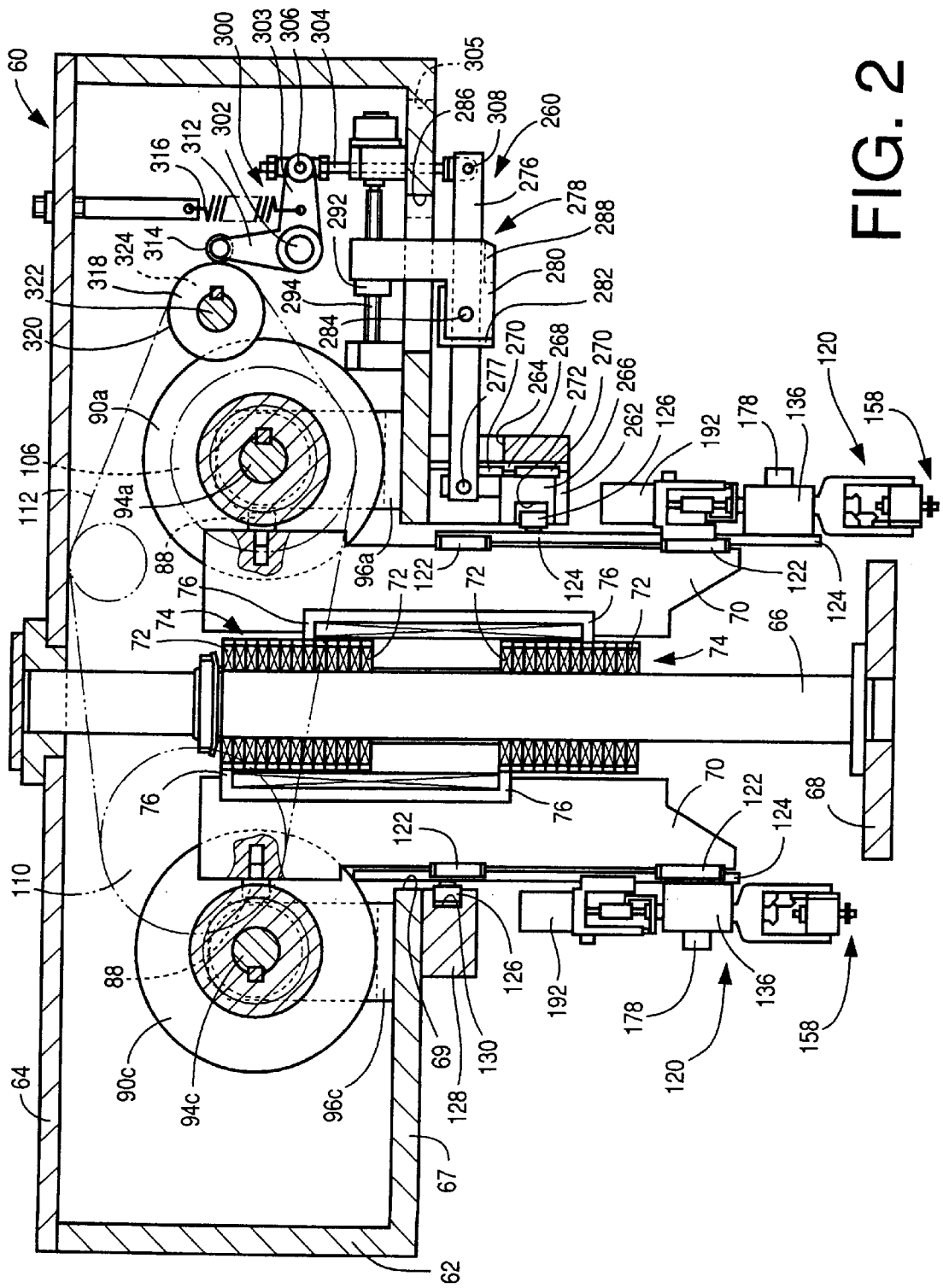
FIG. 2 is a front elevational view in cross section of the EC transferring and mounting apparatus of FIG. 1.

Referring to FIG. 2, the electric component transferring and mounting apparatus 12 has a main body including a frame 60, which is supported by support members (not shown) fixed to the base 10 indicated above. That is, the frame 60 is disposed above the base 10. The frame 60 has a mounting structure 62 in the form of a box having a U-shape in cross section, and a cover member 64 which covers an upper opening of the mounting structure 62.

Figure 3:
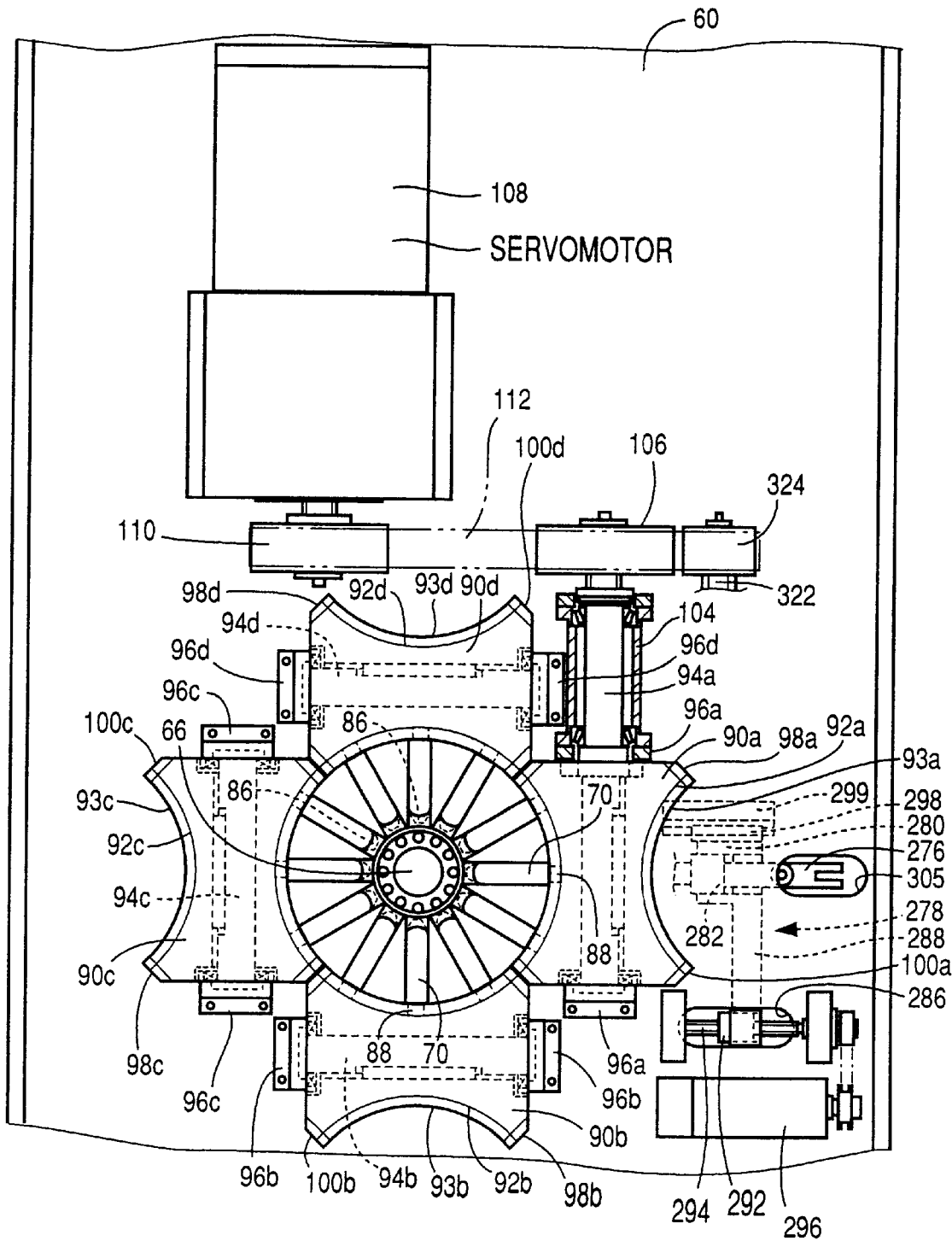
FIG. 3 is a plan view of the present EC transferring and mounting apparatus with a cover plate of a frame being removed.

A support shaft in the form of a stationary shaft 66 having a circular cross sectional shape is fixed at its upper end by the cover member 64 of the frame 60, and extends downwards through an opening 69 formed through a bottom wall 67 of the mounting structure 62. The lower end portion of the stationary shaft 66 is located outside and below the mounting structure 62, and is fixed at its lower end by a cover member 68 secured to the base 10. Thus, the shaft 66 extends vertically. As shown in FIGS. 2 and 3, twelve rotary members in the form of rotary plates 70 are fixed to respective pairs of bearings 72, such that the rotary plates 70 are rotatable about an axis of the stationary shaft 66. This axis of the stationary shaft 66 serves as a common axis about which the rotary plates 70 are rotatable.

The bearings 72 consists of two arrays 74 of bearings which are fixedly disposed on the stationary shaft 66 such that the two arrays 74 are spaced apart from each other in the axial direction of the shaft 66. Each of these two arrays 74 consists of twelve bearings 72 which are arranged in the axial direction, namely, superposed on each other in a stack. The twelve rotary plates 70 are associated with respective pairs of support arms 76 fixed thereto. Each pair of support arms 76 are fixed to and supported by the corresponding pair of bearings 72 which belong to the two arrays 74, respectively. All the pairs of bearings 72 corresponding to the respective pairs of support arms 76 of the twelve rotary members 70 have the same distance therebetween in the axial direction of the stationary shaft 66.

Figure 4:
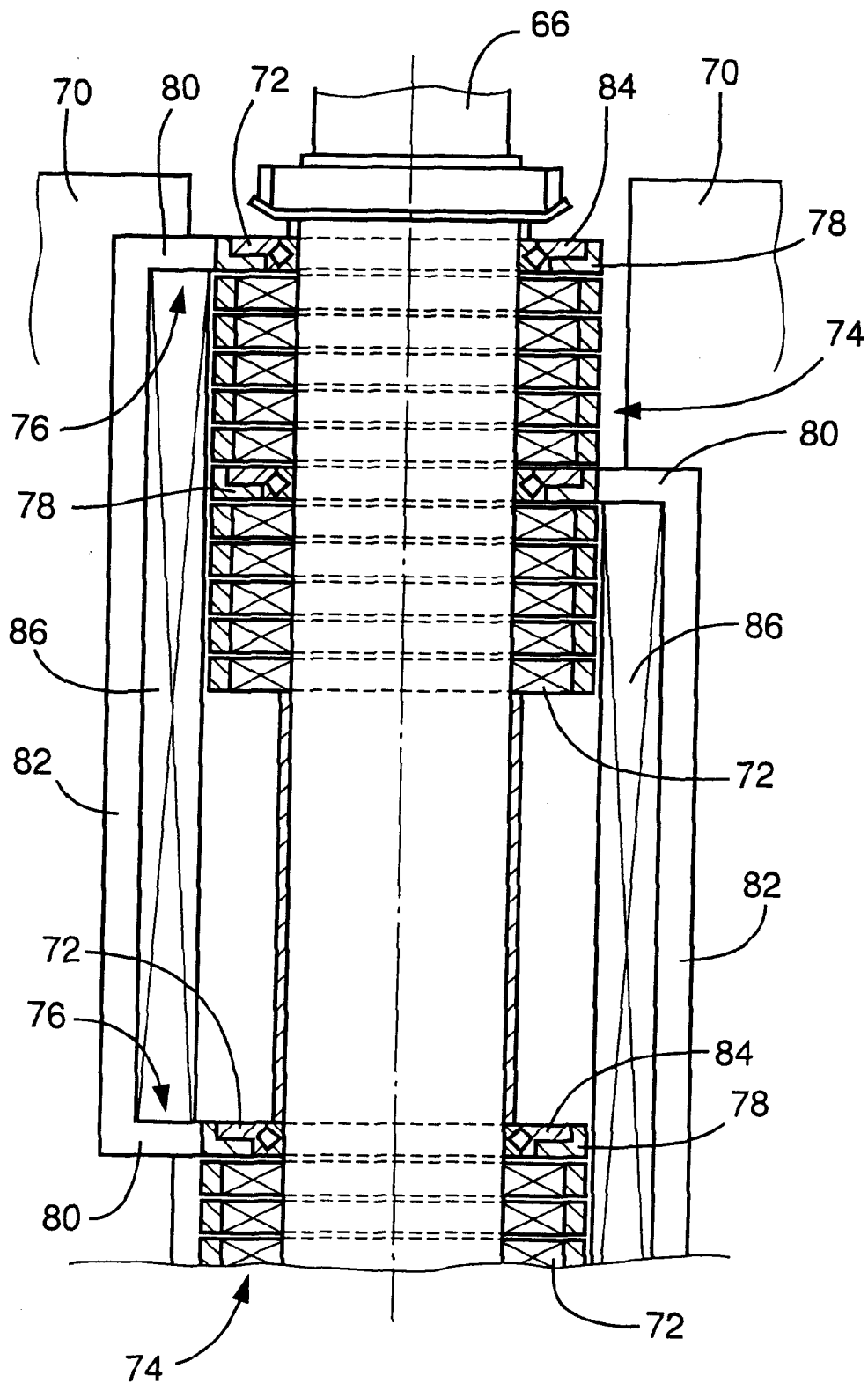
FIG. 4 is a front elevational view in cross section showing rotary plates supported by a stationary shaft in the present transferring and mounting apparatus.

As shown in FIG. 4, each of the support arms 76 consists of an annular fitting 78, and a radial arm 80 which extends from a portion of the circumference of the annular fitting 78 in a radial outward direction of the annular fitting 78. Each pair of support arms 76 has a connecting portion 82 which connects the two radial arms 80. The connecting portion 82 of each pair of support arms 80 and the end portions of the radial arms 80 connected to the connecting portion 82 are fixed to the corresponding rotary plate 70, while the annular fittings 78 are fitted on respective outer casings 84 of the corresponding pair of bearings 72 and are fixed to the outer casings 84 by a plurality of bolts. The twelve pairs of support arms 76 have different axial positions at which the arms 76 are fixed to the respective rotary plates 70. Accordingly, the support arms 76 do not interfere with each other, though the rotary plates 70 have the same position with respect to the stationary shaft 66 in the axial direction of the shaft 66. In this arrangement, the twelve rotary plates 70 are rotatable about the common axis, namely, about the axis of the stationary shaft 66, such that all the rotary plates 70 maintain a predetermined position or height in the axial direction of the stationary shaft 66. The pair of radial arms 80 and the connecting portion 82 are provided with a rib 86, which has a thinned fixed end portion on the side of the stationary shaft 66, as indicated by broken lines in FIG. 3. The thickness of the thinned fixed end portion of the rib 86 decreases in a radial direction toward the stationary shaft 66, so that the fixed end portions of the adjacent ribs 86 and the adjacent radial arms 80 do not interfere with each other. Each rotary plate 70 extends downwards through the opening 69 formed through the bottom wall 67 of the frame 60, and the lower end portion of the rotary plate 70 is located below the bottom wall 67.

As shown in FIG. 2, a cam follower in the form of a cam follower roller 88 is attached to a radial end of each rotary plate 70 remote from the stationary shaft 66, such that the roller 88 is rotatable about a horizontal axis extending in a radial direction of the stationary shaft 88. As shown in FIG. 3, the rollers 66 of the twelve rotary plates 70 are held in rolling engagement in cam grooves 92*a*, 92*b*, 92*c*, 92*d* formed in four concave globoidal cams 90*a*, 90*b*, 90*c*, 90*d* which are rotatably mounted on the frame 60. In the interest of brevity and simplification, the twelve rotary plates 70 are shown in FIG. 3 as positioned relative to each other such that the rotary plates 70 are evenly or equi-angularly spaced apart from each other about the stationary shaft 66.

The four concave globoidal cams 90*a*, 90*b*, 90*c*, 90*d* have respective outer circumferential surfaces 93*a*, 93*b*, 93*c*, 93*d*. The outer circumferential surface 93 is defined by a locus which is to be described by a circular arc having a center at the axis of the stationary shaft 66 when the circular arc is rotated about an axis which is located such that the circular arc is interposed between this axis and the axis of the stationary shaft 66 and which is perpendicular to the axis of the stationary shaft 66. The axis about which the circular arc is rotated to describe the above-indicated locus defining the circumferential surface 93 is an axis of a rotary shaft 94 of the concave globoidal cam 90, which will be described. The four concave globoidal cams 90*a*, 90*b*, 90*c*, 90*d* are disposed symmetrically with respect to the axis of the stationary shaft 66, such that lines of intersection of the outer circumferential surfaces 93*a*, 93*b*, 93*c*, 93*d* of the cams 90*a*, 90*b*, 90*c*, 90*d* with a plane (horizontal plane) including the axes of the cams 90 and perpendicular to the axis of the stationary shaft 66 cooperate to define a substantially continuous circle which has a center at the axis of the stationary shaft 66. The cam grooves 92*a*, 92*b*, 92*c*, 92*d* formed in the outer circumferential surfaces 93*a*, 93*b*, 93*c*, 93*d* are substantially connected to each other.

The concave globoidal cams 90*a*, 90*b*, 90*c*, 90*d* are fixedly mounted on respective rotary shafts 94*a*, 94*b*, 94*c*, 94*d*, as shown in FIG. 3. The rotary shafts 94 are rotatably supported by respective pairs of brackets 96*a*, 96*b*, 96*c*, 96*d* fixed to the mounting structure 62 of the frame 60. The four concave globoidal cams 90*a*–90*d* have respective pairs of bevel gears 98*a*, 10*a*, 98*b*, 10*b*, 98*c*, 100*c*, 98*d*, 100*d*. The bevel gears 98, 100 of each globoidal cam 90 are formed integrally and coaxially with the cam 90, at the axially opposite ends. The bevel gears 98, 100 of the adjacent concave globoidal cams 90*a*–90*d* are held in meshing engagement with each other.

The rotary shaft 94*a* to which the concave globoidal cam 90*a* is attached has a larger axial length than the other rotary shafts 94*b*–94*d*, and is rotatably supported also by another bracket 104 fixed to the frame 60, as shown in FIG. 3. At the free end of the rotary shaft 94*a*, there is fixed a timing pulley 106, which is connected by a timing belt 112 to a timing pulley 110 fixed to an output shaft of a main drive source in the form of an electrically operated main drive servomotor 108. When the rotary shaft 94*a* is rotated by the main drive servomotor 108, the four concave globoidal cams 90 are contemporaneously rotated in synchronization with each other, with the bevel gears 98*a*–98*d* meshing with each other, so that the twelve rotary plates 70 are rotated about the stationary shaft 66 or held stationary, as described below.

Figure 5:
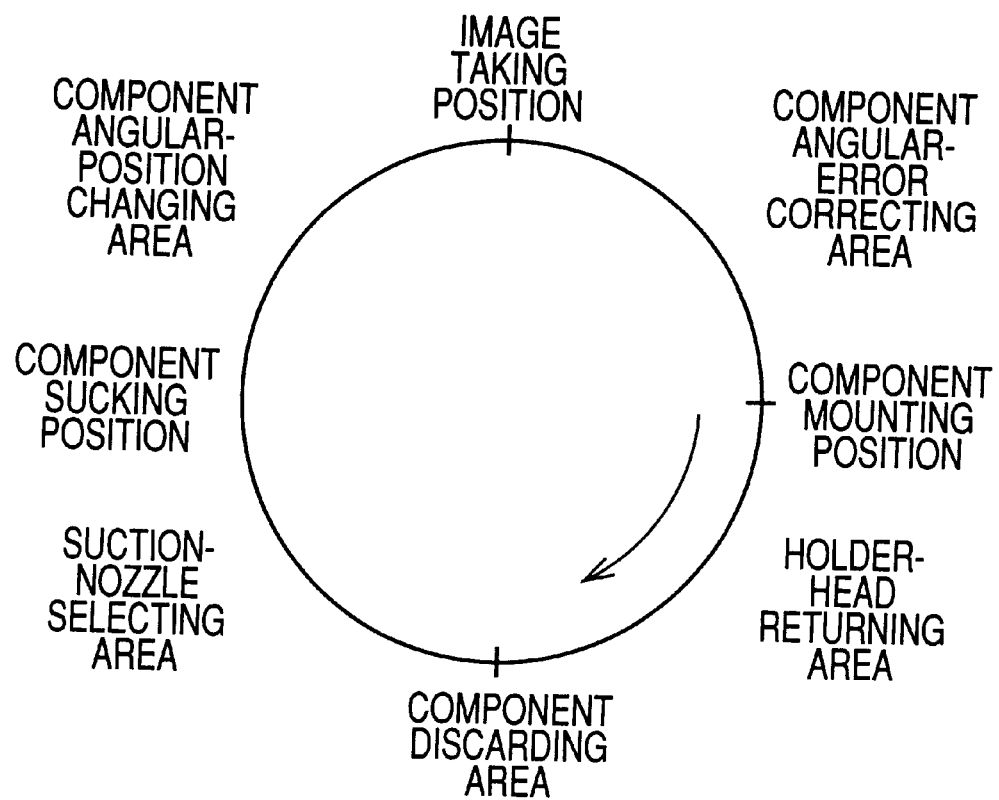
FIG. 5 is a view indicating three positions at which component holder heads are stopped in the transferring and mounting apparatus, and five areas in which respective operations are carried out.

In the present electric component transferring and mounting apparatus 12, the rotary plates 70 are stopped at a component sucking station, an image taking station and a component mounting station. In these stations, there are provided a component sucking position (as a component receiving position), an image taking position and a component mounting position, respectively, as shown in FIG. 5. At the component sucking position, the apparatus 12 receives the electric components from the electric component supply device 14, which is located on the base 60, at a position in the vicinity of the component sucking position. An image taking device in the form of a CCD (charged-coupled device) camera 114 (FIG. 15) is located on the base 10, at a position corresponding to the image taking position, while the PCB supporting and positioning device 16 is located on the base 10, at a position corresponding to the component mounting position.

The concave globoidal cam 90a is located at a position corresponding to the component mounting position, and the concave globoidal cam 90c is located at a position corresponding to the component sucking position, while the concave globoidal cam 90d is located at a position corresponding to the image taking position. The cam grooves 92a, 92c, 92d of the cams 90a, 90c, 90d are formed or shaped so that the rotary plates 70 (or cam follower rollers 88) are held stopped at the component sucking and mounting positions and the image taking position, and are decelerated and accelerated during movements thereof toward and from those three positions, and such that the rotary plates 70 are rotated at a predetermined constant angular velocity when the corresponding cam follower rollers 88 are moving into and from the cam grooves 92a, 92c, 92d. Each of the cam grooves 92a, 92c, 92d of the concave globoidal cams 90a, 90c, 90d has an inclined portion having a lead angle with respect to a plane perpendicular to the axis of the rotary shaft 94a, 94c, 94d, and a non-lead portion perpendicular to that axis. The inclined portion includes a curved section and a straight section. The cam groove 92b of the concave globoidal cam 90b has only a straight inclined portion having a lead angle with respect to a plane perpendicular to the axis of the rotary shaft 94b. This lead angle is determined to permit the rotary plates 70 to be rotated at the above-indicated constant angular velocity.

It is noted that a component container (not shown) is provided in a component discarding area between the component mounting and sucking stations of the apparatus 12. Described more specifically, the component container is provided along a circular arc path of component holder heads 120 carried by the rotary plates 70, and are located below the component holder heads 120, so that the component container accommodates electric components which are discarded from the component holder heads 120 during rotation of the rotary plates 70 from the component mounting station to the component sucking station. Namely, the electric components which have been sucked up by the component holder heads 120 are not mounted on the PCB 38 and discarded into the component container, if the components have not been adequately positioned with respect to sucking nozzles of the heads 120, that is, if the components held by the heads 120 are dislocated to such an extent that the positions of the components cannot be corrected. The components are also discarded if the kinds of the components which have been held by the heads 120 are different from those of the components that should be mounted.

Each of the twelve rotary plates 70 carries a component holder head 120, as shown in FIG. 2. Each rotary plate 70 has guide members in the form of a pair of guide blocks 122 fixed thereto such that the guide blocks 122 are spaced apart from each other in the vertical direction. A movable member in the form of a vertical slide 124 engages the guide blocks 122 such that the vertical slide 124 is vertically slidably movable. To an upper part of the vertical slide 124, there is attached a cam follower in the form of a cam follower roller 126 such that the roller 126 is rotatable about an axis extending in a radial direction of the stationary shaft 66. To a lower part of the vertical slide 124, there is attached the component holder head 120.

A stationary cylindrical cam 128 is fixed to the underside (lower surface) of the bottom wall 67 of the frame 60, in coaxial relationship with the stationary shaft 66. The cam follower roller 126 indicated above is held in rolling engagement with a cam groove 130 formed in the inner circumferential surface of the cylindrical cam 128. The cam groove 130 has a height varying portion whose height (in the axial direction of the shaft 66) gradually varies in the circumferential direction of the cam 128, and a level portion whose height is held constant in the circumferential direction. The cam groove 130 is formed so that each component holder head 120 is placed in its upper end position when the rotary plate 70 is located at the component sucking position, and is placed in its lower end position when the rotary plate 70 is located at the component mounting position, and so that the component holder head 120 is moved in a horizontal plane when the rotary plate 70 is rotated around each of the component sucking and mounting positions and the image taking position. In the present arrangement, the vertical slide 124 is moved up and down to move the component holder head 120 in the vertical direction when the cam follower roller 126 is moved in rolling contact with the height varying portion of the cam groove 130, with the rotary plate 70 being rotated with the cam follower roller 126.

Figure 6:
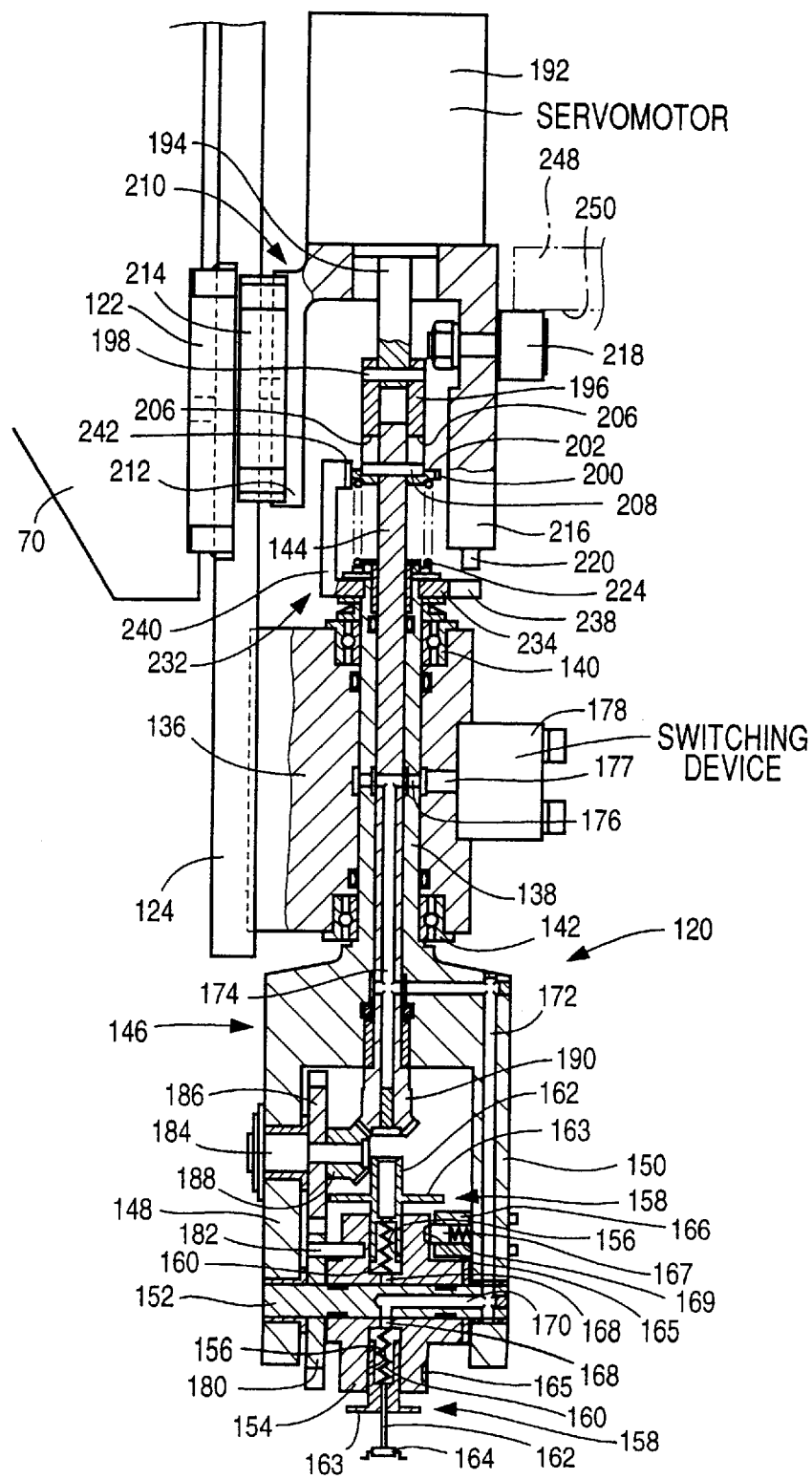
FIG. 6 is a front elevational view in cross section showing one of the component holder heads in the transferring and mounting apparatus.

As shown in FIG. 6, a bracket 136 is fixed to the lower end portion of the vertical slide 124, and a sleeve or hollow shaft 138 is supported by the bracket 136 via bearings 140, 142 such that the sleeve 138 is rotatable relative to the bracket 136 and is axially immovable relative to the bracket 136. An inner shaft 144 is fitted in the sleeve 138 such that the inner shaft 144 is rotatable and is axially immovable relative to the sleeve 138. A holder portion 146 which is generally U-shaped in cross section is fixed to the lower end of the sleeve 138 located outside the bracket 136. The holder portion 146 has a pair of side walls 148, 150, and a support shaft 152 which is fixed at its opposite ends to the side walls 148, 150. The support shaft 152 carries a cylindrical nozzle holder 154 rotatably mounted thereon.

Figure 10:
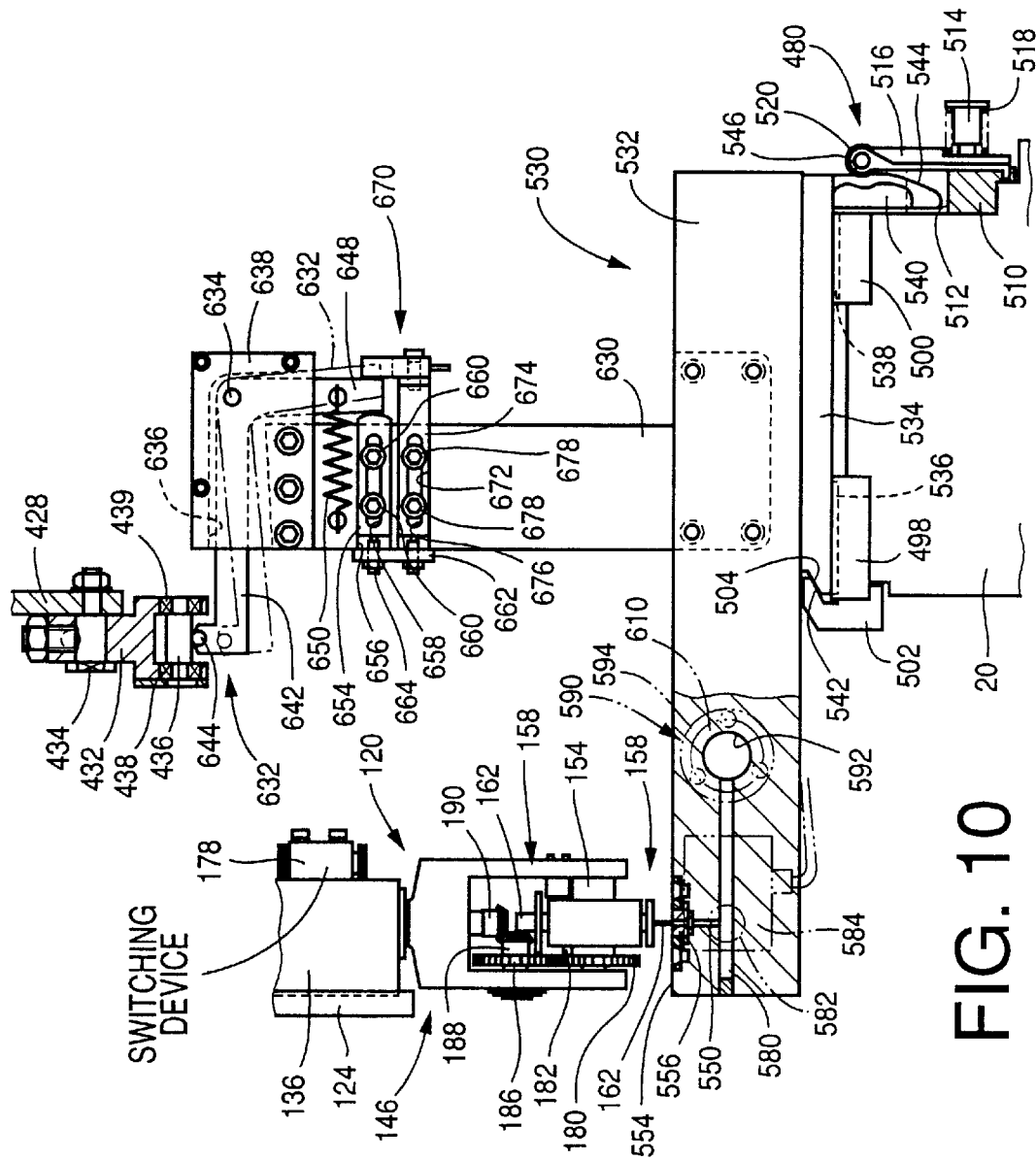
FIG. 10 is a front elevational view, partly in cross section, of a negative-pressure ("NP") measuring device of the EC transferring and mounting apparatus.

The nozzle holder 154 has six nozzle engaging radial holes 156 which are equi-angularly spaced from each other in the circumferential direction of the support shaft 152. The radial holes 156 accommodate respective cylindrical suction nozzles 158 such that the nozzles 158 are axially movable in the radial holes 156 and are not rotatable relative to the nozzle holder 154. The suction nozzles 158 are biased in a radially outward direction of the nozzle holder 154 by biasing means in the form of elastic members in the form of respective compression coil springs 160 accommodated in the radial holes 156. Rotation of each suction nozzle 158 in the radial hole 156 and axial movement of the suction nozzle 158 out of the radial hole 156 are prevented by engagement of a pin (not shown) provided on the suction nozzle 158 with the opposite ends of a corresponding groove (not shown) formed in the nozzle holder 154. In FIG. 2 or FIG. 10, only two nozzles 158 are shown as representatives of the six nozzles 158. The six suction nozzles 158 are provided for sucking up electric components 164 of respective different sizes. The six suction nozzles 158 have respective suction tubes 162 having respective different diameters. Each of the suction nozzles 158 has a reflector plate 163. The diameter of the reflector plates 163 of the suction nozzles 158 whose suction tubes 162 have a comparatively small diameter is smaller than that of the reflector plates 163 of the suction nozzles 158 whose suction tubes 162 have a comparatively large diameter. An appropriate one of the six nozzles 158 is selected and used depending upon the size and dimensions of each electric 164 component to be sucked up. The suction tubes 162 of the six suction nozzles 158 have the same length, so that the free ends of the suction tubes 162 lie on a circle having a center on the axis of rotation of the cylindrical nozzle holder 154.

The six suction nozzles 158 are selectively placed in an operating position by rotation of the nozzle holder 154, as described below. When a selected one of the suction nozzles 158 is in the operating position, its axis extends in the vertical direction, and the free end of its suction tube 162 is located right below the axis of the support shaft 152. The axis of the suction nozzle 158 placed in the operating position is aligned with the axis of the sleeve 138.

Figure 7:
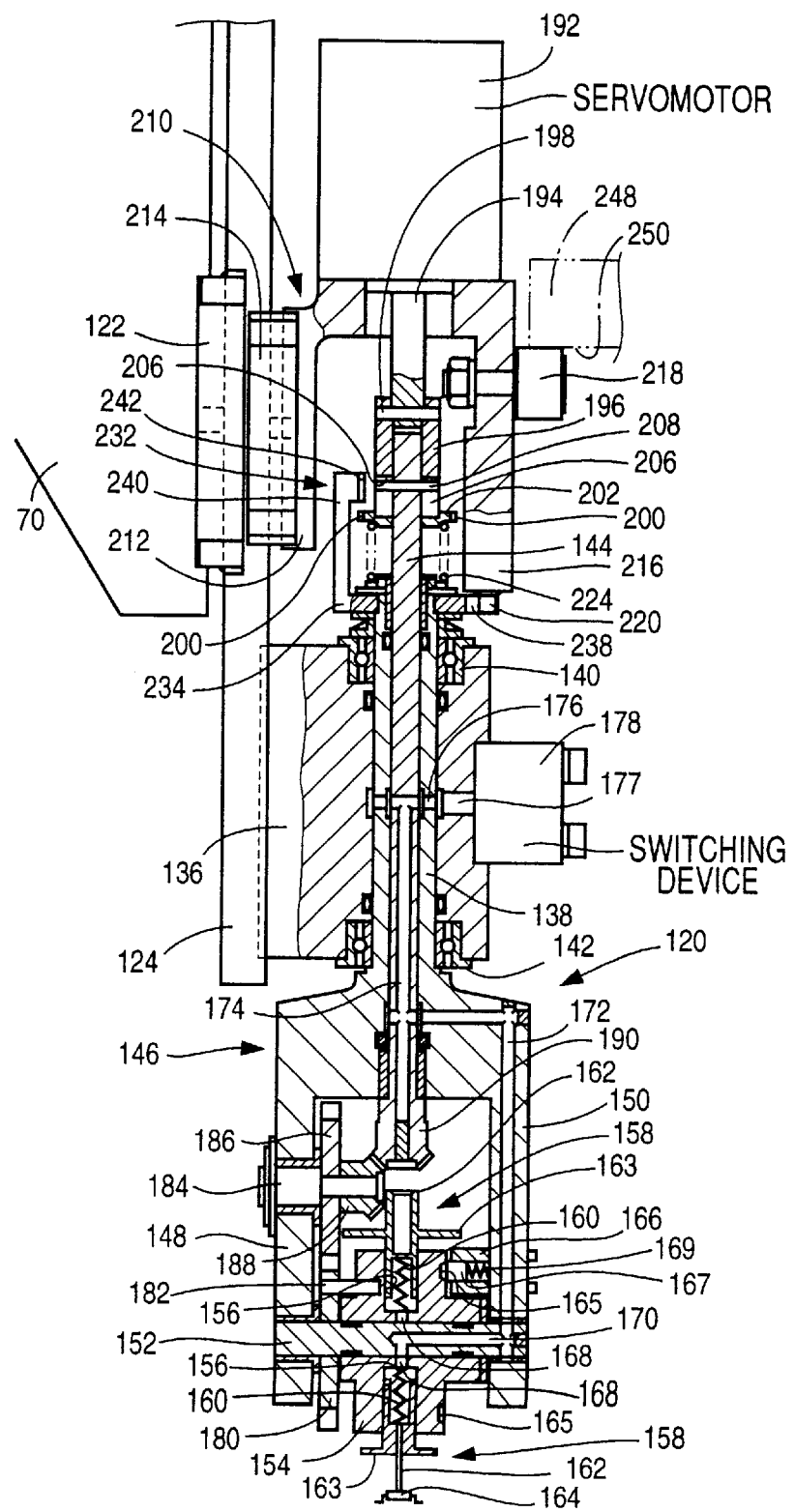
FIG. 7 is a front elevational view in cross section of the component holder head of FIG. 6 placed in an operating state in which a sleeve and an inner shaft are disconnected from each other for selecting changing component suction nozzles in the component holder head.

The nozzle holder 154 has, on an end face thereof opposed to the side wall 150 of the holder portion 146, six positioning holes 165 (only two holes 165 are shown in FIG. 7) which are equi-angularly spaced from one another on a circle which has a center at the axis of rotation of the holder 154. Each positioning hole 165 has a tapered end portion whose diameter increases toward its opening in the end face of the nozzle holder 154.

A bracket 166 is fixed with bolts to the side wall 150, and a positioning pin 167 fits in the bracket 166 such that the pin 167 is movable in a direction parallel to the axis of rotation of the nozzle holder 154 and such that the pin 167 is biased by biasing means in the form of an elastic member in the form of a compression coil spring 169, in a direction toward the nozzle holder 154. The positioning pin 167 has a tapered end portion whose inclination is equal to that of the tapered end portion of each of the positioning holes 165. When the positioning pins 167 engages each of the six positioning holes 165, a corresponding one of the six suction nozzles 158 is positioned at the operating position.

The suction nozzles 158 are adapted to hold the electric component 164 by air suction. As shown in FIG. 6, passages 168, 170, 172, 174, 176, 177 are formed through the nozzle holder 154, support shaft 152, side wall 150, inner shaft 144, sleeve 138 and bracket 136, respectively. A switching device 178 is attached to the bracket 136, so that the suction nozzle 158 placed in the operating position is communicated selectively with a vacuum source 181 (FIG. 15) or the atmosphere by an operation of the switching device 178. The vacuum source is connected through a conduit (not shown) to a passage (not shown) formed through the stationary shaft 66, and this passage is connected through a rotary valve (not shown) to the twelve switching devices 178 through respective hoses. The rotary valve is disposed at a position of the stationary shaft 66, which is lower than the bearing arrays 74. A rotary motion of a valve drive servomotor (not shown) disposed on the cover member 68 is transmitted to the rotary valve through timing pulley and belt, so that the rotary valve is held operated at the same angular velocity as that of the constant-velocity movement of the rotary plate 70, whereby the switching device 178 is held connected to the vacuum source. When the rotary plate 70 is stopped, the switching device 178 and the rotary valve are rotated by a small angle relative to each other. This relative rotation is permitted by the elastic deformation of the hose.

Each switching device 178 has a solenoid-operated switch valve 179 (FIG. 15) operated for selective communication of the suction nozzle 158 with the vacuum source 181 or the atmosphere, so that the electric component 164 is sucked up by the suction tube 158 or released therefrom. The passage 170 formed through the support shaft 152 is connected to the passage 168 which communicates with the suction nozzle 158 placed in the operating position.

The switching device 178 is operated such that vacuum is supplied to the suction nozzle 158 just before the nozzle 158 contacts the electric component 164, while the component holder head 120 is lowered by a head elevating and lowering device 260 which will be described later. After the component 164 is sucked up by the nozzle 158, the switching device 178 is held in the vacuum supplying position until the component held by the holder head 120 is mounted on the PCB 38. When the component 164 is mounted on the PCB 38, the switching device 178 is switched from the vacuum supplying position to the atmosphere connecting position in which the nozzle 158 is connected to, and communicated with, the atmosphere.

Figure 15:
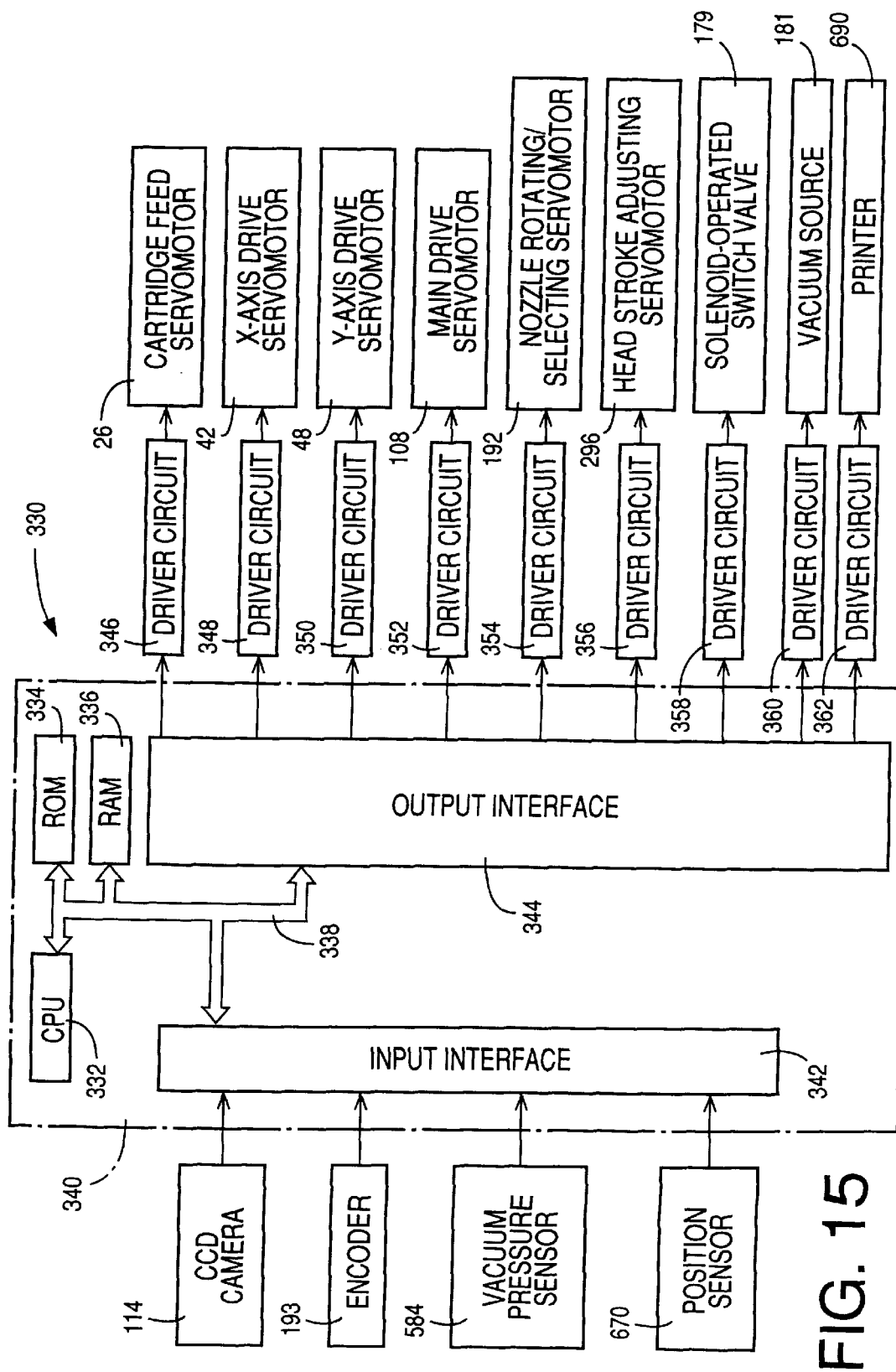
FIG. 15 is a block diagram illustrating a part of a control device for controlling the present EC mounting system, which part relates to the present invention.

A gear 180 is rotatably mounted on the support shaft 152, and is fixed to the nozzle holder 154 by a connecting member in the form of a pin 182 so that the nozzle holder 154 is rotated with the gear 180. The gear 180 meshes with a gear 186 fixed to a support shaft 184 which is rotatably attached to the side wall 148 of the holder portion 146. The gears 180, 186 have the same diameter. The gear 186 has an integrally formed bevel gear 188, while the inner shaft 144 has a bevel gear 190 integrally formed at its lower end. The bevel gears 188, 190 mesh with each other, and have the same diameter. The upper end portion of the inner shaft 144 projects upwards from the sleeve 138, and is connected through a connecting member 196 to an output shaft 194 of a nozzle rotating/selecting servomotor 192. The inner shaft 144 is axially movable and is not rotatable relative to the connecting member 196. The nozzle rotating/selecting servomotor 192 is bidirectionally operated at a suitable speed, and an angle of rotation of the output shaft 194 is detected by an encoder 193 (FIG. 15).

The supplying of electric energy from a power source to the solenoid-operated valves as the switching devices 178 and the nozzle rotating/selecting servomotors 192 may be achieved by using a common slip ring. However, in the present embodiment, the electric energy is supplied by a no-contact electricity supplying device disclosed in, e.g., U.S. Pat. No. 5,588,195. The no-contact electricity supplying device includes twelve electricity suppliers and twelve electricity receivers for the twelve switching devices 178 and the twelve servomotors 192, respectively. The electricity suppliers are provided on the stationary shaft 66, and include respective supply-side coils each connected to the power source. The electricity receivers include respective receiver-side coils which are opposed to the supply-side coils with small clearances therebetween, and are rotated at a constant speed together with the above-indicated rotary valve (not shown) employed for the supplying of vacuum, by the above-indicated valve drive servomotor (not shown). The receiver-side coils are connected via conductive lines to the solenoid-operated valves 178 and the nozzle rotating/selecting servomotors 192, so as to receive the electric energy supplied from the electricity suppliers.

The connecting member 196 takes the form of a sleeve which engages the output shaft 194 and is connected to the output shaft 194 through a connecting member in the form of a pin 198 such that the sleeve 196 is not rotatable and axially immovable relative to the output shaft 194. The connecting member 196 has two cutouts 206 formed in diametrically opposite portions. These cutouts 206 extend in the axial direction of the connecting member 196 and are open in the lower end face of the connecting member 196.

The upper end portion of the inner shaft 144 is fitted in the connecting member 196 such that the inner shaft 144 is axially movable relative to the connecting member 196. The inner shaft 144 has a pin 208 extending diametrically through its upper end portion such that the opposite end portions of the pin 208 project outwardly of the inner shaft 144. These opposite end portions of the pin 208 engage the respective cutouts 206 such that the opposite end portions of the pin 206 are movable in the cutouts 206 in the axial direction of the inner shaft 144. With the pin 206 and the cutouts 206 engaging each other, a rotary motion of the nozzle rotating and selecting servomotor 192 is transmitted to the inner shaft 144 through the connecting member 196. Thus, the pin 208 and the cutouts 206 serve as a first engaging member and a second engaging member, respectively, which engage each other and cooperate to permit the connecting member 196 and the inner shaft 144 to be connected to each other such that these connecting member 196 and inner shaft 144 are axially movable relative to each other and are not rotatable relative to each other.

A drive member 202 in the form of a ring is fitted on the inner shaft 144 such that the drive member 202 is axially movable relative to the inner shaft 144. The drive member 202 includes a portion which is concentrically and fixedly fitted in the lower end of the connecting member 196 so as to close the lower open ends of the cutouts 206. The drive member 202 has a toothed peripheral portion 200 formed by six grooves, which are formed through the thickness of the drive member 202 such that the grooves are equi-angularly arranged in the circumferential direction of the drive member 202 and are open in the radially outward direction.

The vertical slide 124 carries a motor support in the form of an elevator 210 on which the nozzle rotating/selecting servomotor 192 is mounted. The elevator 210 is generally U-shaped in cross section, and includes two opposed side walls 212, 216 which partly define the U-shape. The elevator 210 has a guide member in the form of a guide block 214 fixed to the side wall 212, and is vertically slideable on the vertical slide 124 through the guide block 214. To an outer surface of the other side wall 216, there is attached a cam follower in the form of a cam follower roller 218, which is rotatable about an axis extending in a radial direction of the stationary shaft 66. The side wall 216 has a cylindrical engaging boss 220 formed on its lower end face. The engaging boss 220 has a relatively small diameter.

The elevator 210 is biased upwards by biasing means in the form of an elastic member in the form of a compression coil spring 224 interposed between the drive member 202 and the upper end of the sleeve 138 which is located above the bracket 136. That is, the elevator 210 is biased by the spring 224 in a vertical direction away from the sleeve 138. An upward movement of the elevator 210 under the biasing action of the compression coil spring 224 is limited by abutting contact of the drive member 202 with the pin 208 fixed to the inner sleeve 144. In other words, the upper stroke end position of the elevator 210 is established by this abutting contact of the drive member 202 with the pin 208. A driven member 232 is fixed to the upper end portion of the sleeve 138. The driven member 232 includes an annular portion 234 fixedly fitted on the sleeve 138. The annular portion 234 has a radial extension which extends radially outwardly in a direction away from the vertical slide 124 and which has an engaging cutout 238.

The driven member 232 further includes an arm portion 240 extending upwards from the annular portion 234. The arm portion 240 has teeth 242 formed on an inner surface thereof facing the inner shaft 144. The teeth 242 provides part of an internally gear, which cooperates with the toothed peripheral portion 200 of the drive member 202 to constitute a claw clutch. When the elevator 210 is placed in its upper stroke end position under the upward biasing action of the compression coil spring 224, the toothed peripheral portion 200 of the drive member 202 is held in meshing engagement with the teeth 242 of the arm portion 240 of the driven member 232, such that the toothed peripheral portion 200 and the teeth 242 are movable relative to each other in the axial direction of the sleeve 138 and are not rotatable relative to each other, whereby the sleeve 138 and the inner shaft 144 are not rotatable relative to each other. In this condition, the engaging boss 220 provided on the elevator 210 is aligned with the engaging cutout 238 formed through the driven member 232, in the circumferential direction of the sleeve 138, and the engaging boss 220 is engageable with the cutout 238 when the elevator 210 is moved down. This position in which the boss 220 is engageable with the cutout 238 will be referred to as an "original circumferential position" of the sleeve 138 and the component holder head 120. In this original circumferential position, the horizontal axis of the support shaft 152 rotatably supporting the nozzle holder 154 extends in a radial direction of the stationary shaft 66 (axis of rotation of the rotary plate 70), which is parallel to the plane of the rotary plate 70.

A stationary nozzle selecting cam 248, shown in FIGS. 6 and 7, is located in an area which is between the component discarding area and the component sucking station and in which the rotary plates 70 are rotated at the predetermined constant velocity while the component holder heads 120 are moved in a horizontal plane maintaining a constant height. The nozzle selecting cam 248 has a cam surface 250 which is elongated in the rotating direction of the rotary plates 70, along a circular arc having a center at the axis of the stationary shaft 66. The cam surface 250 consists of a downwardly inclined region, a level region, and an upwardly inclined region, which are arranged in the rotating direction of the rotary plates 70. The downwardly inclined region is inclined downwards in the rotating direction of the rotary plates 70, namely, in the direction from the upwardly inclined region toward the level region. The level region extends from the downstream or lowest end of the downwardly inclined region, at the same level or height as the lowest position at the downward end of the downwardly inclined region. The upwardly inclined region extends from the downstream end of the level region remote from the downwardly inclined region, and is inclined upwards in the rotating direction of the rotary plates 70, namely, in the direction from the level region toward the downwardly inclined region. As the cam follower roller 218 is moved in rolling contact with the downwardly inclined region of the cam surface 250, the elevator 210 is moved downwards. The elevator 210 is held level while the cam follower roller 218 is moved in rolling contact with the level region. As the roller 218 is moved in rolling contact with the upwardly inclined region, the elevator 210 is permitted to be moved upwards. The height of the nozzle selecting cam 248 is determined so that the downwardly inclined region of the cam surface 250 is engageable with the cam follower roller 218 when the elevator 210 is placed in its upper stoke end position. The initial portion of the downwardly inclined region is shaped to have a part-cylindrical surface, for facilitating the engagement with the roller 218. The elevator 210 is placed in its lower stroke end position while the roller 218 is in rolling contact with the level region of the cam surface 250 of the cam 248.

Figure 8:
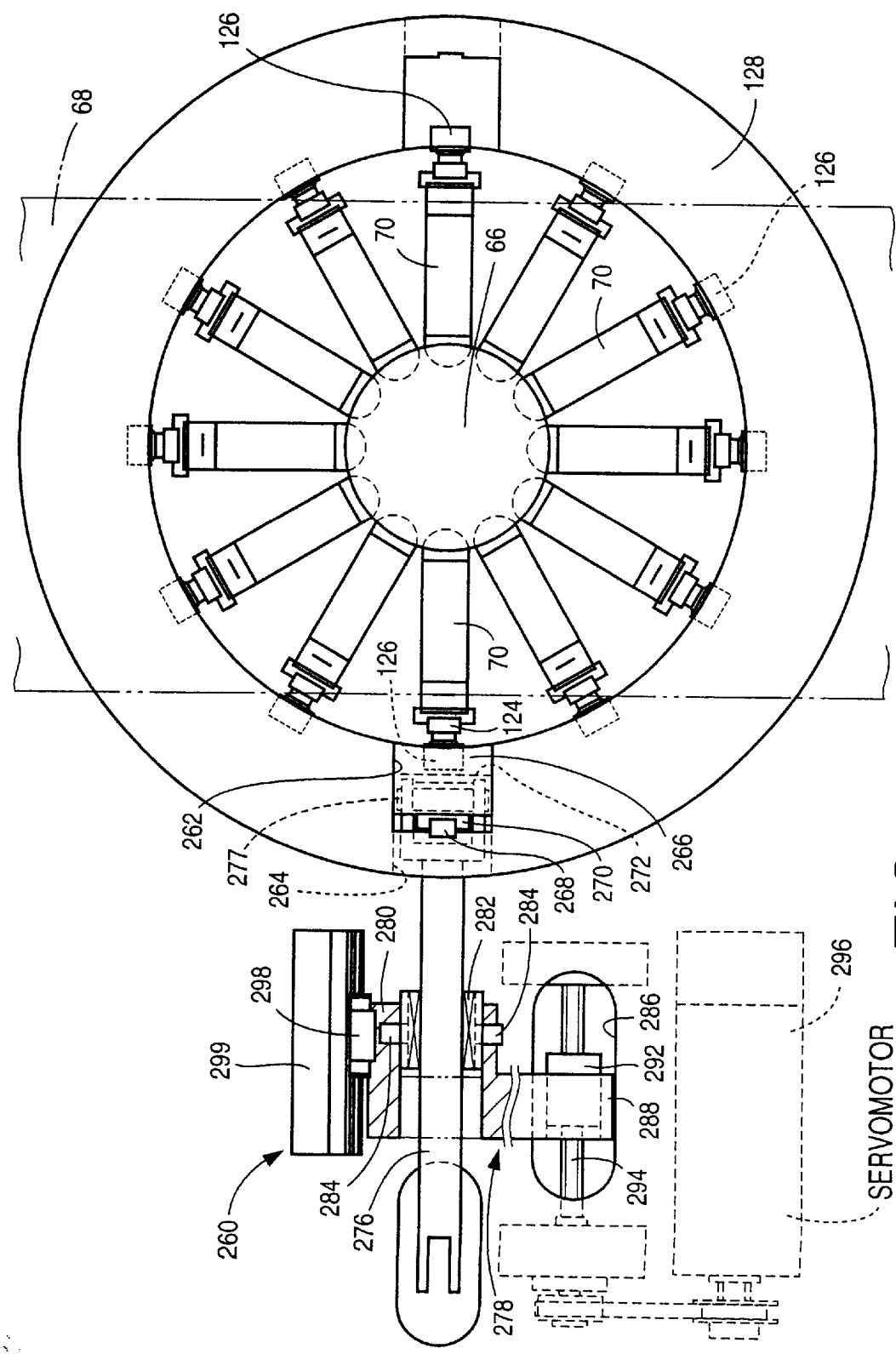
FIG. 8 is a bottom plan view showing a head elevating and lowering device and a stationary cylindrical cam in the transferring and mounting apparatus.

At two positions corresponding to the component sucking and mounting positions of the frame 60, there are disposed two head elevating and lowering devices 260. However, FIGS. 2 and 8 show only the head elevating and lower device 260 disposed at the position corresponding to the component mounting position. FIG. 8 is a bottom plan view of the device 260 as seen from under the frame 60. Since the two head elevating and lower devices 260 have the same construction, the device 260 at the position corresponding to the component mounting position of the frame 60 will be explained.

The stationary cylindrical cam 128 has an engaging groove 262 formed at a circumferential position thereof corresponding to the component mounting position. This groove 262 is open in the inner circumferential surface and the upper and lower surfaces of the cylindrical cam 128, as shown in FIGS. 2 and 8. The cam 128 further has a radial opening 264, which is formed through an upper part of a radially outer portion of the cam 128 in the radial direction, for communication with the engaging groove 262. A vertically movable member 266 is vertically movably received in the groove 262. The cam 128 further has a guide member in the form of a straight guide rail 268 formed on the bottom wall of the groove 262 in the vertical direction (in the axial direction of the cam 128). On the other hand, a pair of guide blocks 270 are fixed to the vertically movable member 266. These guide blocks 270 slidably engage the guide rail 268.

A lower portion of the vertically movable member 266 has a circumferential dimension (as measured in the circumferential direction of the cylindrical cam 128), which is determined to provide a small clearance between the lower portion and the inner surfaces of the groove 262, for permitting the vertically movable member 266 to move vertically in the groove 262. A groove 272 is formed through this lower portion of the vertically movable member 266, such that the groove 272 is open in the inner surface of the member 266 corresponding to the inner circumferential surface of the cylindrical cam 128, and extends in a horizontal plane in a direction parallel to a tangent line at a circumferential point of the cam groove 130 corresponding to the component mounting position.

The vertically movable member 266 has an upper portion whose circumferential dimension is smaller than that of the lower portion described above. This upper portion is pivotably connected at an upper part thereof to a forked end portion of a pivotal member in the form of a lever 276 through a shaft member in the form of a pin 277. The lever 276 extends through the radial opening 264 and projects radially outwardly from the outer circumferential surface of the cam 128. The lever 276 is supported at an intermediate portion thereof by a support portion 280 of a support member 278 through a bearing 282 such that the support member 278 is moved relative to the lever 276 in the longitudinal direction of the lever 276. The bearing 282 has two support pins 284 formed on two side surfaces thereof parallel to the longitudinal direction of the lever 276, such that the support pins 284 extend perpendicularly to the longitudinal direction of the lever 276, as shown in FIG. 8. These support pins 284 function as a shaft portion which rotatably engages the support portion 280 of the support member 278, so that the lever 276 is pivotable together with the bearing 282, about the axis of the support pins 284.

As shown in FIG. 8, the support member 278 has an arm portion 288 extending horizontally from the support portion 280 into the interior of the frame 60 through an elongate hole 286 formed through the frame 60. The arm portion 288 carries a nut 292 fixed at its free end within the frame 60. The nut 292 engages a feed screw 294, which is rotated by a drive source in the form of a head stroke adjusting servomotor 296 for moving the support member 278 in the longitudinal direction of the lever 276. A movement of the support member 278 in the longitudinal direction of the lever 276 causes a longitudinal movement of the bearing 282 and the support pins 284 relative to the lever 276, whereby the pivoting axis of the lever 276 is changed in the longitudinal direction of the lever 276, to thereby change the vertical stroke of the vertically movable member 266. Thus, the feed screw 294 and the servomotor 296 constitute a major portion of a device for changing the vertical stroke of the vertically movable member 266. A guide block 298 is fixed to the support portion 280. This guide block 298 is in sliding contact with a guide rail 299 fixed to the frame 60, so that the support member 278 is guided by the guide block 298 and the guide rail 299. In FIG. 2, the guide block 298 and the guide rail 299 are not shown.

As shown in FIG. 2, a generally L-shaped lever 300 is rotatably supported by a shaft 302 fixed to the frame 60. The lever 300 has an arm 303 whose free end is pivotally connected to an upper end portion of a connecting member in the form of a rod 304 through a shaft member in the form of a pin 306. The upper end portion of the rod 304 is movable relative to the pin 306 in the axial direction of the pin 306. The rod 304 extends through an elongate hole 305 formed through the mounting structure 62, and the lower end of the rod 304 is pivotally connected through a pin 308 to an end portion of the lever 276 remote from the end portion connected to the vertically movable member 266.

The generally L-shaped lever 300 has another arm 312 which carries a cam follower roller 314 pivotably attached at its free end portion. The lever 300 is biased by biasing means in the form of an elastic member in the form of a tension coil spring 316 so that the cam follower roller 314 is held in rolling contact with a cam surface 320 of a head elevating and lowering cam 318 which is rotatably attached to the frame 60.

The head elevating and lowering cam 318 is supported by a support shaft 322 which is rotatably supported by the frame 60. As shown in FIG. 3, a timing pulley 324 is fixedly mounted on the support shaft 322, and the timing pulley 324 is connected through the timing belt 112 to the timing pulley 110 fixed to the output shaft of the main drive servomotor 108. Thus, the head elevating and lowering cam 318 is driven by the same servomotor 108 as used for driving the concave globoidal cams 90a–90d. The diameter of the timing pulley 324 is determined so that the cam 318 is rotated through 360° for a component mounting time interval equal to a time interval at which the rotary plates 70 are successively stopped at the component mounting position.

While FIG. 2 shows that the head elevating and lowering cam 318 has a cam surface 320 which has a circular shape, the cam 318 actually has a heart-like shape in cross section, so that a rotary motion of the cam 318 causes the lever 300 to be pivoted to vertically move the rod 304 for thereby pivoting the lever 276 so as to vertically move the vertically movable member 266. Since the rod 304 and the vertically movable member 266 are connected to the opposite ends of the lever 276 on the opposite sides of the support pins 284, the member 266 is moved down while the rod 304 is moved up, and vice versa. The lowermost and uppermost positions of the rod 304 are determined by the profile of the cam surface 320. Described more specifically, the lowermost position of the rod 304 is adjusted by adjusting the axial position of the rod 304 so that the groove 272 formed through the vertically movable member 266 is aligned or contiguous with the cam groove 130 in the cylindrical cam 128 in the vertical direction, so as to form a horizontal groove, and so that the lever 276 has a horizontal attitude parallel to the feed screw 294 and the guide rail 299 when the rod 304 is placed in the lowermost position. The uppermost position of the vertically movable member 266 is determined by the lowermost position of the rod 304 determined as described above. In the uppermost position of the vertically movable member 266, this member 266 cooperates with the adjacent portions of the cam groove 130 to hold the component holder head 120 at the uppermost position for a predetermined time. To mount the electric component 164 on the PCB 38 when the rotary plate 70 is located at the component mounting position of the cylindrical cam 128, the vertically movable member 266 disposed at the position corresponding to the component mounting position is first lowered from the uppermost position to the lowermost position and then elevated back to the uppermost position. The member 266 is held at the uppermost position at the positions other than the component mounting position.

As is apparent from the above description, the lever 276 is parallel to the guide rails 299 for guiding the support member 278 when the vertically movable member 266 is placed in the uppermost position with the rod 304 moved to the lowermost position. In this condition, the support member 278 is moved as needed, in the direction parallel to the guide rails 299, to change the position of the pivoting axis of the lever 276. Thus, the operating stroke of the vertically movable member 266 can be changed by changing the lowermost position of the member 266, without changing the uppermost position of the member 266.

Figure 9:
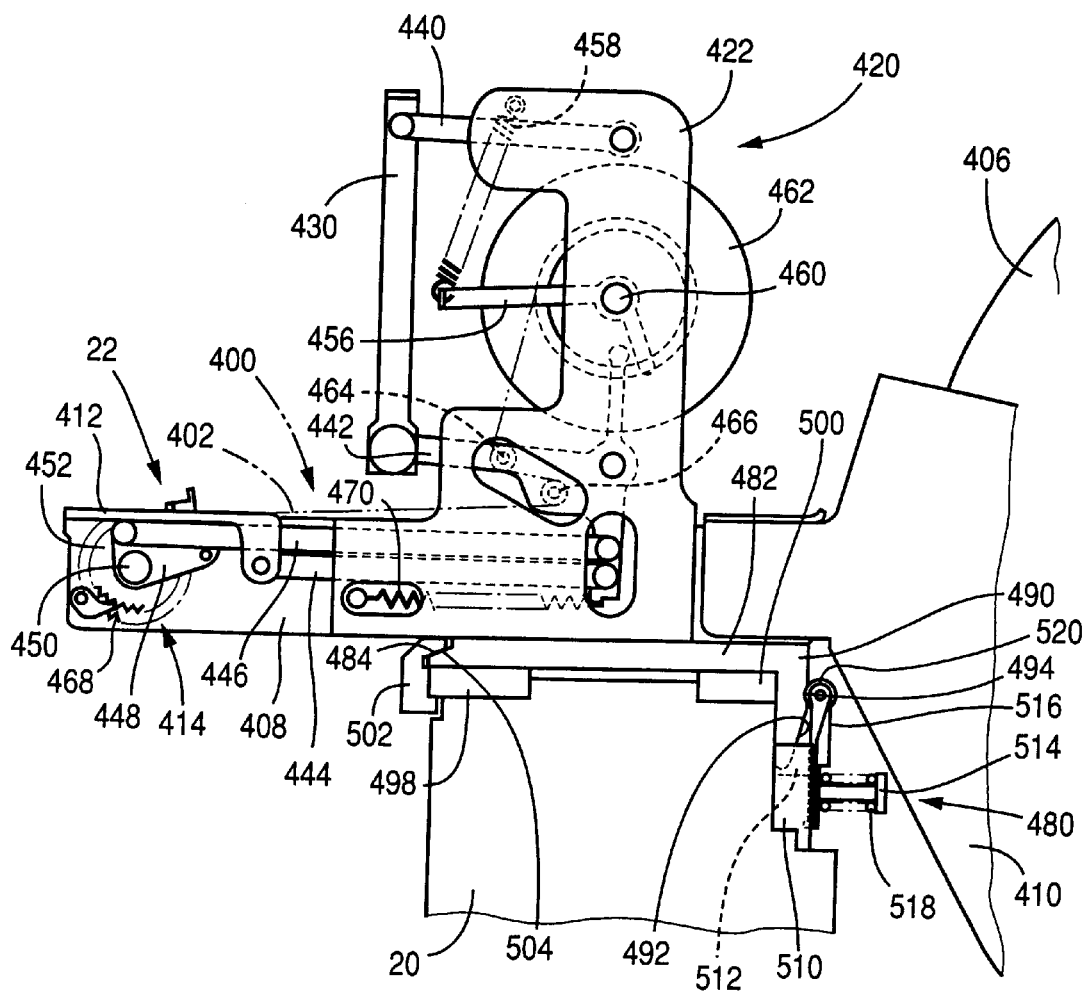
FIG. 9 is a front elevational view of a part of a cartridge of an EC supplying device of the EC transferring and mounting apparatus.

As shown in FIG. 9, each component supply cartridge 22 of the electric component ("EC") supply device 14 supplies the electric component ("ECs") 164 which are carried by a carrier tape 400. The carrier tape 400 includes a component holder tape (not shown) and a cover tape 402 which cooperate with each other to hold the ECs 164. The holder tape is an embossed-type tape including a pair of side portions each continuously extending in the longitudinal direction of the tape, and a component accommodating portion projecting downward from an intermediate portion between the two side portions and continuously extending in the longitudinal direction. The component accommodating portion includes a number of component accommodating pockets which are equi-distant from one another in the longitudinal direction and have respective upper openings. The ECs 164 are accommodated in the pockets of the holder tape, respectively. The cover tape 402 covers the respective upper openings of the pockets of the holder tape. The carrier tape 400 is wound around a reel 406 as a tape holder. The reel 406 is held by a reel holder 410 which is attached to a rear portion of a cartridge frame 408 which portion is remote from the EC transferring and mounting apparatus 12.

The cartridge frame 408 has a generally elongate and plate-like configuration, and is attached to the cartridge support block 20 such that the longitudinal and thicknesswise directions thereof are horizontal. The carrier tape 400 is placed on the cartridge frame 408 such that the pair of side portions of the holder tape of the tape 400 are supported on a pair of guide portions (not shown) on both sides of a guide groove (not shown) provided on the frame 408, and is covered by a cover member 412. The carrier tape 400 is intermittently fed forward at a predetermined feeding pitch by a tape feeding device 414, in the longitudinal direction of the frame 408 parallel to the Y-axis direction. Thus, the EC accommodating pockets of the tape 400 are moved in the guide groove of the frame 408. Accordingly, the upper surface of each carrier tape 400 take the same height position, irrespective of whether each tape 400 carries large or small ECs.

A cover-film take-up device 420 is also attached via a bracket 422 to the cartridge frame 408. The tape feeding device 414 and the cover-film take-up device 420 are driven by a drive device which utilizes the main drive servomotor 108 as a drive source. The rotation of the servomotor 108 is converted into upward and downward movements of a vertically movable member 428 (FIG. 10) by a motion converting mechanism which is provided by a cam, a cam follower, etc. (not shown), and the upward and downward movements of the vertically movable member cause a drive bar 430 attached to the bracket 422 to move upward and downward. Consequently the feeding device 414 and the take-up device 420 are operated.

As shown in FIG. 10, a bracket 432 is fixed with a screw member 434 to a lower end portion of the vertically movable member 428, and a roller 436 is attached via bearings 438, 439 to a lower end portion of the bracket 432 which portion projects downward from the movable member 428, such that the roller 436 is rotatable about an axis line parallel to the Y-axis direction.

Since the tape feeding device 414 and the cover-tape take-up device 420 are known in the art, they will be described briefly below.

As shown in FIG. 9, an upper end portion of the drive bar 430 is rotatably attached to a support bar 440 which is rotatably attached to the bracket 422, so that when the vertically movable member 428 is moved downward, the drive bar 430 is moved downward. Consequently a drive lever 442 whose one arm is rotatably attached to a lower end portion of the drive bar 430 is rotated, and a cover drive bar 444 and a rotary-plate drive bar 446 each of which is rotatably connected to another arm of the drive lever 442 are moved. Thus, the cover member 412 which is connected to the cover drive bar 444 is moved backward, and a rotary plate 448 which is rotatably connected to the rotary-plate drive bar 446 is rotated about an axis line of an axis member 450. Consequently a ratchet wheel (not shown) which is rotatably attached to the rotary plate 448 is moved over teeth of a ratchet wheel 452. Thus, the tape feeding device 414 prepares for the next intermittent feeding of the carrier tape 400.

Concurrently, in the cover-tape take-up device 420, a take-up lever 456 is rotated about an axis member 460 by a biasing force of a compression coil spring 458 as a sort of elastic member as a sort of biasing means. Between the take-up lever 456 and a take-up reel 462 which is rotatably supported by the axis member 460, there is provided a first one-direction clutch (not shown) which inhibits a rotation of the take-up lever 456 relative to the take-up reel 462 in a direction in which the cover tape 402 is taken up, but permits a rotation of the lever 456 relative to the reel 462 in the opposite direction. Additionally, between the reel 462 and the axis member 460, there is provided a second one-direction clutch (not shown) which permits a rotation of the take-up reel 462 in a direction in which the cover tape 402 is taken up, but inhibits a rotation of the reel 462 in the opposite direction. Therefore, when the take-up lever 456 is rotated in the cover-tape take-up direction by the biasing force of the spring 458, the take-up reel 462 is also rotated so as to peel a predetermined length of the cover tape 402 from the holder tape and take up the predetermined length of tape 402 concurrently with the backward movement of the cover member 412. Simultaneously, movable guide rollers 464, 466 are moved downward, and accordingly the distance between the movable guide roller 464 and the take-up reel 462 increases, so that a certain length of tape 402 is temporarily stored. Thus, the cover-tape take-up device 420 functions as a cover-tape peeling device.

On the other hand, when the vertically movable member 428 is moved upward, the drive bar 430 is also moved upward to follow the upward movement of the movable member 428, because of a biasing force of a compression coil spring 470 which is provided between a lower end portion of the drive lever 442 and the cartridge frame 408. Consequently the cover drive bar 444 and the rotary-plate drive bar 446 are moved forward, the rotary plate 448 and the ratchet wheel 452 are rotated, and a sprocket 468 which is connected to the ratchet wheel 452 such that the sprocket 468 is not rotatable relative to the wheel 452, is rotated. Thus, the carrier tape 400 is fed forward by one feeding pitch together with the cover member 412. Although the take-up lever 456 is rotated in the direction opposite to the cover-tape take-up direction because of the rotation of the drive lever 442, the take-up reel 462 is not rotated or moved in the cover-tape take-up device 420. However, since the movable guide roller 464 is moved upward and accordingly the distance between the guide roller 464 and the take-up reel 462 decreases, the temporarily stored length of the cover tape 402 is fed out to permit the carrier tape 400 to be fed forward by one pitch.

The carrier tape 400 is intermittently fed forward by the tape feeding device 414, so that the leading one of the EC accommodating pockets of the holder tape from which the cover film 402 has already been peeled, is moved to a predetermined component pick-up position which is right below the component sucking position where the component suction nozzle 158 being positioned at the operating position in each component holder head 120 is stopped. Each cartridge 22 includes a component supply portion around the component pick-up position, and a number of cartridges 22 are attached to the cartridge support block 20 such that the respective component supply portions of the cartridges 22 are arranged along a straight line parallel to the X-axis direction.

The cam of the motion converting mechanism which moves the movable member 428 upward and downward, is designed such that when the component suction nozzle 158 is moved downward to suck the EC 164, the movable member 428 is moved downward and the cover member 412 is moved backward concurrently with the downward movement of the nozzle 158, such that when the nozzle 158 contacts and sucks the EC 164, the cover member 412 keeps covering the EC 164 for preventing the ECs from changing its posture or attitude (e.g., lying on its side due to the vacuum applied thereto by the nozzle 158), such that after the nozzle 158 holds the EC 164 by suction, the cover member 412 is moved backward away from the EC 164 held by the nozzle 158, so that the nozzle 158 is permitted to pick up the EC 164 from the EC accommodating pocket of the holder tape of the carrier tape 400, and such that after the nozzle 158 picks up the EC 164, the tape 400 is fed forward with the cover member 412.

The cover tape 402 is peeled from the holder tape at a position upstream of the component pick-up position in the direction of feeding of the carrier tape 400, and is drawn out via a slit (not shown) formed through the thickness of the cover member 412. Thus, the EC accommodating pockets of the holder tape from which the cover tape 402 has been peeled are covered by the cover member 412, so that the ECs 164 are prevented from lying on their sides. The cover member 412 has a wide opening at a position downstream of the above-described slit in the tape feeding direction, and a U-shaped recess which communicates with an upstream end of the wide opening and has a width larger than the outer diameter of the suction pipe 162 and is smaller than the widths of the ECs 164, i.e., dimensions of the same 164 in a direction parallel to the widthwise direction of the cartridge frame 408. The suction nozzle 158 sucks the EC 164 through the recess. When the cover member 412 is moved backward, the recess is moved away from the EC 164 held by the pipe 162, and the EC 164 is picked up through the wide opening by the pipe 162.

After the tape feeding device 414 feeds the carrier tape 400 one pitch, the cartridge 22 prepares for picking up of the next EC 164 from the tape 400. One cartridge 22 may be changed with another cartridge 22 such that after the carrier tape 400 is fed on the first cartridge 22, the cartridge support block 20 is moved so that the second cartridge 22 is positioned at the predetermined component supply position.

Each EC supply cartridge 22 is attached to the cartridge support block 22 by an attaching device 480. As shown in FIG. 9, a fitting member 482 is fixed to a bottom surface of the cartridge frame 408, and provides a fitting portion as an integral part of the frame 408. Two first positioning projections (not shown) whose width (i.e. dimension in the X-axis direction) is smaller than that of the fitting member 482, project from two locations on the fitting member 482 which are distant from each other in the longitudinal direction of the frame 408 attached to the block 22, i.e., in a direction parallel to the Y-axis direction. An engagement surface 484 is formed in an upper surface of a front end of the fitting member 482 which is nearer to the EC transferring and mounting apparatus 12 in the Y-axis direction than the rear end of the same 482. The engagement surface 488 is inclined downward in a direction parallel to the tape feeding direction. A second positioning projection 490 projects downward from the rear end of the fitting member 482, such that the second projection 490 extends in a direction opposite to the direction of extension of the cartridge frame 408 and makes a rectangle with respect to the fitting member 482. The second projection 490 includes a lower end portion whose rear surface defines a guide surface 492 which is inclined downward in the direction parallel to the tape feeding direction. The second projection 490 additionally has, above the guide surface 492, an engagement recess 494 having a part-cylindrical bottom surface.

Two positioning plates 498, 500 are fixed to a front and a rear location on a top surface of the cartridge support block 20, respectively, such that the two positioning plates 498, 500 extend parallel to each other in the X-axis direction. The front plate 498 has a number of front positioning grooves (not shown), and the rear plate 500 has the same number of rear positioning grooves (not shown). The front or rear grooves extend in the Y-axis direction, and are formed at a pitch equal to the pitch at which the cartridges 22 are attached to the support block 20. A stopper plate 502 is fixed to a front surface of the cartridge support block 20, and has an inclined stopper surface 504 whose inclination corresponds to that of the engagement surface 484 of the fitting member 482.

An attachment plate 510 is fixed to a rear surface of the cartridge support block 20 which is remote from the EC transferring and mounting apparatus 12. The attachment plate 510 has a number of positioning grooves 512 which correspond to the number of positioning grooves of the front and rear positioning plates 498, 500, respectively, and which open in a top and a bottom surface of the plate 510. A number of screw members 514 are screwed into a rear surface of the attachment plate 510. An engagement lever 516 fits on each screw member 514 such that the lever 516 is movable in the axial direction of the screw member 514, is rotatable about an axis line parallel to the X-axis direction, and is biased by a compression coil spring 518 as a sort of elastic member as a sort of biasing means, in a direction toward the attachment plate 510. A roller 520 is attached to an upper end portion of the lever 516 such that the roller 520 is rotatable about an axis line parallel to the X-axis direction.

When each EC supply cartridge 22 is attached to the support block 20, the front portion of the cartridge 22 which supports the tape feeding device 414 is tilted down and the rear portion of the same 22 which supports the reel 406 is tilted up, subsequently the front first positioning projection of the cartridge frame 408 is fit in one positioning groove of the front positioning plate 498, and then the cartridge 22 is moved forward until the engagement surface 484 engages the stopper surface 504 of the stopper plate 502. After this engagement, the rear portion of the cartridge 22 is put down on the support block 20, whereby the lower end portion of the second positioning projection 490 enters between the roller 520 and the support block 20. Because of the action of the inclined guide surface 492, the engagement lever 516 is rotated against the biasing force of the compression coil spring 518 in a direction in which the roller 520 is moved away from the second projection 490. Thus, the second projection 490 is permitted to be moved downward.

When the cartridge 22 is further moved downward, the second positioning projection 490 is fit in one positioning groove 512 of the attachment plate 510, and the roller 520 of the engagement lever 516 is engaged with the engagement recess 494. Thus, the cartridge 22 is positioned in the X-axis direction with the two first positioning projections being fit in the positioning grooves of the two positioning plates 498, 500 and with the second positioning projection 490 being fit in the positioning groove 512 of the attachment plate 510. In addition, the cartridge 22 is biased by the compression coil spring 518, so that the engagement surface 484 is engaged with the stopper surface 504 and the front end portion of the fitting member 482 is pressed against the support block 20 because of the action of the inclined surfaces 484, 504. In addition, because of the action of respective inclined portions of the roller 520 and the engagement recess 494, a downward force is exerted to the second projection 490. Simultaneously, an angular momentum is produced which has a center at the position where the engagement surface 484 engages the stopper surface 504, and a radius equal to the distance between the center and the position where the roller 520 engages the engagement recess 494. Because of this angular momentum, the rear half of the cartridge frame 408 is pressed on the support block 20. Thus, the cartridge 22 is stiffly attached to the support block 20. The first positioning projections, second positioning projection 490, positioning plates 498, 500, stopper plate 502, attachment plate 510, engagement lever 516, and compression coil spring 518 cooperate with one another to provide a major part of the attaching device 480.

As shown in FIGS. 1 and 10, a negative-pressure ("NP") measuring device 530 is attached to one end of the cartridge support block 20 of the EC supply device 14 in the X-axis direction, i.e., in the direction of movement of the support block 20. The NP measuring device 530 includes a main frame 532 which is constructed like the cartridge frame 408 of each cartridge 22, that is, has a generally elongate plate-like configuration having a bottom surface to which a fitting member 534 is fixed to provide a fitting portion as an integral part of the frame 532. The main frame 532 is provided with two first positioning projections 536, 538 and one second positioning projection 540 like the first positioning projections and the second positioning projection 490 of the cartridge frame 408. The front first positioning projection 536 has an engagement surface 542, and the second positioning 540 has a guide surface 544 and a part-cylindrical recess 546.

An attaching device 480 used for attaching the NP measuring device 530 is provided at the above-indicated one end of the cartridge support block 20. The attaching device 480 includes an engagement lever 516, a compression coil spring 518, etc. for use with the main frame 532 of the NP measuring device 530. The positioning plates 498, 500, the stopper plate 502, and the attachment plate 510 extend to the position where the main frame 532 is attached to the support block 20. Like each cartridge 22, the main frame 532 of the measuring device 530 is attached to the support block 20 by the attaching device 480, at the same pitch as that at which the cartridges 22 are attached to the support block 20.

An NP measure passage 550 is formed in the main frame 532 of the NP measuring device 530. One end of the NP measure passage 550 opens, in an upper surface 554 of the main frame 532, at a portion corresponding to the EC-supply portion of each cartridge 22. The EC suction nozzle 158 can contact the above-indicated portion around the opening of the NP measure passage 550. This portion provides a contact portion which can contact each suction nozzle 158.

Figure 11:
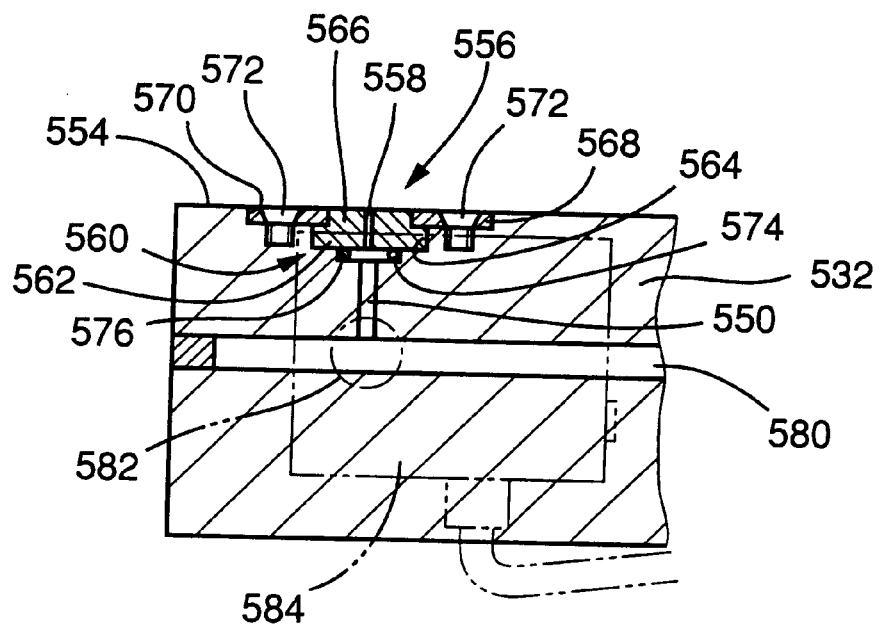
FIG. 11 is a front elevational view, in cross section, of a portion of the NP measuring device in which an NP measure passage is formed.
Figure 12:
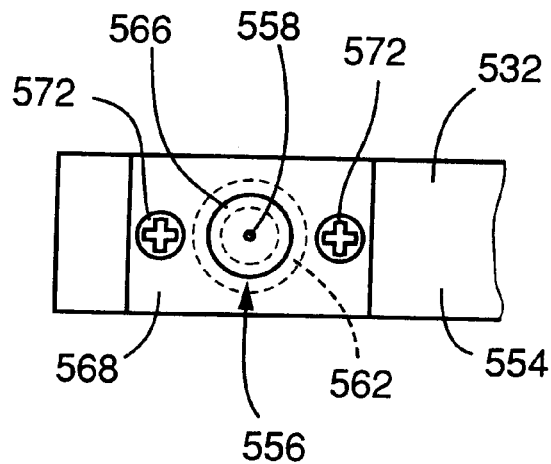
FIG. 12 is a plan view of the portion of the NP measuring device in which the NP measure passage is formed.

The opening of the NP measure passage 550 in the upper surface 554 and a portion of the passage 550 around the opening are defined by an opening defining member 556 separate from the main frame 532. As shown in FIGS. 11 and 12, the opening defining member 556 has a stepped configuration having a circular cross section, and has a passage 558 formed through a thickness thereof along an axis line thereof. The main frame 532 has a receiving groove 570 which opens in the upper surface 554 thereof and extends through a thickness thereof in the width-wise direction thereof (i.e., in the X-axis direction under the condition in that the main frame 532 is attached to the support block 20). The main frame 532 additionally has a receiving hole 560 which has a stepped configuration and opens in a bottom surface of the receiving groove 570. The opening defining member 556 includes a large-diameter portion 562 which fits in a large-diameter portion of the receiving hole 560, and a small-diameter portion 566 on which a coming-off preventing plate 568 fits. The preventing plate 568 also fits in the receiving groove 570, and is fixed to the main frame 532 with two screws 572 each as a sort of fixing means. Thus, the opening defining member 556 is attached to the main frame 532 such that the defining member 556 cannot come off, and can be detached from, the main frame 532. An upper end surface of the small-diameter portion 566 provides a part of the upper surface 554. An O-ring 576 is provided in a small-diameter portion 574 of the receiving hole 560, for preventing leakage of the negative pressure from the passage 558 and the NP measure passage 550.

The diameter of the passage 558 of the opening defining member 556 is equal to the inner diameter of the suction pipe 162 of one of the six suction nozzles 158. Since the respective suction pipes 162 of the six suction nozzles 158 have different inner diameters, there are prepared six opening defining members 556 whose respective passages 558 have different inner diameters which are equal to the different diameters of the six suction pipes 162, respectively. An appropriate one of the six opening defining members 556 is selected for a corresponding one of the six suction nozzles 158 which is to be tested regarding the NP (negative pressure) applied thereby. The remaining portion of the NP measure passage 550 other than the portion defined by the opening defining member 556 has an inner diameter equal to the greatest inner diameter of all the respective inner diameters of the six suction pipes 162.

Figure 13:
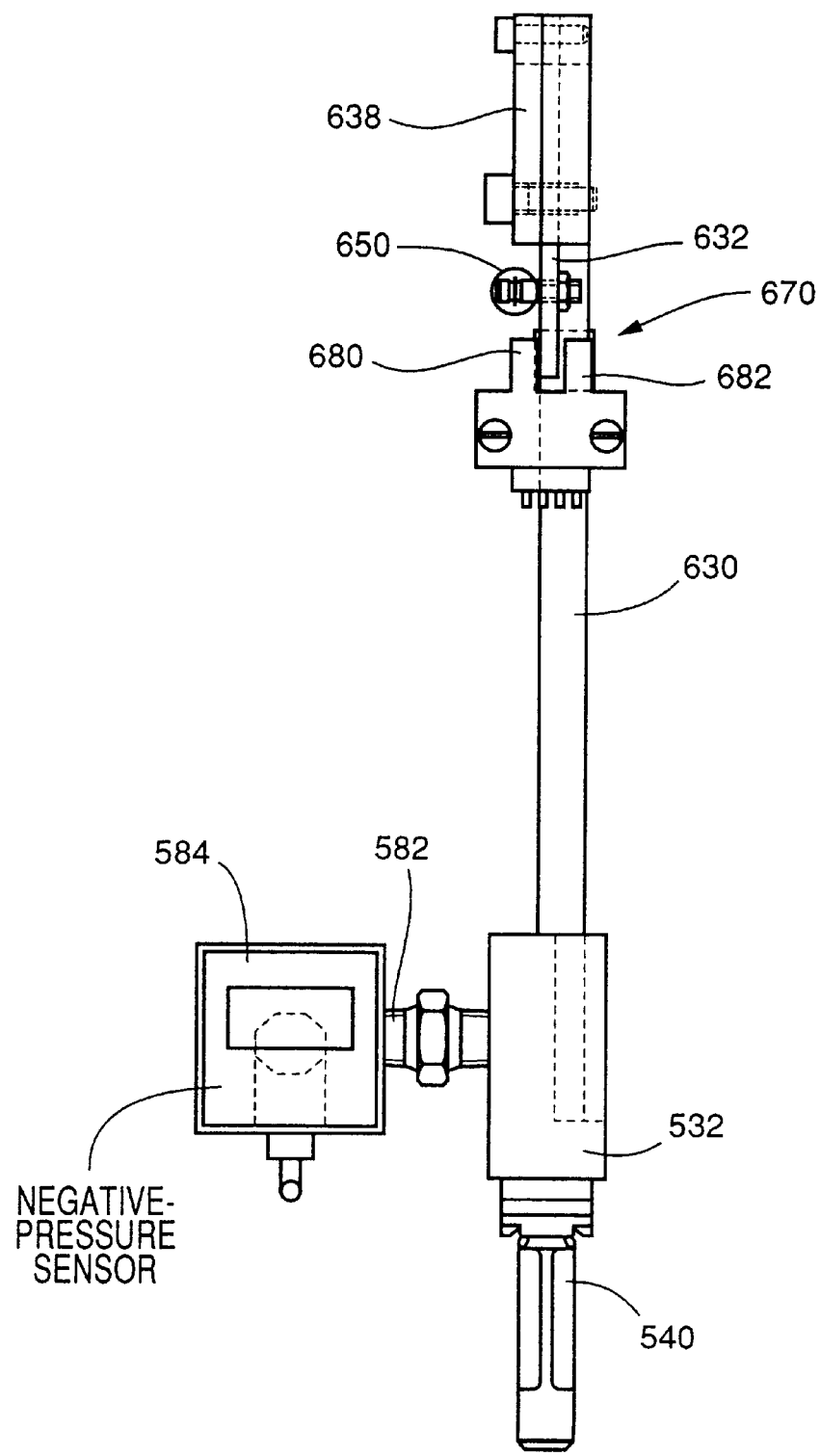
FIG. 13 is a right-hand side elevational view of the NP measuring device.

The other end of the NP measure passage 550 opens in one side surface of the main frame 532 of the measuring device 530. As shown in FIGS. 10 and 13, the opening of the passage 550 in the side surface is connected to an NP sensor 584 via a joint member 582. The NP sensor 584 is provided on the side of the main frame 532 which is opposite to the other side thereof on which the cartridges 22 are attached to the support block 20. The NP sensor 584 outputs a measured NP value after removing the negative sign "−" therefrom. Therefore, the sensor 584 outputs zero if a measured value is equal to the atmospheric pressure, and a positive value if a measured value is a negative value. Thus, a greater output value of the sensor 584 means a "greater" negative pressure, i.e., a greater sucking force.

Figure 14:
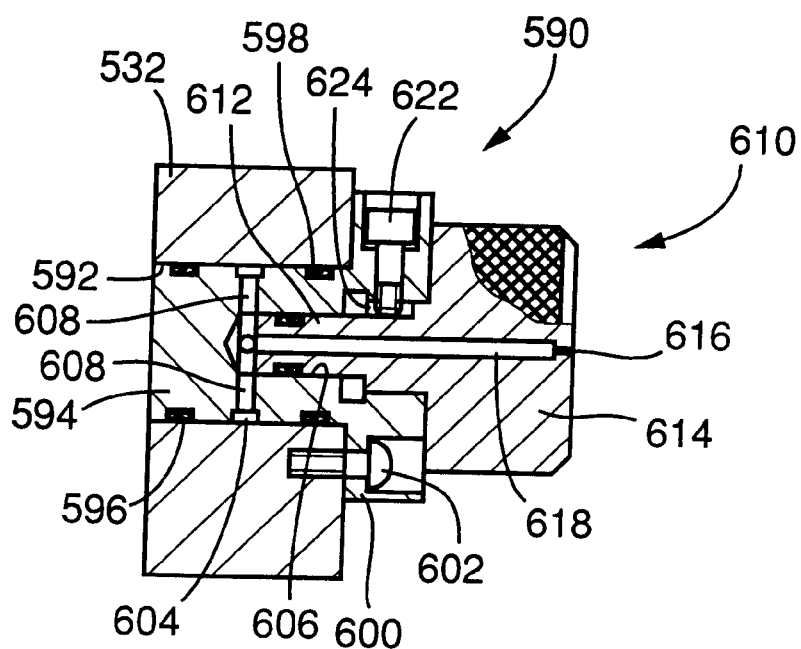
FIG. 14 is a front elevational view, in cross section, of a portion of the NP measuring device in which a communication-state changing device is provided.

As shown in FIG. 10, a branch passage 580 is formed in the main frame 532 such that the branch passage 580 extends in the length-wise direction of the main frame 532 (i.e., front-rear direction of the same 532) and communicates with the NP measure passage 550. A communication-state changing device 590 is connected to an opening of the branch passage 580. The main frame 532 has a receiving hole 592 which is formed through the thickness thereof in the width-wise direction thereof in rear of the point where the NP measure passage 550 is connected to the branch passage 580. As shown in FIG. 14, an adaptor 594 fits in the receiving hole 592 via O-rings 596, 598 as sealing members. The adaptor 594 includes a flange portion 600 which extends radially outward of the adaptor 594 and which butts on the main frame 532. The adaptor 594 is fixed to the main frame 532 with a plurality of screws 602 each as a sort of fixing means.

The adaptor 594 has an annular passage 604 which is located between the two O-rings 596, 598 and which opens in an outer circumferential surface of the adaptor 594. The branch passage 580 is communicated with the annular passage 604. The adaptor 594 has a receiving hole 606 which is concentric with the adaptor 594 and which has a bottom and opens in an end surface of the flange portion 600. A bottom portion of the receiving hole 606 is communicated with the annular passage 604 via a plurality of radial passages 608 formed in the adaptor 594. In the present embodiment, six restrictor members 610 and one blind plug (not shown) are prepared. Each of the restrictor members 610 includes an axis portion 612 and a head portion 614, and has a restrictor passage 616 which opens in an end surface of the head portion 614. Each restrictor member 610 additionally has a communication passage 618 which opens in an end surface of the axis portion 612 and communicates with the restrictor passage 616.

The axis portion 612 of the restrictor member 610 air-tightly fits in the receiving hole 606, and the head portion 614 butts on an end surface of the flange portion 600. The rotation and coming off of the restrictor member 610 are prevented by a screw member 622 which is screwed through the flange portion 600 of the adaptor 594 in a radial direction of the flange portion 600. The axis portion 612 of the restrictor member 610 has an axial recess 624 through which a free end portion of the screw member 622 passes to engage a bottom surface of the recess 624.

In the state in which the restrictor member 610 is attached to the adaptor 594, the branch passage 580 communicates with the atmosphere via the restrictor passage 616, so that leakage of air to the NP measure passage 550 is permitted. The respective restrictor passages 616 of the six restrictor members 610 have different cross sections (hereinafter, referred to as the "flow areas") corresponding to different flow areas of the six suction pipes 162 or the six suction nozzles 158, respectively.

Under a condition that the suction pipe 162 is free from clogging due to dust, foreign matter, or the like which may enter and clog the pipe 162 and stop flowing of air therethrough, and is also free from leaking of air, the suction pipe 162 applies the greatest NP (negative pressure) that is prescribed by the performance of the vacuum source 181. This greatest NP is sufficient to suck up the EC 164. However, some NPs smaller than the greatest NP are sufficient to suck up the EC 164. An NP smaller than the greatest NP by a predetermined amount or pressure may be created in the suction pipe 162 by employing an appropriate restrictor member and thereby permitting air to leak through the restrictor member. The diameter of the restrictor passage 616 of each of the six restrictor members 610 is so designed as to enable the corresponding one of the six suction pipes 162 each free from clogging to apply the smallest NP that can just suck up the EC 164, while permitting air leakage through the restrictor passage 616. This smallest NP will be referred to as the smallest EC sucking-up NP. Thus, in the present embodiment, a slight substantial clogging of each suction pipe 612 will reduce the NP created in the suction pipe 162 and the NP measure passage 550, and accordingly will be detected with high accuracy. The ratios of respective flow areas of the six restrictor passages 616 to those of the corresponding suction pipes 162 increase as the flow areas increase.

The blind plug, not shown, has a construction similar to that of the restrictor members 610, except that the blind plug has no restrictor passage 616 or communication passage 618. Accordingly, the blind plug is attached to, and detached from, the adaptor 594 in the same manner as that in which each restrictor passage 616 is attached to, and detached from, the adaptor 594.

As shown in FIG. 10, a testing driven lever 632 is attached via a bracket 630 to the main frame 532 such that the driven lever 632 is rotatable about an axis member 634 extending parallel to the X-axis direction. The driven lever 632 has an L-shaped configuration, is received in an L-shaped recess 636 formed in an upper portion of the bracket 630, and is covered by a cover member 638 fixed to the bracket 630. Opposite end portions of the axis member 634 are supported by the bracket 630 and the cover member 638, respectively.

The testing driven lever 632 has a first arm 642 which projects frontward from between the bracket 630 and the cover member 638. A cylindrical driven member 644 is fixed to an upper surface of a free end portion of the first arm 642 such that the driven member 644 extends parallel to the axis member 634. An upper part of an outer circumferential surface of the cylindrical member 644 projects upward from the upper surface of the first arm 642. The driven member 644, which has been subjected to thermal treatment, has a high wearing resistance. In the state in which the NP measuring device 530 is attached to the cartridge support block 20 and is moved to, and positioned at, the component supply position, the free end portion of the first arm 642 is positioned, below the elevator member 428, at a position which is taken by the drive bar 430 of each cartridge 22 positioned at the component supply position, in the Y-axis direction.

The testing driven lever 632 has a second arm 648 which projects downward from between the bracket 630 and the cover member 638. A tension coil spring 650 as an elastic member as a sort of biasing means is provided between the bracket 630 and a free end portion of the second arm 648. The coil spring 650 biases the driven lever 632 to rotate in a direction in which the driven member 644 is moved upward. The upward movement or rotation of the testing driven lever 632 caused by the biasing force of the coil spring 650 is limited or stopped by a plate-like stopper 654 which is attached to the bracket 630 such that a position of the stopper 654 is adjustable. The stopper 654 fits in a receiving groove 656 formed in the bracket 630, such that the stopper 654 is movable relative to the bracket 630 in a longitudinal direction of the groove 656 that extends in the Y-axis direction (i.e., in the front-rear direction of the main frame 532). The stopper 654 has an elongate hole 658 which extends in a longitudinal direction thereof, and two bolts 660 are screwed into the bracket 630 through the elongate hole 658. Thus, the stopper 654 is fixed to the bracket 630 such that the position of the stopper 654 relative to the bracket 630 in the Y-axis direction is adjustable.

When the end or limit of upward movement of the testing driven lever 632 is adjusted, first, the bolts 660 are loosened, and subsequently a screw member 664 which is screwed in an attachment plate 662 fixed to the bracket 630 is screwed deeper into the attachment plate 662 or returned shallower relative to the plate 662. If the screw member 664 is driven deeper into the attachment plate 662, the stopper 654 is advanced by being pushed by the screw member 664, so that the distance between the attachment plate 662 and the end or limit of forward movement of the second arm 648 of the driven lever 632 caused by the biasing force of the coil spring 650 increases, that is, the distance between the driven member 644 and the elevator member 428 positioned at its upper dead position increases. After this adjustment, the bolts 660 are tightened to fix the stopper 654 to the bracket 630. On the contrary, if the screw member 664 is returned to be shallower relative to the attachment plate 662, the stopper 654 follows the screw member 664 by being pushed by the second arm 648 biased by the coil spring 650, so that the distance between the attachment plate 662 and the end or limit of forward movement of the second arm 648 decreases, that is, the distance between the driven member 644 and the elevator member 428 positioned at its upper dead position decreases. The upward-movement limit of the first arm 642, that is, the forward-movement limit of the second arm 648 of the testing driven lever 632 is prescribed such that when the driven lever 632 takes that limit, there is left a small distance, e.g., 0.5 mm, between the driven member 644 and the roller 436 of the elevator member 428 positioned at its upper dead position. Since the elevator member 428 is moved upward and downward by a prescribed distance by the previously-described motion converting mechanism including the cam, the cam follower, etc., the angular range of rotation of the testing driven lever 632 caused by the upward and downward movement of the elevator member 428 can be adjusted by adjusting the rotation limit of the driven lever 632 as indicated above.

A position sensor 670 is attached to the bracket 630. An attachment plate 674 fits in a receiving groove 672 such that the attachment plate 674 is movable in a longitudinal direction of the groove 672. The receiving groove 672 is formed through the thickness of the bracket 630 in the Y-axis direction, at a location below the location where the stopper 654 is attached to the bracket 630. The attachment plate 674 has an elongate hole 676 which extends in a longitudinal direction of the plate 674. Two bolts 678 are screwed into the bracket 630 through the elongate hole 676. Thus, the attachment plate 674 is attached to the bracket 630 such that the position of the plate 674 relative to the bracket 630 is adjustable in the Y-axis direction.

One end portion of the attachment plate 674 projects rearward from the bracket 630, and the position sensor 670 is fixed to the projecting end portion of the plate 674. The position sensor 670 is provided by a micro photo sensor which includes a light emitter 680 and a light receiver 682 as shown in FIG. 13. The light emitter 680 and the light receiver 682 are distant from each other in the width-wise direction of the main frame 532, so that the testing driven lever 632 is permitted to enter a space between the two elements 680, 682. The position of the position sensor 670 relative to the testing driven lever 632 can be adjusted in the Y-axis direction by changing the position of the attachment plate 674 relative to the bracket 630. The adjusting of the position sensor 670 will be described later.

The electric component transferring and mounting apparatus 12 is controlled by a control device 330 illustrated in the block diagram of FIG. 15. The control device 330 is constituted principally by a computer 340 incorporating a central processing unit (CPU) 332, a read-only memory (ROM) 334, a random-access memory (RAM) 336, and a bus 338 connecting these elements 332, 334, 336. To the bus 338, there is connected an input interface 342 which receives respective outputs of the CCD camera 114, encoder 193, negative-pressure sensor 584, and special-position sensor 670. Also connected to the bus 338 is an output interface 344 which is connected to the cartridge feed servomotor 26, X-axis drive servomotor 42, Y-axis drive servomotor 48, main drive servomotor 108, nozzle rotating/selecting servomotors 192, head stroke adjusting servomotor 296, solenoid-operated valve 179, vacuum source 181, and printer 690 through respective driver circuits 346, 348, 350, 352, 354, 356, 358, 360, 362. The ROM 334 stores various control programs such as those for sucking up the electric component 164, taking an image of the component 164, and mounting the component 164 on the PCB 38, and those for measuring the negative pressure of the component suction nozzle 158 and evaluating the measured negative pressure.

When the electric components 164 are mounted on the PCB 38 in the electric component mounting system including the transferring and mounting apparatus 12, the four concave globoidal cams 90a–90d are concurrently rotated by the main drive servomotor 108 to rotate and stop the twelve rotary plates 70 such that the acceleration, deceleration, constant-velocity movement and stopping of the rotary plates 70 are effected independently of each other. The rotary plates 70 are stopped at the component sucking position, image taking position and component mounting position, so that the electric components 164 are sucked up by the heads 120 at the component sucking position, subjected to an image taking operation at the image taking position, and mounted on the PCB 38 by the heads 120 at the component mounting position.

The operation for the component holder head 120 to hold the electric component 164 will be first explained.

When a given rotary plate 70 is rotated about the stationary shaft 66 toward the component sucking position, the cam follower roller 126 in rolling contact with the cam groove 130 is moved into the groove 272 formed through the vertically movable member 266 received in the groove 262 formed in the cylindrical cam 128. The roller 126 is moved from the cam groove 130 into the groove 272 before the rotary motion of the rotary plate 70 to the component sucking position is completed. After the cam follower roller 126 has been moved into the groove 272 and before the rotary plate 70 is stopped at the component sucking position, a downward movement of the vertically movable member 266 from the uppermost position is initiated, whereby the roller 126 is lowered as the member 266 is lowered. As a result of the downward movement of the roller 126, the vertical slide 124 is lowered, and the component holder head 120 is accordingly lowered. Thus, a movement of the head 120 about the stationary shaft 66 and a downward movement of the head 120 are effected contemporaneously.

As a result of the downward movement of the head 120, the suction tube 162 of the suction nozzle 158 is brought into contact with the upper surface of the electric component 164, and the switching device 178 is switched to a position in which the electric component 164 is attracted under suction to the lower end of the suction tube 162. The suction nozzle 158 is moved downward over a sufficiently long distance, and any excessive downward movement of the suction nozzle 158 may be accommodated or absorbed by compression of the coil spring 160 biasing the suction nozzle 158. The rotary plate 70 has already been stopped at the component sucking position when the suction tube 162 is brought into contact with the electric component 164, so that the component 158 can be attracted to the suction tube 162 with high reliability. After the component 164 is sucked up by the head 120, the vertically movable member 266 is moved up, and the cam follower roller 126 is accordingly moved up, whereby the vertical slide 124 is elevated to elevate the head 120, so that the component 164 sucked up by the suction nozzle 158 is picked up from the carrier tape 400 on the cartridge 22.

After the component 164 is picked up from the cartridge 22 by the head 120, the rotation of the rotary plate 70 about the stationary shaft 66 is resumed before the vertically movable member 266 has reached its uppermost position and before the groove 272 has been aligned with the cam groove 130. The roller 126 is elevated in rolling contact with the groove 272 in the member 266, and is moved from the groove 272 into the cam groove 130 of the cylindrical cam 128 immediately after the member 266 has reached the uppermost position. Thus, the head 120 is simultaneously elevated and rotated after the component 164 is sucked up from the cartridge 22.

Subsequently, the rotary plate 70 is rotated to the image taking position. If the position of the EC 164 about the axis line of the suction nozzle 158 (hereinafter, referred to as the "angular position" of the EC 164) is needed to be changed between when the EC 164 is sucked by the suction nozzle 158 and when the EC 164 is mounted on the PCB 38, the angular position of the EC 164 is changed by rotating the suction nozzle 158 holding the EC 164 while the rotary plate 70 is rotated from the component sucking position to the image taking position. As shown in FIG. 5, a component angular-position changing area is provided between the component sucking position and the image taking position. The amount (i.e., angle) of changing of the angular position of the EC 164 is, e.g., 90° or 180° and is much greater than the positional error of the EC 164 about the axis line of the suction nozzle 158 (hereinafter, referred to as the "angular error" of the EC 164) that may be produced when the EC 164 is sucked by the nozzle 158. The control device 330 or the CPU 332 obtains, from the EC mounting program which is pre-stored in the ROM 334 and which defines the sort of each EC 164 and the position where each EC 164 is mounted on each PCB 38, information about whether or not the angular position of each EC 164 should be changed and by what amount or angle the angular position of the EC 164 should be changed.

When the angular position of the EC 164 is changed, the nozzle rotating/selecting servomotor 192 is actuated. Except when one of the suction nozzles 158 is selected while the rotary plate 70 is rotated in a suction-nozzle selecting area (described later) between the component discarding area and the component sucking area, the sleeve 138 and the inner shaft 144 are connected to each other through engagement of the teeth 242 of the driven member 232 with the toothed peripheral portion 200 of the drive member 200, as shown in FIG. 6, so that a rotary motion of the nozzle rotating/selecting servomotor 192 is transmitted to the sleeve 138 through the connecting member 196, drive member 202, and driven member 232. A rotary motion of the sleeve 138 causes a rotary motion of the suction nozzle 158 placed in the operating position, about its axis, whereby the electric component 164 held by suction on the end face of the suction tube 162 is rotated about the axis of the suction tube 162, by a suitable amount such as 180° or 90°.

It is noted that the inner shaft 144 is rotated with the sleeve 138, whereby the meshing position of the two bevel gears 188, 190 remains unchanged, so that the bevel gear 188 remains stationary, and the nozzle holder 154 is prevented from being rotated about the axis of the support shaft 152, to thereby prevent changing the suction nozzle 158 placed in the operating position.

The changing of the angular position of the EC 164 is finished before the rotary plate 70 is rotated to the image taking position, at which the rotary plate 70 is stopped so that the EC 164 held by the suction nozzle 158 is held stationary taking a horizontal posture. In this condition, an image of the EC 164 is taken by the CCD camera 114. On the basis of an output of the CCD camera 114, the control device 330 calculates an angular error, and X-axis and Y-axis position errors, of the EC 164. The angular position of the component 164 is adjusted to remove the angular error before the rotary plate 70 has reached the component mounting position. To this end, the nozzle rotating/selecting servomotor 192 is actuated to rotate the sleeve 138 and the inner shaft 144, in the same manner as that in which the angular position of the EC 164 is changed in the component angular-position changing area, so that the suction nozzle 158 placed in the operating position is rotated about its axis to rotate the EC 164 by an angle suitable to remove the calculated angular error. As shown in FIG. 5, a component angular-error correcting area is provided between the image taking position and the component mounting position.

When the rotary plate 70 is rotated toward the component mounting position, the cam follower roller 126 is moved from the cam groove 130 of the cylindrical cam 128 into the groove 272 in the vertically movable member 266 at the component mounting position. After the roller 126 has entered the groove 272 and before the rotary plate 70 has reached the component mounting position, a downward movement of the vertically movable member 266 is initiated to lower the component holder head 120 while the head 120 is rotated toward the component mounting position. The rotary plate 70 has already been stopped at the component mounting position before the EC 164 is mounted on the PCB 38. Namely, the head 120 is further lowered to mount the EC 164 at the predetermined point on the PCB 38 after the rotary plate 70 has reached the component mounting position. The vertical operating stroke of the head 120 may be changed depending upon the height dimension of the EC 164 when the EC 164 is mounted on the PCB 38. The stroke of the head 120 is reduced as the height dimension of the EC 164 increases. Precisely, the stroke of the head 120 should accommodate positioning errors such as dimensional and positioning errors in the manufacture of the PCB supporting and positioning device 16, for example, so that the ECs 164 can be accurately mounted on the PCB 38.

After the EC 164 has been placed at the predetermined point on the PCB 38, the switching device 178 is switched to a position to stop the application of a vacuum pressure to the suction nozzle 158, whereby the EC 164 is released from the suction nozzle 158. After the EC 164 is mounted on the PCB 38, the vertically movable member 266 is elevated to elevate the head 120. In this case, too, the rotation of the rotary plate 70 is resumed before the member 266 has reached the uppermost position, so that the roller 126 is elevated while it is moved in rolling contact with the groove 272. Immediately after the vertically movable member 266 has reached the uppermost position, the roller 126 is moved into the cam groove 130, and the rotary plate 70 is rotated toward the component sucking position. In the case where the EC 164 held by the suction nozzle 158 should not be mounted on the PCB 38 because of, e.g., occurrence of an error, the switching device 178 continues to apply the vacuum pressure to the suction nozzle 158, so that the EC 164 is not released onto the PCB 38 at the component mounting position and is discarded into the EC collecting container while the nozzle 158 is moved through the component discarding area.

While the rotary plate 70 is rotated from the component mounting position toward the component sucking position, the sleeve 138 is rotated in the direction opposite to the direction in which the sleeve 138 was rotated to change the angular position of the EC 164 and/or correct the angular error of the same 164 before the rotary plate 70 has reached the component discarding area. The amount of rotation of the sleeve 138 at this time is the same as that for changing the angular position of the EC 164 and/or that for correcting the angular error of the same 164, so that the sleeve 138 and the head 120 are returned to their original circumferential position. As shown in FIG. 5, there is provided a holder-head returning area between the component mounting position and the component discarding area.

After the sleeve 138 and the head 120 are returned to their original circumferential position, the rotary plate 70 is rotated over the EC collecting container which is elongate along the component discarding area. The suction nozzle 158 may discard the EC 164 into the collecting container, as needed.

While the rotary plate 70 is rotated from the component discharging area toward the component sucking station, with the component holder head 120 being moved at the constant velocity while maintaining the same height, the cam follower roller 218 is brought into engagement with the cam surface 250 of the nozzle rotating/selecting cam 248. The roller 218 initially contacts the downwardly inclined region of the cam surface 250, pushing down the elevator 210 against the biasing force of the compression coil spring 224. As a result, the teeth 242 of the driven member 232 is disengaged from the toothed peripheral portion 200 of the drive member 202, and the sleeve 138 is disengaged from the inner shaft 144, as shown in FIG. 7. When it is desired to change the suction nozzle 158 used to hold the EC 164, the nozzle rotating/selecting servomotor 192 is actuated in the condition of FIG. 7. As a result, only the inner shaft 144 is rotated, and a rotary motion of the inner shaft 144 is transmitted to the nozzle holder 154 through the bevel gears 188, 190 and the gears 180, 182, so that the nozzle holder 154 is rotated about the axis of the support shaft 152 to place a desired one of the six suction nozzles 158 in the operating position. As shown in FIG. 5, there is provided a suction-nozzle selecting area between the component discarding area and the component sucking position.

In the above-described manner, before the driven member 232 and the drive member 202 are completely disengaged from each other, the engaging boss 220 on the elevator 210 is moved into the engaging cutout 238 formed in the driven member 232, whereby the sleeve 138 is prevented from rotating and is held in the original circumferential position. The sleeve 138 is returned to the original circumferential position before the cam follower roller 218 is brought into contact with the cam surface 250, that is, before an operation to select the suction nozzle 158 is initiated. Consequently, the engaging boss 220 can be moved into the engaging cutout 238 to prevent rotation of the sleeve 138 when the elevator 210 is moved down by the cam follower roller 218. While the rotary plate 70 is rotated after the driven member 232 and the drive member 202 are disengaged from each other, the roller 218 is held in contact with the level region of the cam surface 250, so that the sleeve 138 and the inner shaft 144 are held disengaged from each other with the driven and drive members 232, 202 being held disengaged from each other.

The suction nozzle 158 currently placed in the operating position can be determined by the angle of and direction of rotation of the inner shaft 144, and the kind of the suction nozzle 158 that should be used for holding the next EC 164 can be determined according to the component mounting program which is formulated to mount various ECs 164 in a predetermined order on the PCB 38. The angle and direction of rotation of the servomotor 192 can be determined based on the determined kind of the suction nozzle 158 currently placed in the operating position and the determined kind of the EC 164 to be mounted next. Thus, the appropriate suction nozzle 158 is brought into the operating position by an operation of the servomotor 192. The direction of rotation of the servomotor 192 is determined so as to reduce the angle of rotation of the nozzle holder 154 required to select the desired suction nozzle 158. When only the inner shaft 144 is rotated, the sleeve 138 is prevented from rotating from its original circumferential position by the engagement of the engaging boss and cutout 220, 238, so that the sleeve 138 is not rotated through friction between the sleeve 138 and the inner shaft 144, that is, so that the nozzle holder 154 is rotated, in a horizontal plane, about a horizontal axis which is parallel to a radial direction of the stationary shaft 66.

When the nozzle holder 154 is rotated, the positioning pin 167 is retracted against the biasing force of the compression coil spring 169 because of the action of the respective tapered portions of each positioning hole 165 and the free end portion of the pin 167. Thus, the pin 167 is disengaged from each hole 165, thereby permitting the rotation of the nozzle holder 154. When the nozzle holder 154 is further rotated to such an extent that the pin 167 is substantially aligned with the next hole 165, the pin 167 is advanced because of the biasing force of the spring 169, to fit in the hole 165. Thus, the nozzle holder 154 is accurately positioned at the next hole 165, and the corresponding suction nozzle 158 is reliably positioned at the operating position.

During an operation to select the desired suction nozzle 158, the elevator 210 is held in its lower stroke end position with the cam follower roller 218 held in rolling contact with the level region of the cam surface 250 of the cam 248, so that the inner shaft 144 and the sleeve 138 are held disengaged from each other. When the suction-nozzle selecting operation is effected, the nozzle holder 154 may be rotated over 180° at a maximum in each of opposite directions. While the nozzle holder 154 is rotated, the rotary plate 70 is being rotated. The level region of the cam surface 250 has, in the circumferential direction of the cam 248, a sufficiently great length which holds, when being engaged with the roller 218, the elevator 210 in its lower stroke end position and thereby enables the inner shaft 144 and the sleeve 138 to be held disengaged from each other while the nozzle holder 154 is rotated by a desired angle.

After the desired suction nozzle 158 has been selected, the roller 218 is brought into contact with the upwardly inclined region of the cam surface 250. As the rotary plate 70 is further rotated, the elevator 210 is gradually elevated by the compression coil spring 224. As a result, the teeth 242 of the driven member 232 are brought into engagement with the toothed peripheral portion 200 of the drive member 202, and the engaging boss 220 is disengaged from the engaging cutout 238, whereby the sleeve 138 and the inner shaft 144 are connected to each other for simultaneous rotation, and the sleeve 138 is disengaged from the elevator 210. The teeth 242 are brought into engagement with the toothed peripheral portion 202 before the boss 220 is disengaged from the cutout 238, i.e., under the condition in which the sleeve 138 is positioned at its original circumferential position. Since the sleeve 138 is prevented from being rotated from its original position during rotation of the inner shaft 144 to select the suction nozzle 158, the teeth 242 can engage the toothed peripheral portion 200 of the drive member 202 which has been rotated during the operation to select the suction nozzle 158. After the desired suction nozzle 158 is selected, the rotary plate 70 is rotated to the component sucking position where the suction nozzle 158 sucks the next EC 164.

Next, there will be described a method of testing the NP-suction function of each component suction nozzle 158. This testing method may be carried out at an appropriate timing, such as before the ECs are mounted on the PCBs 38, after the ECs 164 are mounted on the PCBs 38, or while the ECs 164 are mounted on the PCBs 38. While the ECs 164 are mounted on the PCBs 38, the testing method may be carried out, for example, each time the ECs 164 have been mounted on a predetermined number of PCBs 38, or when one or more failures of the suction nozzles 158 to suck up the ECs 164 has or have occurred in such a manner that the failure or failures satisfies or satisfy a predetermined condition. Here, there will be described the case where the testing method is carried out before the ECs 164 are mounted on the PCBs 38.

First, the NP (negative pressure) applied by each suction nozzle 158 is measured. For each suction nozzle 158, two NP measurements are carried out. One measurement is carried out under a condition that the restrictor member 610 corresponding to each nozzle 158 is attached to the adaptor 594 of the communication-state changing device 590 so that the branch passage 580 is communicated with the atmosphere via the restrictor passage 616 of the restrictor member 610 and air is permitted to leak into the NP measure passage 550. The other measurement is carried out under a condition that the blind plug is attached to the adaptor 594 so that the branch passage 580 is closed and no substantial air is permitted to leak into the NP measure passage 550. The twelve EC holder heads 120 commonly have the same six sorts of EC suction nozzles 158. The twelve suction nozzles 158 of each same sort are commonly tested using the corresponding restrictor member 610 and the corresponding opening defining member 556.

The NP measuring device 530 is attached to the cartridge support block 20, and accordingly it is moved with the cartridges 22 when the ECs 164 are supplied by the cartridges 22. When the testing method is started, the NP measuring device 530 is moved by the support block 20 to the component supply position. The opening defining member 556 having the passage 558 whose diameter is equal to the inner diameter of the suction pipe 162 of the suction nozzle 158 to be tested first, and the restrictor member 610 having the restrictor passage 616 whose flow area corresponds to that of the same suction pipe 162, are attached to the main frame 532 of the NP measuring device 530. The testing method may be carried out by first testing the twelve suction nozzles 158 of the sort corresponding to the opening defining member 556 and the restrictor member 610 which are currently attached to the main frame 532.

Next, the main drive servomotor 108 is started and accordingly the twelve rotary plates 70 are rotated, so that the twelve EC holder heads 120 are sequentially moved one by one to the component sucking position, in the same manner as that in which the ECs 164 are sucked up by the holder heads 120. That is, one of the six suction nozzles 158 of each holder head 120 which is positioned at the operating position is moved to the component sucking position where the one nozzle 158 is opposed to the opening of the NP measure passage 550 of the NP measuring device 530.

The EC holder head 120 is lowered by the head elevating and lowering device 260, in the same manner (e.g., same timing) as that in which the EC 164 is sucked up. During the lowering of the head 120, the solenoid-operated switch valve 179 is switched before the suction pipe 162 contacts the opening defining member 556, 50 that the negative pressure is supplied to the suction nozzle 158. The upper surface 554 of the main frame 532 attached to the support block 20 by one attaching device 480 is level with that of the cartridge frame 408 of each cartridge 22 attached to the support block 20 by another attaching device 480. Thus, the suction pipe 162 contacts the opening defining member 556 at substantially the same timing as that at which the suction pipe 162 contacts the EC 164 for sucking the same 164. Since the opening of the NP measure passage 550 in the upper surface 554 is thus covered by the suction pipe 162, the passage in the suction nozzle 158 is communicated with the NP measure passage 550 under the condition that no substantial air leakage occur between the suction pipe 162 and the opening defining member 556. Thus, a negative pressure is supplied to the NP measure passage 550.

Even after the suction pipe 162 contacts the opening defining member 556, the EC holder head 120 is further lowered by a small excessive distance, which is absorbed by compression of the compression coil spring 160. In the same manner as that in which the EC 164 is sucked up, the elevator member 428 is lowered concurrently with the lowering of the suction nozzle 158. However, at the component supply position, the NP measuring device 530 is currently positioned. Accordingly, the roller 436 attached to the elevator member 428 butts on the driven member 644 fixed to the first arm 642 of the testing driven lever 632, so as to rotate the driven lever 632 against the biasing force of the tension coil spring 650 as indicated at two-dot chain line in FIG. 10. Thus, the second arm 648 of the driven lever 632 enters the space between the light emitter and receiver 680, 682 of the position sensor 670.

The position of the position sensor 670 is so adjusted that the second arm 648 of the driven lever 632 enters the space between the light emitter and receiver 680, 682 and thereby prevents the light receiver 682 from receiving the light emitted by the light emitter 680, when a predetermined short time has passed after the suction pipe 162 contacts the opening defining member 556 and accordingly substantially the same NP as that in the suction pipe 162 is created in the NP measure passage 550. When the second arm 648 enters the space between the two sensor elements 680, 682, the position sensor 670 generates a detection signal to the control device 330, which starts reading in an output value of the NP sensor 584 periodically at a predetermined very short time interval (e.g., 5 msec). This periodic reading continues for a predetermined time duration which is measured by a timer (not shown) incorporated in the control device 330. Thus, the position of the position sensor 670 is adjusted such that the above time duration completely contains the time duration in which the suction pipe 162 contacts the opening defining member 556 such that no substantial leakage of negative pressure occurs between the pipe 162 and the member 556 and accordingly the NP in the NP measure passage 550 should be substantially equal to that in the pipe 162. In other words, the position of the position sensor 670 is adjusted for the purpose of correctly corresponding the above-indicated former time duration to the above-indicated latter time duration.

When the EC 164 is sucked up, the elevator member 428 is lowered for moving the cover member 412 backward in synchronism with the lowering of the suction nozzle 158 and the EC sucking of the same 158. In the present embodiment, this lowering of the elevator member 428 is utilized for rotating the testing driven lever 632, and the position of the position sensor 670 is adjusted for adjusting the time duration in which the sensor 670 detects the driven lever 632. Thus, the control device 330 reads in the output values of the NP sensor 584 during the time duration in which the suction pipe 162 contacts the opening defining member 556 so that the opening of the pipe 162 is covered by the opening defining member 556 and accordingly the NP in the NP measure passage 550 is substantially equal to that in the pipe 162. This time duration corresponds to the time duration in which the suction nozzle 158 sucks up the EC 164 carried on the carrier tape 400 in the case where the EC 164 is sucked up for being mounted on the PCB 38.

When the EC 164 is sucked up, the EC holder head 120 is further lowered by a small distance after the EC suction nozzle 158 contacts the EC 164, and remains in its lower dead position until the cover member 412 is moved away from above the EC 164. That is, there is a time duration after the nozzle 158 contacts the EC 164 and before the EC 164 is picked up from the EC accommodating pocket of the EC holder tape. Therefore, when the testing method is carried out, there is also a time duration after the contacting of the nozzle 158 with the opening defining member 556 (corresponding to the contacting of the nozzle 158 with the EC 164) so that the pipe 162 is communicated with the NP measure passage 550 and before the moving of the pipe 162 away from the defining member 556 (corresponding to the sucking up of the EC 164 as a result of the moving up of the nozzle 158) so that the NP measure passage 550 is freed from the NP applied by the pipe 162. During a time period not longer than this time duration, the control device 330 can iteratively read in the output values of the NP sensor 584.

The control device 330 stores, in the RAM 336, the smallest value of the iteratively read in output values of the NP sensor 584, data indicative of the sort of the suction nozzle 158 from which the NP value has been obtained, data indicative of the EC holder head 120 having the suction nozzle 158, and data indicative of which has been used with the main frame 532, the corresponding restrictor member 610 or the blind plug. After the suction pipe 162 has been held in contact with the opening defining member 556 for the time duration, the EC holder head 120 is elevated at the same timing as that at which the head 120 is elevated when the EC 164 is sucked up, and the rotation of the rotary plate 70 is resumed. After the suction pipe 162 is moved away from the NP measure passage 550, the solenoid-operated switch valve 179 is switched to the position in which the suction nozzle 158 is communicated with the atmosphere.

When the testing method is carried out, only the solenoid-operated switch valve 179 of the switching device 178 which is associated with one of the twelve EC holder heads 120 which is stopped at the component sucking position to one of the six EC suction nozzles 158 of that one EC holder head 120 which is positioned at the operating position (hereinafter, referred to as the "operative" EC suction nozzle 158) is switched to supply the NP (negative pressure), and the respective operative suction nozzles 158 of the other holder heads 120 are communicated with the atmosphere. When the ECs 164 are mounted on the PCB 38, half the respective operative suction nozzles 158 of the twelve holder heads 120 each carrying the EC 164 are present on the route between the component sucking position and the component mounting position, as shown in FIG. 5. Those operative suction nozzles 158 are communicated with the vacuum source 181 and are supplied with the NP. However, when the testing method is performed, every suction nozzle 158 does not carry an EC 164, and the opening of every suction pipe 162 is not covered. Accordingly, even if the NP is supplied to any suction nozzle 158 to be tested, no appropriate NP is created in the nozzle 158. Therefore, when the testing method is carried out, only the operative suction nozzle 158 of the holder head 120 which is stopped at the component sucking position to be tested is communicated with the vacuum source 181 and is supplied with the NP.

The elevator member 428 is elevated at the same timing as that at which the EC 164 is sucked up, and the testing driven lever 632 is rotated by the biasing force of the tension coil spring 650 so as to be returned to its original position as indicated at solid line in FIG. 10. Thus, the driven lever 632 is ready for measuring the NP value of the operative suction nozzle 158 of the holder head 120 which is to be moved next to the component sucking position.

After an NP value is measured using the first one of the six restrictor member 610s from each of the twelve EC suction nozzles 158 of the corresponding, first sort which are held by the twelve EC holder heads 120, respectively, the main drive servomotor 108 is stopped. With the NP measuring device being positioned at the component supply position, the blind plug is attached to the main frame 532, in place of the first restrictor member 610. After this attachment, the servomotor 108 is started, and an NP value is measured from each of the same twelve EC suction nozzles 158 of the first sort. When the restrictor member 610 is used, air leakage is permitted through the restrictor passage 616. However, when the blind plug is used, no substantial air leakage is permitted.

After the above NP measurements using the blind plug, an NP value is measured from each of the twelve suction nozzles 158 of the second sort, using first the second restrictor member 610 and then the blind plug, in the same manner as described above. During a time period between NP measurements on one sort of suction nozzles 158 and those on another sort of suction nozzles 158, the NP measuring device 530 is moved with the cartridge support block 20 to a working position away from the component supply position, so that an operator replaces one sort of opening defining member 556 with another opening defining member 556 whose passage 558 has the same diameter as the inner diameter of the suction pipe 162 of each of the above another sort of suction nozzles 158. In addition, the operator replaces one sort of restrictor member 610 with another sort of restrictor member 610 whose restrictor passage 616 has the flow area corresponding to that of the suction pipe 162 of each of the above another sort of suction nozzles 158. The operator attaches the another restrictor member 610 to the adaptor 594. After the attachment, the NP measuring device 530 is moved to the component supply position for carrying out the testing method.

While the EC holder head 120 whose operative EC suction nozzle 158 have subjected to the NP measurements using first the restrictor member 610 and then the blind plug is rotated with the rotary plate 70 from the component discarding area to the component sucking position, the nozzle holder 154 is rotated to move the EC suction nozzle 158 to be tested next, to the operating position, as shown in FIG. 5. When the holder head 120 is stopped at the component sucking position, the operative suction nozzle 158 of the head holder 120 is subjected to the NP measurements using first the restrictor member 610 and then the blind plug.

After the control device 330 has thus obtained the two NP values from each of the six EC suction nozzles 158 of each of the twelve EC holder heads 120, the control device 330 judges whether each suction nozzle 158 can apply an appropriate NP. Each of the NP values stored in the RAM 336 is the smallest value of a plurality of NP values obtained in each NP measurement, as described above. Therefore, if both of one of the two NP values which has been obtained under the condition that air leakage is permitted and the other NP value obtained under the condition that air leakage is not permitted are not smaller than a prescribed threshold value, the control device 330 judges that the suction nozzle 158 from which those two NP values have been obtained is free from the problems of air leakage and clogging and accordingly applies an appropriate NP to the EC 164. The threshold value is slightly greater than the appropriate NP. After this judgment, the control device 330 controls the printer 690 to record and output the measured NP values and the judgment made based on the NP values. The NP values and the judgment are recorded with the sort of the EC suction nozzle 158, the sequential number of the EC holder head 120 carrying the suction nozzle 158, and the measurement conditions under which the NP values are obtained. In the case where the control device 330 makes a negative judgment that the EC suction nozzle 158 does not apply the appropriate NP, the operator can consider why the suction nozzle 158 does not, based on the obtained two NP values.

For example, if the NP value obtained using the blind plug is appropriate but the NP value obtained using the restrictor member 610 is not appropriate, the operator can estimate that the suction pipe 162 may suffer from clogging. In the case where clogging occurs to the suction pipe 162, an appropriate NP is created if the opening of the branch passage 580 is closed by the blind plug. However, if the restrictor member 610 is used to permit air leakage to the NP measure passage 550, no appropriate NP is produced.

In addition, if each of the two NP values is not appropriate, the operator can estimate that the suction pipe 162 may suffer from air leakage that adversely influences the practical use thereof. For example, the air leakage may result from wearing or deformation of the contact surface of the suction pipe 162 at which the pipe 162 contacts the EC 164. In this case, the pipe 162 cannot closely contact the upper surface of the opening defining member 556 around the opening of the NP measure passage 550, and air leakage occurs through a space created between the pipe 162 and the defining member 556. Accordingly, if the restrictor member 610 is used to permit air leakage to the NP measure passage 550, no appropriate NP is created in the passage 550. Even if the blind plug is used to close the opening of the branch passage 580, no appropriate NP is created, since the opening of the pipe 162 is not closed by the defining member 556 and accordingly a large amount of air leaks into the passage 550.

Furthermore, if no appropriate NP value is obtained using the blind plug from each of the six nozzles 158 of each of the twelve heads 120, the operator can estimate that the passage which commonly supplies NP to all the nozzles 158 may suffer from clogging or air leakage.

The operator can decide whether his or her estimation is correct, by, e.g., disassembling the suction nozzle 158 or the holder head 120, and may replace the suction nozzle 158 as a whole with another nozzle 158, or replace the suction pipe 162 only with another pipe 162. Otherwise, the operator may remove foreign matters clogging the pipe 162, or clean the passage which commonly supplies NP to all the nozzles 158. Subsequently, the control device 330 starts the operation for mounting the ECs 164 on the PCBs 38. Thus, the present EC mounting system is free from the problem that one or more EC suction nozzles 158 fail to suck ECs 164 because they do not apply an appropriate or sufficiently great NP to the ECs 164.

The NP measuring device 530 is equipped with the communication-state changing device 590 including the adaptor 594 via which the restrictor member 610 or the blind plug is attached to the main frame 532 of the measuring device 530. Therefore, when the receiving hole 606 of the adaptor 594 is worn out because of repeated attachment and detachment of the restrictor members 610 and the blind plug to and from the adaptor 594, the adaptor 594 only is replaced with a new adaptor 594. This is more economical than the case where the main frame 532 as a whole is replaced with a new frame 532.

As is apparent from the foregoing description, in the present embodiment, the EC suction nozzles 158 provide suction devices; the rotary plates 70 as movable members, the rollers 88, the concave globoidal cams 90*a*–90*d*, the main drive servomotor 108, the head elevating and lowering devices 260, etc. cooperate with one another to provide a suction-device moving device; the solenoid-operated switch valves 179 provide negative-pressure control devices; and a portion of the control device 330 for controlling the switch valves 179 to supply and cut negative pressure to and from the suction nozzles 158 at prescribed timings, the concave globoidal cams 90a-90d, the head elevating and lowering cams 318 of the head elevating and lowering devices 260, the cam for elevating and lowering the elevator member 428 for feeding the carrier tape 400 and taking up the cover tape 402, and a portion of the control device 330 for reading in the measured NP values based on the output signals supplied from the position sensor 584 cooperate with one another to provide a test control device. The concave globoidal cams 90*a*–90*d* and the head elevating and lowering cams 318 function not only a drive device for rotating, elevating, and lowering the suction nozzles 158 but also a control device for controlling the rotating, elevating, and lowering motions of the suction nozzles 158. The cam for elevating and lowering the elevator member 428 functions not only a drive device for driving the elevator member 428 but also a control device for controlling the elevator member 428 at a prescribed timing. The NP measuring device 530, a portion of the control device 330 for reading in the output values of the NP sensor 584 and judging whether each suction nozzle 158 applies an appropriate negative pressure, etc. cooperate with one another to provide an NP-suction testing apparatus. The main frame of the NP measuring device 532 provides a main frame of the NP-suction testing apparatus.

Referring next to FIGS. 16 to 20, there will be described a second embodiment of the present invention. The second embodiment also relates to an EC mounting system including (a) an EC transferring and mounting apparatus having construction basically similar to that of the apparatus 12 of the first embodiment shown in FIGS. 1–15, (b) an EC supply device having a construction basically similar to that of the device 14 of the first embodiment, and (c) a PCB supporting and positioning device having the same construction as that of the device 16 of the first embodiment. The following description relates to only the differences between the first and second embodiments. The same reference numerals as used in the first embodiment are used to designate the corresponding elements or parts of the second embodiment, and the description of those elements or parts will be omitted.

Figure 17:
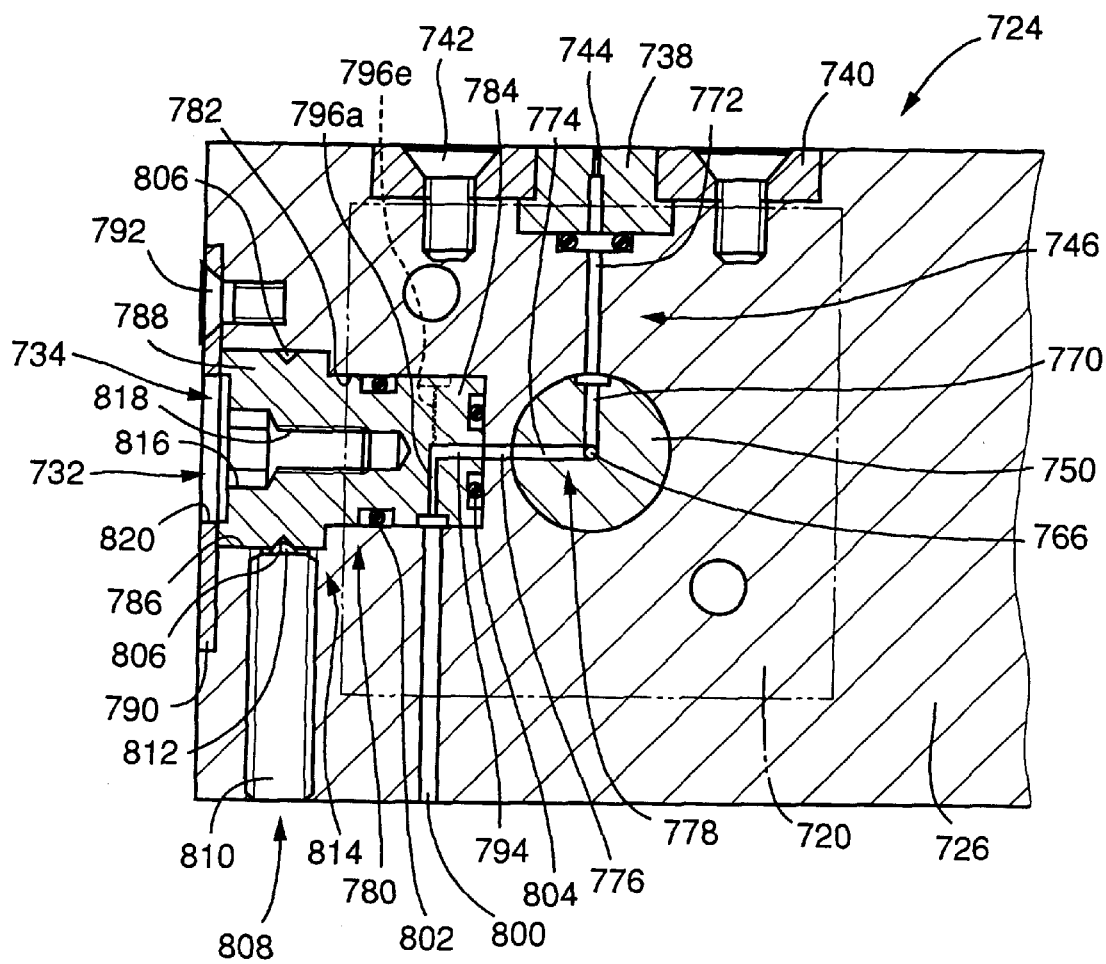
FIG. 17 is a front elevational view, in cross section, of a portion of the NP measuring device of FIG. 16 in which a switch device is provided.
Figure 18:
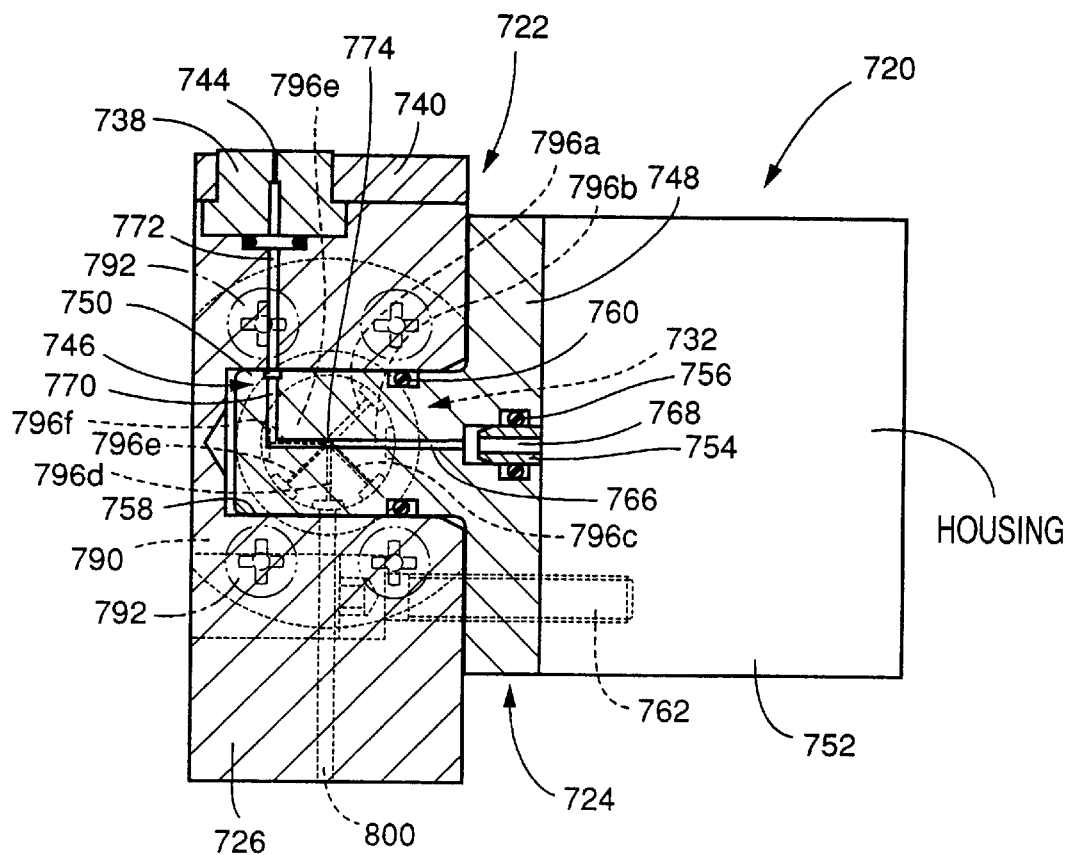
FIG. 18 is a side elevational view, partly in cross section, of a portion of the NP measuring device of FIG. 16 to which an NP sensor is attached.

In the second embodiment, as shown in FIGS. 17 and 18, a negative-pressure ("NP") sensor 720 is attached via an adaptor 722 to a main frame 726 of an NP measuring device 724 such that the sensor 720 is adjacent to the main frame 726. The NP measuring device 724 includes, in place of the communication-state changing device 590, a switch device 734 including a manually rotatable switch member 732. Like the NP measuring device 530 of the first embodiment, the NP measuring device 724 is attached to the cartridge support block 20 by the attaching device 480, and is equipped with the testing driven lever 632 and the position sensor 670.

Like the first embodiment, an opening defining member 738 is attached to the main frame 726 such that the defining member 738 is prevented from coming off the main frame 726 by a coming-off preventing plate 740. The defining member 738 has a central stepped passage 744 which is formed through a thickness thereof in an axial direction thereof. A small-diameter portion of the central passage 744 near an upper surface of the main frame 726 defines an opening of an NP measure passage 746. The preventing plate 740 is fixed to the main frame 726 with a plurality of screws 742 each as fixing means. In the second embodiment, too, six opening defining members 738 are employed which have central passages 744 whose small-diameter portions have different diameters respectively equal to the different inner diameters of the respective suction pipes 162 of the six EC suction nozzles 158 of each EC holder head 120. When each of the six EC suction nozzles 158 is tested, one of the six defining members 738 which corresponds to the suction pipe 162 of the each nozzle 158 is attached to the main frame 726.

The adaptor 722 includes a connection portion 748, and a passage defining portion 750 which has a circular cross section and projects from the center of the connection portion 748. A connection projection 754 which projects from a housing 752 of the NP sensor 720 concentrically fits in the connection portion 748 such that airtightness is maintained by a sealing member 756 provided between the projection 754 and the connection portion 748. The passage defining portion 750 fits in the main frame 726.

The main frame 726 has a receiving hole 758 which has a bottom, opens in one side surface of the main frame 726 which is parallel to the front-rear direction of the frame 726, and extends in the widthwise direction perpendicular to the front-rear direction. The passage defining portion 750 of the adaptor 722 airtightly fits in the receiving hole 758 via a sealing member 760. The adaptor 722 and the NP sensor 720 are fixed to the main frame 726 with a plurality of bolts 762 each as fixing means.

The passage defining portion 750 of the adaptor 722 defines a passage 766 which is concentric with the defining portion 750 and is communicated with a passage 768 formed in the connection projection 754 of the NP sensor 720. Another passage 770 extends upward from an end of the passage 766 so as to be communicated with a passage 772 formed in the main frame 726. The passage 772 is communicated with the passage 744 of the opening defining member 738. The passages 744, 772, 770, 766 cooperate with one another to provide the NP measure passage 746. Another passage 774 extends frontward from midway of the passage 766, parallel to the front-rear direction of the main frame 726, and cooperates with a passage 776 (FIG. 17) formed in the main frame 726 to provide a branch passage 778.

The manually rotatable switch member 732 of the switch device 734 has a stepped shape having a circular cross section, and rotatably fits in a receiving stepped hole 780 which has a bottom and opens in the front end surface of the main frame 726 on the side of the EC transferring and mounting apparatus. The receiving hole 780 extends parallel to the front-rear direction of the main frame 726, and includes a small-diameter portion 782 in which a small-diameter portion 784 of the switch member 732 rotatably fits, and a large-diameter portion 786 in which a large-diameter portion 788 of the switch member 732 rotatably fits. With the switch member 732 fitting in the receiving hole 780, a cover member 790 is fixed to the front end surface of the main frame 726 with a plurality of screw members 792 each as fixing means, so that the switch member 732 is positioned in the axial direction thereof.

As shown in FIG. 17, the small-diameter portion 784 of the manually rotatable switch member 732 has a passage 794 which opens in an end surface of the small-diameter portion 784 and extends in the axial direction of the same 784 such that the passage 794 is concentric with the portion 784. The passage 794 is communicated with the branch passage 778 and, as shown in FIG. 18, six restrictor passages 796a, 796b, 796c, 796d, 796e, 796f extend radially from the passage 794 such that the six radial passages 796a–796f are spaced from one another about the passage 794 at a regular angular interval of 45°. However, the two passages 796f, 796a contains 90°. The six restrictor passages 796a–796f have different diameters, respectively, and open in an outer circumferential surface of the small-diameter portion 784. Thus, the six restrictor passages 796a–796f have different flow areas corresponding to the different flow areas of the respective suction pipes 162 of the six suction nozzles 158 of each of the EC head holders 120, like the first embodiment.

The main frame 726 has a release passage 800 which extends perpendicularly to the axis line of rotation of the manually rotatable switch member 732, and is located in a plane containing the six restrictor passages 796a–796f, and connects between the small-diameter portion 782 and the atmosphere. In the state in which one of the six restrictor passages 796a–796f is aligned with the release passage 800, the branch passage 778 is communicated with the atmosphere via the one restrictor passage 796. Reference numerals 802, 804 designate sealing members, respectively.

Eight positioning notches 806 are formed in an outer circumferential surface of the large-diameter portion 788 of the manually rotatable switch member 732, such that the eight notches 806 are equi-angularly spaced from one another, and a positioning unit 808 is attached to the main frame 726. The positioning notches 806 and the positioning unit 808 cooperate with each other to provide a positioning device as a sort of clip-stop device. The positioning unit 808 is provided by so-called a ball spring which includes (a) a casing 810, as positioning-member holding means, which is screwed into the main frame 726 in a vertical direction perpendicular to the axis line of rotation of the switch member 732, (b) a ball 812 which fits in the casing 810 such that the ball 812 is movable in the axial direction of the casing 810 and cannot come off the casing 812, and (c) a spring (not shown), as an elastic member as a sort of biasing means, which biases the ball 812 to come out of the casing 810. When the ball 812 falls in, and engages, each of the eight notches 806, the manually rotatable switch member 732 is stably positioned at a corresponding one of (a) six communicating positions where the six restrictor passages 796a–796f communicate the branch passage 778 with the atmosphere, respectively, and (b) two disconnecting positions where the release passage 800 is closed by a passage-free portion of the small-diameter portion 784 between the restrictor passages 796a, 796f and accordingly the branch passage 778 is disconnected from the release passage 800. It can be said that the two disconnecting positions are special communicating positions at each of which a special restrictor passage whose flow area is zero is employed.

As shown in FIG. 17, the large-diameter portion 788 of the manual switch member 732 has a hexagonal engagement hole 816 as an engagement portion with which a tool is engaged by an operator. The hole 816 is concentric with the portion 788. In addition, the portion 788 has an internally threaded hole 818, as another engagement portion, which communicates with the engagement hole 816. The hole 818 is also concentric with the portion 788. The cover member 790 has a circular opening 820 through which the operator can engage the tool with the hexagonal hole 816 and rotate the switch member 732. In addition, the operator can screw an externally threaded member into the internally threaded hole 818 and then pull the threaded member in a direction away from the main frame 726, thereby removing the switch member 732 from the receiving hole 780.

The manual switch member 732 has, on an end surface thereof facing the opening 820 of the cover member 790, eight restrictor-passage indicating marks which are equi-angularly spaced from each other. On the other hand, a single communicating-position indicating mark is provided in the vicinity of the opening 820. The eight restrictor-passage indicating marks correspond to the six communicating positions and the two disconnecting positions of the manual switch member 732, respectively. The single communicating-position indicating mark is provided at a position where the single mark can be aligned with each of the eight marks when the switch member 732 is positioned at a corresponding one of the above eight positions thereof. Thus, the operator can identify which position is currently being taken by the manual switch member 732, from which restrictor-passage indicating mark is currently aligned with the single communicating-position indicating mark. Accordingly, the operator can easily rotate the switch member 732 to a desired new position thereof.

Figure 16:
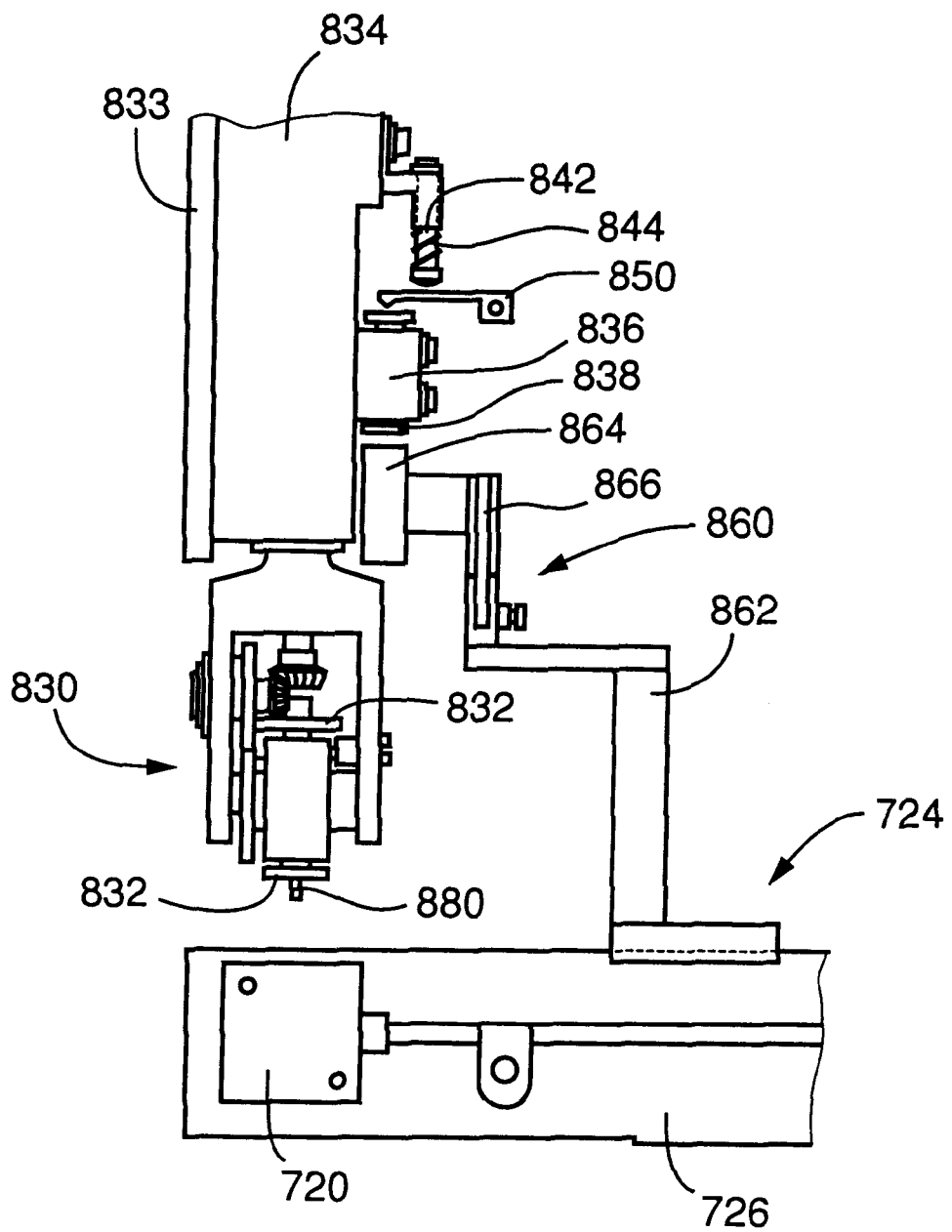
FIG. 16 is a front elevational view of a part of an NP measuring device employed in an EC transferring and mounting apparatus constructed according to another embodiment of this invention.

In the present EC mounting system as the second embodiment, the EC transferring and mounting apparatus has twelve rotary plates 70 each of which is rotated and stopped to carry an EC holder head 830, shown in FIG. 16, sequentially to the component sucking position, the image taking position, and the component mounting position. At the component sucking position, one of six EC suction nozzles 832 of the holder head 830 applies a negative pressure ("NP") to an electric component ("EC") 164 and sucks up the EC 164; and at the component mounting position the suction nozzle 832 mounts the EC 164 on a printed circuit board ("PCB") 38. The switching between the supplying of NP to the suction nozzle 832 and the communicating of the nozzle 832 with the atmosphere is performed mechanically. More specifically, as shown in FIG. 16, a bracket 834 fixed to an elevator plate 833 supported by the rotary plate 70 is equipped with a valve 836 which is mechanically operable. Although each EC holder head 830 carries six EC suction nozzles 832, only two nozzles 832 are shown in FIG. 16 as representatives of the six nozzles 832.

The switch valve 836 includes a switch member 838 which is movable in a vertical direction as an example of a direction which is normal to a circle having its center at the axis line of rotation of the EC holder head 830 or the rotary plate 70. When the switch member 838 is moved, the switch valve 836 is switched to a suction state in which the valve 836 permits NP to be supplied to one of the six suction nozzles 832 which is currently positioned at the operating position (hereinafter, referred to as the "operative" suction nozzle 158), and a release state in which the valve 836 inhibits the NP from being supplied to the operative suction nozzle 158 and communicates the nozzle 158 with the atmosphere. The switch member 838 is stably held by appropriate holding means (not shown) at its lower dead or limit position corresponding to the suction state of the switch valve 836, and at its upper dead or limit position corresponding to the release state of the switch valve 836. The switch member 838 is movable only between its upper and lower dead positions.

A switch helper member 842 for switching the switch valve 836 is provided on the bracket 834 such that the helper member 842 is movable relative to the bracket 834 in a vertical direction and is biased downward by a spring 844 as a sort of elastic member as a sort of biasing means.

At the component sucking position, there is provided a switch lever 850, as a switch operating member, which is rotatable about a horizontal axis line which is perpendicular to the axis line of rotation of the EC holder head 830 and is parallel to a straight line tangent to a locus of rotation of the switch valve 836 around the component sucking position. The switch lever 850 provides a component-sucking-position switch operating device. A free end portion of the switch lever 850 is located at a position which is between the switch helper member 842 and the switch member 838 when the EC holder head 830 is rotated to the component sucking position. When the holder head 830 is lowered by the head elevating and lowering device 260, the switch helper member 842 engages the switch lever 850, thereby rotating or pivoting the free end portion of the lever 850 downward. When the switch helper member 842 is lowered by any distance after the helper member 842 engages the switch lever 850, the free end portion of the lever 850 is lowered by a distance greater than that of the helper member 842. While the holder head 830 is lowered, the switch lever 850 engages the switch member 838, thereby lowering the switch member 838 and placing the switch valve 836 in the suction state, i.e., NP-applying state. The bracket 834 is further lowered after the switch lever 850 lowers the switch member 838 to its lower dead position. However, the excessive lowering distance of the bracket 834 is absorbed by the switch helper member 842 which is moved relative to the bracket 834 against the biasing force of the spring 844. Thus, the helper member 842 is provided on the side of the EC suction nozzles 832, and helps the switch lever 850 switch the switch valve 836.

After the operative EC suction nozzle 158 sucks up the EC 164, the elevator plate 833 and the holder head 830 start moving upward and, before this upward movement ends, those elements 833, 830 start rotating. Thus, the switch helper member 842 starts rotating while engaging the switch lever 850. Once the helper member 842 disengages from the switch lever 850, the lever 850 is returned to its original position by a spring (not shown) as a sort of biasing means.

Thus, the lever 850 is ready for entering the space between the switch helper member 842 and the switch member 838 of the holder head 830 which is next moved to the component sucking position. Although not shown, there is provided, at the component mounting position, a component-mounting-position switch operating device which moves, when the EC 164 is mounted on the PCB 38, the switch member 838 upward to switch the switch valve to the release state in which the valve 836 communicates the suction nozzle 158 with the atmosphere.

Figure 19:
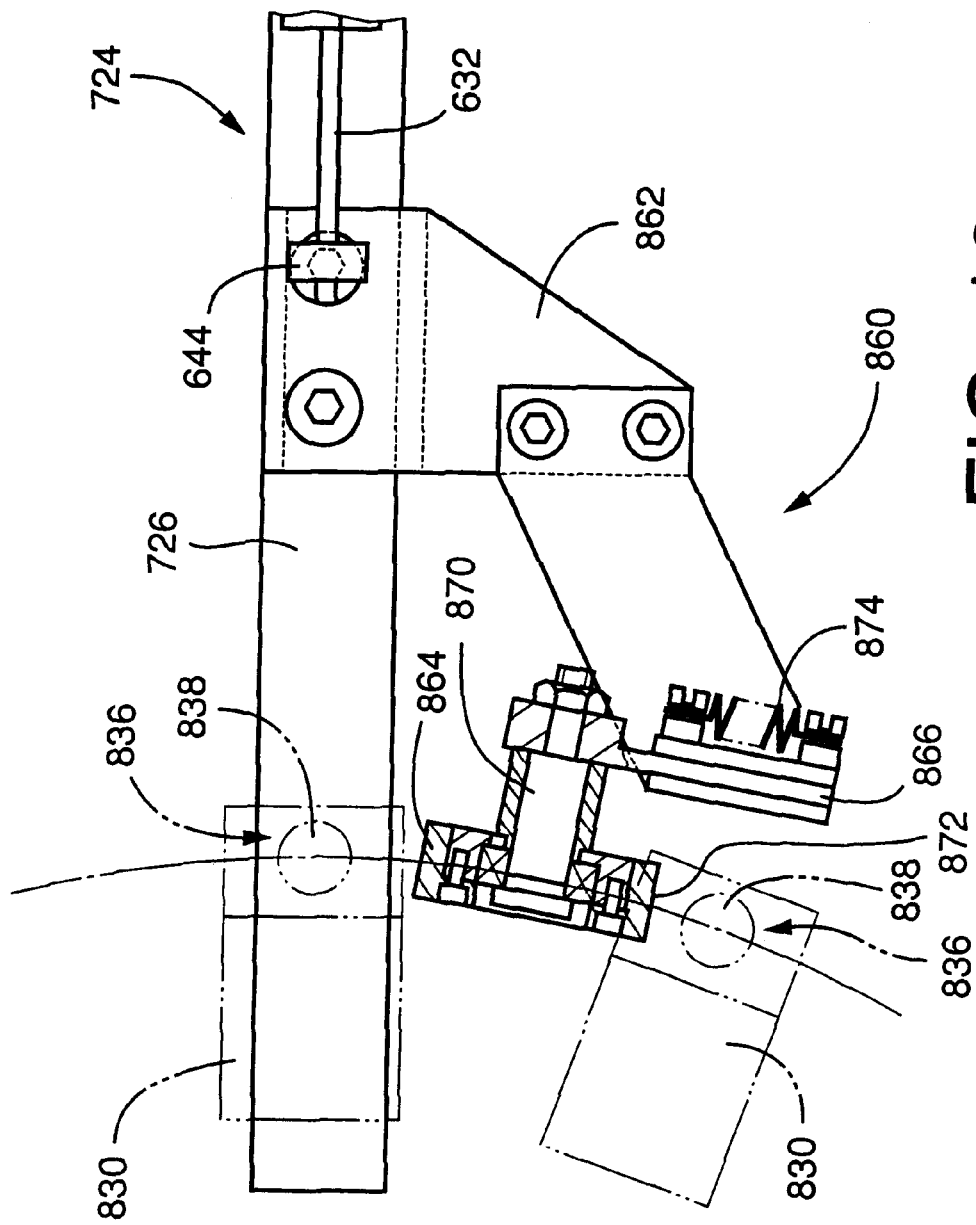
FIG. 19 is a plan view, partly in cross section, of a measuring-device-side switch operating device of the NP measuring device of FIG. 16.
Figure 20:
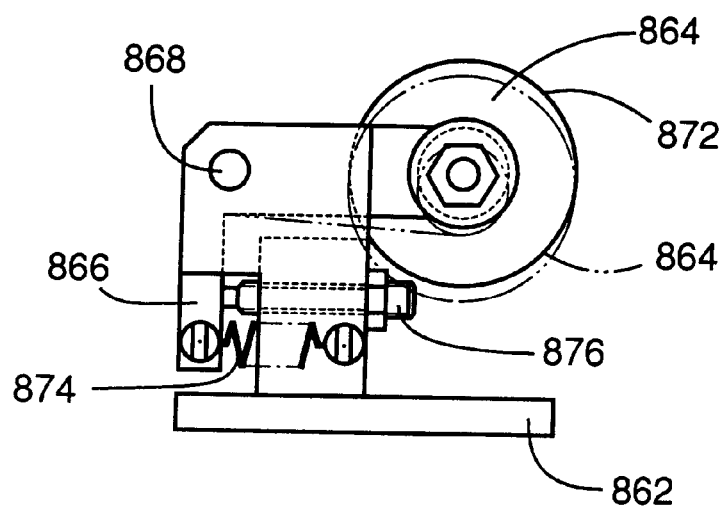
FIG. 20 is a side elevational view of a portion of the NP measuring device of FIG. 16 to which a roller is attached.

As shown in FIG. 16, the main frame 726 of the NP measuring device 724 is equipped with a measuring-device-side switch operating device 860 for switching the switch valve 836 to the release state in which the valve 836 causes the operative suction nozzle 158 to be communicated with the atmosphere. As shown in FIGS. 16 and 19, the switch operating device 860 includes a roller 864 which is attached to the main frame 726 via a bracket 862. In FIG. 19, the NP measure passage 550, the coming-off preventing plate 740, etc. of the NP measuring device 724 are not shown for easier understanding purposes only. The bracket 862 includes a horizontal portion which extends downstream from the main frame 726 in the direction of rotation of the EC holder head 830, and a vertical portion extending upward from a downstream end of the horizontal portion. As shown in FIG. 20, a plate-like holder member 866 is attached to an upper end of the vertical portion of the bracket 862 such that the holder member 866 is rotatable about an axis member 868.

As shown in FIG. 19, the roller 864 is attached to a first arm of the holder member 866 such that the roller 864 is rotatable about an axis member 870. An outer circumferential surface of the roller 864 provides an operative surface 872. With the NP measuring device 724 being positioned at the component supply position, the roller 864 is located at a position which is between the component sucking position and the stop position next to the sucking position in the direction of rotation of the holder head 830 and which is aligned with the locus of rotation of the switch member 838 of the switch valve 836 (indicated at one-dot chain line in FIG. 19) in a direction perpendicular to the axis line of rotation of the holder head 830. The axis member 870 extends perpendicularly to the direction tangent to the locus of rotation of the switch valve 836 at the above-indicated position and simultaneously perpendicularly to the direction in which the switch-member 838 is movable. The axis member 868 extends parallel to the axis member 870 about which the roller 864 is rotatable.

As shown in FIG. 20, a tension coil spring 874 as a sort of elastic member as a sort of biasing means is provided between the bracket 862 and a second arm of the holder member 866, and biases the holder member 866 to rotate or move the roller 864 upward. The rotation of the holder member 866 due to the biasing force of the coil spring 874 is limited or stopped when a screw member 876 as a stopper which is screwed into the bracket 862 butts on the holder member 866. This rotation limit can be adjusted by adjusting the amount of engagement of the screw member 876 with the bracket 862. That is, the limit of upward movement of the roller 864 can be adjusted by adjusting the position of the front end of the screw member 876 relative to the bracket 862. The position of the front end of the screw member 876 is so set that when the switch valve 836 is rotated with the holder head 830, an upper end portion of the roller 864 can engage a lower end portion of the switch member 838 at its lower dead position corresponding to the suction or NP-apply state of the switch valve 836, and move the switch member 838 to its upper dead position, thereby switching the switch valve 836 to the release or atmosphere-connecting state thereof.

Like the first embodiment, the NP measuring device 724 is attached to the cartridge support block 20 to which the cartridges 22 are attached. In the second embodiments however, the measuring device 724 is attached to a downstream end of the support block 20 in the rotation direction of the holder head 830, such that the measuring device 724 is spaced away from the cartridge 22 next to the measuring device 724 by a distance which assures that when the EC suction nozzle 832 is moved upward and rotated after sucking up the EC 164 from that cartridge 22 positioned at the component supply position, the roller 864 of the measuring device 724 does not collide with the switch member 838 of the switch valve 836.

In the second embodiment, NP measurements are carried out in the same manner as that described above for the first embodiment. More specifically described, the opening defining member 738 wherein the portion of the passage 744 thereof defining the opening of the NP measure passage 746 is equal to the inner diameter of the suction pipe 880 of the EC suction nozzle 832 to be tested, is attached to the main frame 726. An NP value is measured from each of the twelve suction nozzles 832 of the first sort, in two states, i.e., one state in which the branch passage 778 is communicated with the atmosphere via the corresponding, first one of the six restrictor passages 796a–796f and the other state in which the branch passage 778 is disconnected from the atmosphere. The above first restrictor passage is selected depending upon the diameter of the suction pipe 880 of the suction nozzle 832 to be tested. The passages 796a–796f having the larger diameters are selected for the suction pipes 880 having the larger diameters.

When the testing method is carried out, the twelve EC holder heads 830 are sequentially rotated or moved to the component sucking position where each holder head 830 is moved downward and, during the downward movement, the switch valve 836 is switched to the NP-apply state, in the same manner as that in which each holder head 830 sucks up the EC 164. As a result of the downward moving of the holder head 830, the operative suction nozzle 832 contacts the opening defining member 738, so that the suction pipe 880 is communicated with the NP measure passage 746 and an NP value provided by the NP sensor 720 is read in by the control device 330 or the CPU 332. Like the first embodiment, for a predetermined time duration which is measured by a timer after the position sensor 670 first detects the testing driven lever 632, the control device 330 periodically reads in the NP values measured by the NP sensor 720 at a predetermined short time interval. Since the NP sensor 720 is attached to the main frame 726 via only the adaptor 722 fit in the main frame 726, without any additional connecting members such as a joint member, the NP measure passage 746 is very short and accordingly the same level of NP as that in the suction pipe 880 is created in the NP measure passage 746 in a very short time after the suction pipe 880 contacts the defining member 738. Thus, the control device 330 can quickly start reading in the NP values provided by the NP sensor 720.

After the NP measurement, the EC holder head 830 is moved upward and rotated. When the holder head 830 is rotated, the roller 864 of the measuring-device-side switch operating device 860 engages the switch member 838 of the switch valve 836 and, because of the action of the cylindrical or curved operative surface 872 on the switch member 838, moves the switch member 838 upward to its upper dead position corresponding to the atmosphere-connecting state of the switch valve 836. Before the switch member 838 reaches the top end of the operative surface 872 of the roller 864, the switch member 838 reaches its upper dead position so that the switch valve 836 is switched to the atmosphere-connecting state. Subsequently the roller 864 is rotated downward against the biasing action of the tension coil spring 874 so as to permit the rotation of the holder head 830. Thus, the switch member 838 is prevented from being damaged because of receiving the reaction of the roller 864 in a direction in which the switch member 838 is moved beyond its upper dead position. The switch member 838 is assuredly moved to its upper dead position corresponding to the NP-apply state of the switch valve 836. When the suction nozzle 832 is further rotated and the switch member 838 of the switch valve 836 is disengaged from the roller 864, the roller 864 is returned to its original position because of the biasing force of the tension coil spring 874.

Thus, after the NP measurement, the switch valve 836 is switched to the atmosphere-connecting state by the measuring-device-side switch operating device 860. That is, the NP is supplied to only the operative EC suction nozzle 832 of one of the twelve EC holder heads 830 which is currently being positioned at the component sucking position so as to be tested there, and is not supplied to the operative suction nozzles 832 of the holder heads 830 which are present between the component sucking position and the component mounting position and each of which is not currently holding an EC 164. Thus, no air leaks from those suction nozzles 832 which are not being tested nor holding an EC 164.

After an NP value is obtained from each of the twelve EC suction nozzles 832 of the first sort in the state in which the branch passage 778 is communicated with the atmosphere via the corresponding one of the restrictor passages 796a–796f, the NP measuring device 724 is moved with the cartridge support block 20 from the component supply position to the working position away from the supply position, so that at the working position an operator manually operates or rotates the manually rotatable switch member 732 to either one of the two atmosphere-disconnecting positions. More specifically, the operator engages a tool with the engagement hole 816 of the switch member 732 and rotates the tool so as to align the single communicating-position indicating mark with one of the eight restrictor-passage indicating mark which corresponds to one of the two atmosphere-disconnecting positions. After this operation of the switch member 732, the NP measuring device 724 is returned to the component supply position where the measuring device 724 measures an NP value from each of the twelve suction nozzles 832 of the first sort in the state in which the branch passage 778 is disconnected from the atmosphere.

After NP values are obtained from the twelve suction nozzles 832 of the first one of the six sorts, in the two states, the NP measuring device 724 is moved to the working position where the current, first opening defining member 738 is replaced by the second opening defining member corresponding to the second sort of twelve suction nozzles 832 to be tested next. In addition, the manually rotatable switch member 732 is rotated to align the single communicating-position indicating mark with one of the eight restrictor-passage indicating mark which corresponds to one of the six restrictor passages 796a–796f which corresponds to the second sort of suction nozzles 832 to be tested.

After NP values are obtained from the twelve suction nozzles 832 of each of the six sorts, in the two states, the control device 330 judges, in the same manner as that employed in the first embodiment, whether each of the twelve suction nozzles 832 of each of the six sorts can apply an appropriate NP to the EC 164. The printer 690 records and outputs the measured NP values and the judgements made based thereon. Since the suction nozzles 832 of each of the six sorts are tested using one of the six restrictor passages 796a–796f which has the diameter corresponding to the inner diameter of the suction pipes 880 of the suction nozzles 832 of the each sort, the control device 330 can make an accurate judgment about whether each suction nozzle 832 has the problem of suction-pipe clogging.

As is apparent from the foregoing description, in the second embodiment, the component-sucking-position switch operating device including the switch valve 836, the switch helper member 842, and the switch lever 850 provides an NP control device; and the head elevating and lowering cam 318 of the head elevating and lowering device 260 for elevating and lowering each of the EC holder heads 830 and thereby utilizing the switch lever 850 to switch the switch valve 836 at a predetermined timing provides a test control device.

Figure 21:
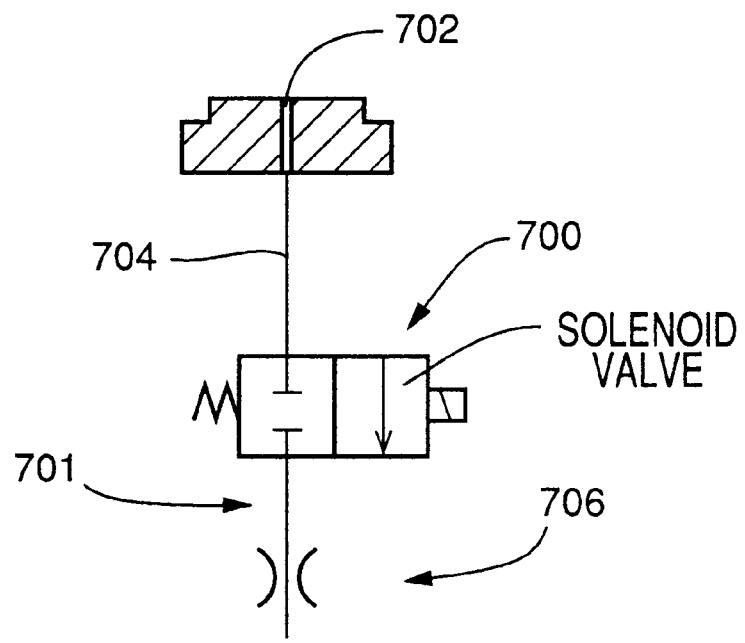
FIG. 21 is an illustrative view of a switch device of an NP measuring device employed in an EC transferring and mounting apparatus constructed according to yet another embodiment of this invention.

The NP measuring device 530, 734 employed in the first or second embodiment may be equipped with a communication-state changing device provided by a switch device 701, shown in FIG. 21, including a solenoid-operated shut-off valve 700. A restrictor 706 is provided in a branch passage 704 which is communicated with an NP (negative pressure) measure passage 702, and the solenoid valve 700 is provided between the restrictor 706 and the NP measure passage 702. When the valve 700 is closed, the branch passage 704 is disconnected from the atmosphere; and when the valve 700 is opened, the branch passage 704 is communicated with the atmosphere via the restrictor 706. An NP value is measured from each EC suction nozzle 158, 832 both in the first state in which the valve 700 is closed and no substantial air leakage to the NP measure passage 702 is permitted and in the second state in which the valve 700 is opened and the air leakage is permitted.

In each of the first and second embodiments, the opening defining members 556, 738 of the NP measuring device 530, 724 have a single passage providing the opening of the NP measure passage 550, 746, and an appropriate one of the defining members 556, 738 is selected depending upon the inner diameter of the suction pipes 162, 880 to be tested.

Figure 22:
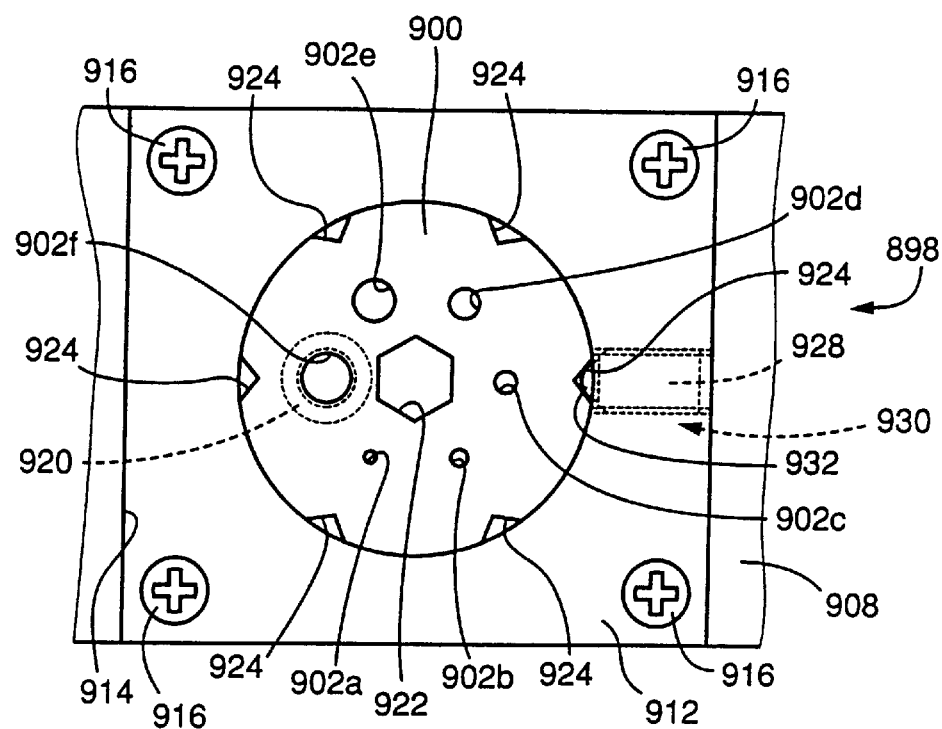
FIG. 22 is an illustrative plan view of an opening defining member of an NP measuring device employed in an EC transferring and mounting apparatus constructed according to yet another embodiment of this invention.
Figure 23:
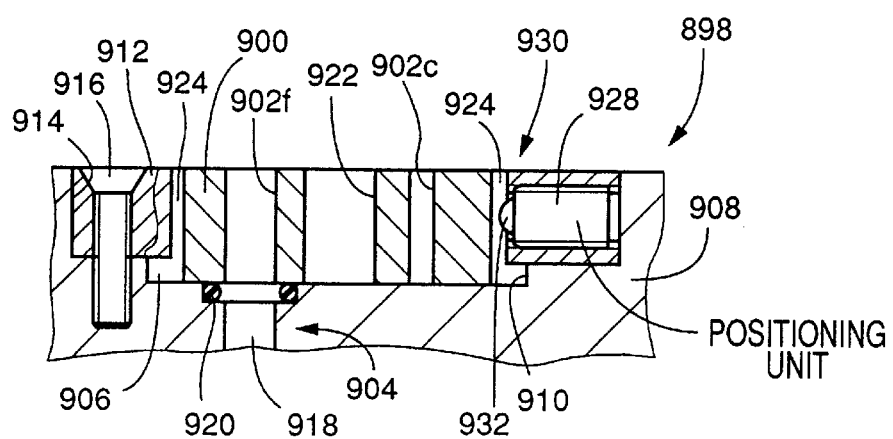
FIG. 23 is a front elevational view of the opening defining member of FIG. 22 and a portion of the NP measuring device around the opening defining member.

However, the NP measuring device 530, 724 may be replaced by an NP measuring device 898, shown in FIGS. 22 and 23, which employs a single opening-defining member 900 which has six passages 902a, 902b, 902c, 902d, 902e, 902f having different diameters equal to the different inner diameters of the six suction pipes 612, 880 of the six suction nozzles 158, 832 of each EC holder head 120, 830, respectively. In this case, the defining member 900 is rotated to position selectively one of the six passages 902a–902f at an operating position where the selected one passage provides the opening of an NP measure passage 904.

The opening defining member 900 has a circular cross section, and includes a large-diameter portion 906 at one of axially opposite ends thereof. The large-diameter portion 906 fits in a receiving hole 910 formed in a main frame 908 of the NP measuring device 898. A coming-off preventing plate 912 as a coming-off preventing member fits on the opening defining member 900 and simultaneously fits in a receiving groove 914 formed in the main frame 908, and is fixed to the main frame 908 with a plurality of screw members 916 each as a sort of fixing means. Thus, the defining member 900 is attached to the main frame 908 such that the defining member 900 can be rotated about an axis line and cannot come off the main frame 908.

The opening defining member 900 has the six passages 902a–902f on a circle having its center at the axis line of rotation of the defining member 900, such that the six passages 902a–902f are equiangularly spaced from one another about the axis line and are formed through a thickness of the defining member 900 in a direction parallel to the axis line. The defining member 900 fits in the main frame 908 such that the defining member 900 is rotatable about the axis line, and the main frame 908 has a passage 918 which provides the NP measure passage 904 and which is aligned with the circle on which the passages 902a–902f of the defining member 900 fitting in the main frame 908 are provided. The passage 918 has a diameter equal to the greatest one of the different inner diameters of the six suction pipes 612, 880 of each holder head 120, 830. A sealing member 920 is provided between the opening defining member 900 fitting in the receiving hole 910, and the passage 918 of the main frame 908, for keeping airtightness of the NP measure passage 904. The opening defining member 900 has, at its center, an engagement hole 922 with which a tool is engaged by an operator.

Additionally, the opening defining member 900 has six notches 924 each as a positioning recess which open in an outer circumferential surface of the member 900 and are formed through the thickness of the member 900 in the axial direction of the same 900, i.e., parallel to the passages 902a–902f. The six notches 924 are equiangularly spaced from one other about the axis line of rotation of the member 900. The coming-off preventing plate 912 supports a positioning unit 928 which cooperates with the notches 924 to provide a positioning device 930. The positioning unit 928 has a construction similar to that of the positioning unit 808 employed in the second embodiment for positioning the manually rotatable switch member 732. This unit 928 is supported by the plate 912 such that the unit 928 extends in a direction perpendicular to the axis line of rotation of the defining member 900. The unit 928 includes a ball 932 as a positioning member which is biased by a spring (not shown) as a sort of biasing means in a direction in which the ball 932 engages the defining member 900. With the ball 932 engaging a selected one of the six notches 924, the defining member 900 is stably positioned at a corresponding one of six stop positions where a corresponding one of the six passages 902a–902f is positioned at the operating position where the one passage is communicated with the passage 918 to define the opening of the NP measure passage 904.

When one sort of twelve suction nozzles 158, 832 have been tested and another sort of twelve suction nozzles 158, 832 are to be tested next, the NP measuring device 898 is moved from the component supply position to the working position away from the supply position, so that at the working position an operator engages a tool with the engagement hole 922 of the opening defining member 900 and rotates the member 900 to position a desired one of the six passages 902a–902f to the operating position. While identifying which one of the passages 902a–902f is currently positioned at the operating position, the operator can rotate the defining member 900 so that the member 900 is positioned by the positioning device 930 at one of the stop positions which corresponds to the passage 902a–902f desired by him or her to define the opening of the NP measure passage 904.

While the presently preferred embodiments of the present invention have been described above in detail, it is to be understood that the invention is not limited to the details of the illustrated embodiments, but may be otherwise embodied.

Although in the first embodiment an NP value is measured from each of the EC suction nozzles 158, 830 both in the state in which the blind plug is attached and in the state in which the restrictor member 610 is attached, the testing method may be carried out in a different manner. For example, first, an NP value is measured from each of the suction nozzles of one sort in the state in which the restrictor member 610 corresponding to that sort is attached, and subsequently an NP value is measured from only one or more nozzles from which no normal NP value has been obtained, in the state in which the blind plug is attached. This may apply to the embodiment in which the manually rotatable switch member 732 is employed.

Otherwise, an NP value may be measured from only one or more EC suction nozzles 158, 832 which have failed to suck up an EC 164 while the EC transferring and mounting apparatus operates for mounting the ECs 164 on the PCBs 38. The control device 330 can judge whether each suction nozzle 158, 832 has failed to suck up an EC 164, based on the image of the posture of the EC 164 (or the absence of the same 164) held by the suction nozzle which has been taken by the CCD camera 114 at the image taking position.

While in the illustrated embodiments the six restrictor passages 616, 796 (796a–796f) are employed which have different diameters (or flow areas) corresponding to the different diameters (or flow areas) of the six suction pipes 162, 880 of the six EC suction nozzles 158, 832 of each of the EC holder heads 120, 830, it is not essentially required that an exclusive restrictor passage be used for testing each of the six suction pipes 162, 880 or the six suction nozzles 158, 832. A single restrictor passage may be used commonly for testing two or more sorts of suction nozzles. For example, two or three restrictor passages are employed for testing the six suction nozzles 158, 832. In the case where a single restrictor passage is used commonly for testing several sorts of suction nozzles, a very small clogging may not be detected from every suction nozzle. However, since usually there is a great difference between the greatest NP that is a normal NP supplied to each suction nozzle and the smallest NP with which each suction nozzle can suck up an EC 164, it is possible to detect a clogging of each suction nozzle which results in reducing the NP applied thereby to an EC 164 in an NP range in which each suction nozzle can suck up the EC 164.

In the second embodiment, an NP value may be measured from each of the plurality of EC suction nozzles 832 while the manually rotatable switch member 732 is sequentially positioned at each of the plurality of communication positions. That is, the plurality of NP values are obtained from each of the suction nozzles. For example, an NP value may be measured in advance from each of a plurality of EC suction nozzles 832 each of which is free from clogging, while the manually rotatable switch member 732 is sequentially positioned at each of the plurality of communication positions. Based on the test results, an operator can select an appropriate restrictor passage for testing each sort of suction nozzle. Otherwise, an NP value may be measured in advance from each of a plurality of EC suction nozzles 832 which have different degrees of clogging, respectively, while the manually rotatable switch member 732 is sequentially positioned at each of the plurality of communication positions. Based on the test results, an operator can select an appropriate restrictor passage for testing a suction nozzle with respect to each degree of clogging. In addition, based on the above first test results, an operator can obtain data about what degree of air leakage is permitted for each of the suction nozzles 832.

This is also the case with the first embodiment in which the branch passage 580 is communicated with the atmosphere via the restrictor member 610. That is, an NP value is measured from each of the suction nozzles 158 while each of several restrictor members 610 is sequentially employed.

While in the illustrated embodiments the flow area of the restrictor passage is changed stepwise by selecting one of the restrictor passages having different flow areas, respectively, it is possible to employ a metering valve whose flow area can be continuously changed. In this case, the flow area of the metering valve is changed depending upon the flow area of the suction pipe to be tested. The metering valve includes a valve member whose cross section continuously changes, and accordingly the flow area of the metering valve can be changed by moving the valve member relative to a valve hole in an axial direction. The valve member may be moved either automatically or manually.

In the illustrated embodiments, the six opening defining members 556, 738 are employed which have the respective passages having the different diameters equal to the different diameters of the six suction pipes 162, 880 of the six EC suction nozzles 158, 832, respectively, or the single opening defining member 900 is employed which has the six restrictor passages 902a–902f. One of the defining members 556, 738 is selected which defines the opening of the NP measure passage 550, 746 whose diameter equal to the inner diameter of the suction pipes 162, 880, or the defining member 900 is rotated to select one of the restrictor passages 902a–902f which defines the opening of the NP measure passage 904 whose diameter equal to the inner diameter of the suction pipes 162, 880. However, it is not essentially required that the diameter of the opening of the NP measure passage be changed to be equal to the inner diameter of every sort of suction nozzle. That is, one diameter of the opening of the NP measure passage may be employed for testing several sorts of suction pipes. For example, the smallest diameter of the opening of the NP measure passage may be employed commonly for testing several sorts of suction pipes having the smallest inner diameter, the second smallest inner diameter, . . . , so on. The smallest diameter of the opening is not the most appropriate for one of the several sorts of suction pipes which has the greatest inner diameter. However, NP measurements can be carried out on that one suction pipe.

Although in the illustrated embodiments the control device 330 judges whether each suction nozzle 158, 832 applies an appropriate NP by comparing the smallest one of NP values iteratively read in during a predetermined period, with a reference value, it is possible to modify the control device 330 to do so by starting a predetermined number of NP readings from a predetermined timing and utilizing the thus obtained NP values. For example, the smallest one, or an average, of the obtained NP values may be compared with a reference value. The average may be the average of all the obtained NP values, or the average of the obtained NP values except for the greatest and smallest NP values.

While in the illustrated embodiments the changing of one opening defining member 556, 738 with another one, the rotating of the single opening defining member 900, or the rotating of the manually rotatable switch member 732 is performed at the working position away from the component supplying position, one or more of those operations may be performed at a different position, such as the component supplying position. In the last case, the NP measuring device 530, 724, 898 should be prevented from being moved out of position from the component supplying position while those operations are performed.

The communication-state changing device as a leakage control device may be omitted. For example, in the case where it is not needed to identify which is the cause of excessively low NP in each EC suction nozzle 158, 832, air leakage or clogging, an NP value is measured from the suction nozzle only in the state in which air leakage is permitted via the restrictor passage. That is, it is not needed to disconnect the branch passage from the atmosphere. On the other hand, in the case where it is not needed to identify whether clogging has caused excessively low NP, an NP value is measured only in the state in which the branch passage is disconnected from the atmosphere.

In addition, it is not essentially required to change the restrictor passages each of which permits air leakage, even in the case where several sorts of EC suction nozzles are tested. Even in the case where only a single restrictor passage is employed, the control device 330 can judge whether each suction nozzle suffers from an impermissible clogging, by employing different threshold values corresponding to the different sorts of the suction nozzles.

Employing different threshold values may be done also in the case where a single restrictor passage is used commonly for testing two or three sorts of suction nozzles. Furthermore, even in the case where an exclusive restrictor passage is used for each one sort of suction nozzle or nozzles, the control device 330 can accurately judge whether a predetermined degree of clogging has occurred to each suction nozzle, by employing different threshold values, if the restrictor passage cannot provide a prescribed air restricting effect.

Moreover, there are some cases where it is preferred to employ different threshold values for the NP measurements in which air leakage is permitted and the NP measurements in which the air leakage is not permitted, respectively.

While in the illustrated embodiments the NP measurements are carried out before the EC transferring and mounting apparatus starts mounting the ECs 164 on the PCBs 38, it is possible to carry out the NP measurements just after the EC transferring and mounting apparatus has finished mounting the ECs 164 on the PCBs 38. When the EC transferring and mounting apparatus finishes mounting the ECs 164, one of the plurality of cartridges 22 attached to the cartridge support block 20 which is the most upstream one in the direction of movement of the support block 20 and is adjacent to the NP measuring device 530, 724, 898, may have been positioned at the component supplying position. In this case, if the NP measuring device has been attached to the support block 20 at a position distant from the most upstream cartridge 22 by a distance equal to the regular pitch at which the cartridges 22 are attached to the support block 20, the NP measuring device may be positioned at the component supplying position by moving the support block 20 by the distance equal to the regular pitch in the same manner as that in which the ECs 164 are supplied from the cartridges 22 to the suction nozzles 158, 832. Thus, when the EC transferring and mounting apparatus finishes mounting the ECs 164 on the PCBs 38, the NP measurements may be carried out following the mounting of the ECs 164, without stopping of the operation of the main drive servomotor 108. On the other hand, in the case where the NP measuring device is attached to the support block 20 at a position distant from the most upstream cartridge 22 by a distance equal to a multiple of the regular pitch, or a distance independent of the regular pitch, the support block 20 is moved over a distance needed to position the NP measuring device at the component supplying position.

The NP measuring device 530, 724, 898 may be detached from the cartridge support block 20 as an EC supply table, before the EC mounting system starts mounting the ECs 164 on the PCBs 38, and may be attached to the support block 20 after the mounting of the ECs 164. The NP measuring device may be attached to any position or location on the support block 20, for example, a space between two cartridges 22, a space from which a cartridge 22 has just been detached, or an exclusive space for the NP measuring device. In the case where the NP measuring device is attached to a space or position where a cartridge 22 can be attached, an operator input data indicative of the space or position into the control device 330, which operates for moving, based on the input data, the support block 20 so that the NP measuring device is positioned at the component supplying position. In the last case, the NP measuring device is detached from the support table 20 after the NP measurements are carried out.

The present invention is not limited to the EC transferring apparatus which sucks up the ECs 164 from the embossed-type carrier tape 400, but may be applicable to other sorts of EC transferring apparatus which sucks up ECs from a paper-type carrier tape which includes (a) a paper-based EC holder tape having a plurality of through-holes which are formed through the thickness of the holder tape and are arranged, in an array, at a regular interval of distance, (b) a bottom tape which is adhered to a bottom surface of the holder tape to close respective bottom openings of the through-holes and thereby provide a plurality of EC holder pockets in which ECs are accommodated, respectively, and (c) a cover tape which is adhered to the top surface of the holder tape to respective top openings of the holder pockets. Paper-type carrier tapes which have different heights corresponding to the different heights of ECs accommodated therein are fed on a main or base frame of a cartridge such that the respective upper surfaces of those paper-type carrier tapes take different heights on the base frame.

The respective suction pipes 162, 880 of the six EC suction nozzles 158, 832 of each EC holder head 120, 830 may have different lengths, respectively, as measured from the axis line of rotation of the head holder 154. In the case where the elevating and lowering stroke of each holder head 120, 830 is adjusted depending upon the sort of the suction nozzle positioned at the operating position and/or the height of the upper surface of the EC carrier tape in use, the stroke may be adjusted also when the NP measurements are carried out. The position of the stopper 654 and/or the position sensor 679 may be adjusted as needed.

The present invention is also applicable to various sorts of EC transferring apparatuses such as an apparatus including an intermittently rotatable table and at least one EC holder head supported by the table, or an apparatus which linearly moves in one direction, or in each of two directions perpendicular to each other in a plane, and thereby transfers ECs.

In particular, the present invention is applicable to the electronic component mounting systems disclosed in U.S. patent application Ser. No. 08//769,700 filed Dec. 18, 1996 the disclosure of which is incorporated herein by reference.

The present invention may be embodied with other changes, improvements, and modifications that may occur to those skilled in the art without departing from the spirit and scope of the invention defined in the appended claims.

What is claimed is:

1. An electric-component transferring apparatus having a suction testing function, comprising:
  at least one suction device which sucks and holds an electric component by a negative pressure;
  a suction-device moving device which moves the suction device;
  a negative-pressure control device which controls the negative pressure supplied to the suction device;
  a negative-pressure measuring device which measures the negative pressure of the suction device;
  a test control device which controls the suction-device moving device, the negative-pressure control device, and the negative-pressure measuring device so that the suction-device moving device moves the suction device to a position where the negative-pressure measuring device is present and the measuring device measures the negative pressure of the suction device; and
  an electric-component supply device comprising a plurality of electric-component supply cartridges each of which carries a plurality of electric components of a corresponding one of a plurality of sorts and includes a component-supply portion from which said each cartridge supplies the electric components one by one to the suction device,
  the negative-pressure measuring device including a contact portion which is contactable with the suction device and which is provided at a position corresponding to the component-supply portion of said each electric-component supply cartridge,
  the test control device comprising component-supply-dependent control means for performing at least a portion of the control of the negative-pressure measuring device based on an operation of a component-supply control device to control said each electric-component supply cartridge to supply the electric components to the suction device.

2. An apparatus according to claim 1, comprising a plurality of said suction devices, and further comprising an output device which outputs respective negative pressure values measured by the negative-pressure measuring device from the plurality of suction devices, such that each of the measured negative pressure values is related to a corresponding one of the suction devices.

3. An apparatus according to claim 1, wherein the negative-pressure measuring device comprises a base frame; a negative-pressure measure passage which is formed in the base frame and has an opening in an outer surface of the base frame; and a negative-pressure sensor which measures a negative pressure in the measure passage.

4. An apparatus according to claim 3, wherein the base frame comprises a main frame member; and an opening-defining member which defines the opening of the negative-pressure measure passage and a portion of the measure passage which is contiguous with the opening, the opening-defining member being produced independent of the main frame member and detachably attached to the main frame member.

5. An apparatus according to claim 3, wherein the negative-pressure sensor is fixed to the base frame in a state in which the sensor can measure the negative pressure in the negative-pressure measure passage.

6. An apparatus according to claim 5, wherein the negative-pressure sensor is airtightly fit in the base frame via an adaptor including a portion which defines at least a portion of the negative-pressure measure passage.

7. An apparatus according to claim 5, wherein the negative-pressure sensor comprises a housing including a portion which is airtightly fit in the base frame and which defines at least a portion of the negative-pressure measure passage.

8. An apparatus according to claim 1, wherein the component-supply-dependent control means comprises reading control means for performing reading of the negative pressure value measured by the negative-pressure measuring device, based on the operation of the component-supply control device.

9. An apparatus according to claim 1, wherein said each electric-component supply cartridge comprises at least one of (a) a carrier-tape feeding device which feeds, at a predetermined feeding pitch, a carrier tape including a holder tape having a plurality of holder pockets which are arranged, in an array, at a predetermined interval of distance and each of which accommodates an electric component, and a cover tape which covers respective openings of the holder pockets of the holder tape, and (b) a cover-tape peeling device which peels the cover tape from the holder tape of the carrier tape, and wherein the component-supply-dependent control means comprises at least one of (c) feeding-dependent control means for performing at least a portion of the control of the negative-pressure measuring device based on the operation of the carrier-tape feeding device and (d) peeling-dependent control means for performing at least a portion of the control of the negative-pressure measuring device based on the operation of the cover-tape peeling device.

10. An apparatus according to claim 9, wherein said each electric-component supply cartridge further comprises a supply driven member associated with said at least one of the carrier-tape feeding device and the cover-tape peeling device, each of the respective supply driven members of the cartridges being driven by a common drive member which is separate from the cartridges, so that the corresponding carrier tape is fed or the corresponding cover tape is peeled, and wherein the negative-pressure measuring device comprises a test driven member corresponding to the supply driven member of said each cartridge, and said at least one of the feeding-dependent control means and the peeling-dependent control means comprises a test-driven-member-operation sensor which detects an operation of the test driven member.

11. An apparatus according to claim 10, wherein the test-driven-member-operation sensor comprises a position sensor which identifies that the test driven member is operated to a predetermined position; and a position adjuster for adjusting a relative position between the position sensor and the test driven member.

12. An apparatus according to claim 1, wherein the test control device comprises component-supply-dependent negative-pressure control means for performing at least a portion of the control over the negative-pressure control device, based on the operation of the component-supply control device to control said each electric-component supply cartridge to supply the electric components to the suction device.

13. An apparatus according to claim 1, wherein the electric-component supply device further comprises a table which supports the electric-component supply cartridges such that the respective component-supply portions of the cartridges are arranged along a line; and a selecting device which moves at least one of the suction device and the table relative to the other thereof so that the suction device is opposed to the component-supply portion of a selected one of the cartridges, and wherein the negative-pressure measuring device comprises a base frame which is attachable to the table by an attaching device which is usable to attach at least one of the cartridges to the table, the base frame including the contact portion which is contactable with the suction device and which is provided at the position corresponding to the component-supply portion of said each cartridge.

14. An apparatus according to claim 13, wherein the selecting device comprises a table moving device which moves the table along said line and positions the component-supply portion of the selected cartridge at a component supplying position where the component-supply portion of the selected cartridge is opposed to the suction device, the table moving device moving the negative-pressure measuring device to the component supplying position where the contact portion of the base frame of the measuring device is opposed to the suction device for measuring the negative pressure of the suction device.

15. An apparatus according to claim 13, wherein said each cartridge comprises a base frame which corresponds to the base frame of the negative-pressure measuring device and which is attachable to the table by the attaching device which is usable to attach the base frame of the negative-pressure measuring device to the table, the base frame of the negative-pressure measuring device having a negative-pressure measure passage which opens in a portion thereof corresponding to the component-supply portion of the base frame of said each cartridge, the contact portion comprising said portion around the opening of the measure passage.

16. An apparatus according to claim 13, wherein the suction-device moving device comprises a suction-device rotating device which rotates a plurality of said suction devices about a common axis line and sequentially positions each of the suction devices at a component receiving position above the component-supply portion of the selected cartridge, the suction-device rotating device sequentially positioning said each suction device at the component receiving position above the contact portion of the base frame of the negative-pressure measuring device, for measuring the negative pressure of said each suction device.

17. An apparatus according to claim 16, wherein the suction-device moving device comprises a suction-device lowering device which lowers said each suction device positioned at the component receiving position toward the component-supply portion of the selected cartridge, in a direction parallel to the axis line of rotation of said each suction device, the suction-device lowering device lowering said each suction device positioned at the component receiving position toward the contact portion of the base frame of the negative-pressure measuring device, so as to contact the contact surface and thereby measure the negative pressure of said each suction device.

18. An apparatus according to claim 16, wherein the suction-device moving device comprises a plurality of rotary heads each of which can hold a plurality of said suction devices and is rotatable about an axis line to position a selected one of the suction devices at an operating position, and wherein the suction-device rotating device rotates said each rotary head about the axis line and sequentially positions said each rotary head at the component receiving position where the selected suction device positioned at the operating position in said each rotary head is opposed to the component-supply portion of the selected cartridge at the component supplying position, the suction-device rotating device rotating said each rotary head and sequentially positioning said each rotary head at the component receiving position where the selected suction device positioned at the operating position in said each rotary head is opposed to the contact portion of the base frame of the negative-pressure measuring device, for measuring the negative pressure of the selected suction device.

19. An apparatus according to claim 1, wherein the negative-pressure measuring device comprises a negative-pressure measure passage which is communicated with the suction device at least when the measuring device measures the negative pressure of the suction device; and a leakage control device which is selectively operable in a leakage-permitting state in which the control device permits air leakage to the negative-pressure measure passage and a leakage-inhibiting state in which the control device substantially inhibits the air leakage.

20. An electric-component transferring apparatus having a suction testing function, comprising:

a plurality of suction devices each of which sucks and holds an electric component by a negative pressure;

a suction-device moving device which moves each of the suction devices;

a negative-pressure control device which controls the negative pressure supplied to said each suction device;

a negative-pressure measuring device which measures the negative pressure of said each suction device, the negative-pressure measuring device comprising a base frame, a negative-pressure measure passage which is formed in the base frame and has an opening in an outer surface of the base frame, and a negative-pressure sensor which is connected to the negative-pressure measure passage and measures a negative pressure in said measure passage;

a test control device which controls the suction-device moving device, the negative-pressure control device, and the negative-pressure measuring device so that the suction-device moving device moves said each suction device relative to the measuring device to a position where said each suction device is contacted with the outer surface of the base frame of the measuring device and is communicated with the negative-pressure measure passage thereof and the negative-pressure sensor measures the negative pressure of said each suction device by measuring the negative pressure in said measure passage; and an output device which outputs respective negative pressure values measured by the negative-pressure measuring device from the plurality of suction devices, such that each of the measured negative pressure values is related to a corresponding one of the suction devices.

21. An apparatus according to claim 20, wherein the negative-pressure control device comprises a negative-pressure-supply switch device which is switchable to a supply state in which the switch device permits the negative pressure to be supplied to each of the plurality of suction devices and to a non-supply state in which the switch device inhibits the negative pressure from being supplied to said each suction device.

22. An apparatus according to claim 21, wherein the negative-pressure-supply switch device comprises a plurality of switch valves each of which is movable with a corresponding one of the plurality of suction devices and includes a switch member which is mechanically movable to a first position corresponding to a supply state of said each switch valve in which said each switch valve permits the negative pressure to be supplied to said one suction device and to a second position corresponding to a non-supply state of said each switch valve in which said each switch valve inhibits the negative pressure from being supplied to said one suction device; and a component-receiving-position switch operating device which is provided at a component receiving position and which switches said each switch valve to the supply state thereof, and wherein the negative-pressure measuring device comprises a measuring-device-side switch operating device which switches said each switch valve which has been passed through the component receiving position, to the non-supply state thereof.

23. An apparatus according to claim 22, wherein the switch member of said each switch valve is movable in a direction intersecting a circle having a center at an axis line about which each of the suction devices is rotatable, and wherein the measuring-device-side switch operating device comprises a base frame and a switch-member drive member which is attached to the base frame and which has an operative surface having such a shape that a more downstream portion of the operative surface in a direction in which said each suction device is rotated is nearer to the switch member in the direction in which the switch member is moved, the switch-member drive member being engageable with the switch member to switch said each switch valve to the non-supply state thereof.

24. An apparatus according to claim 23, wherein the switch-member drive member comprises a roller which is rotatable about an axis line which is perpendicular to a direction tangent to a locus of rotation of said each switch valve at a position where the measuring-device-side switch operating device is present and is substantially perpendicular to the direction of movement of the switch member of said each switch valve, the roller having an outer circumferential surface providing the operative surface.

25. An apparatus according to claim 23, wherein the switch-member drive member is attached to the base frame such that the drive member is movable in a direction substantially parallel to the direction of movement of the switch member of said each switch valve at a position where the measuring-device-side switch operating device is present, and wherein the measuring-device-side switch operating device further comprises a biasing device which biases the switch-member drive member toward an advanced position where the drive member is engageable with the switch member and which permits the drive member to be retracted from the advanced position after the switch member has been moved to a position beyond which the switch member is not movable.

26. An apparatus for testing a suction device which sucks and holds an electric component by a negative pressure, for evaluating the sucking function of the suction device, comprising:

a base frame which has an outer surface and a negative-pressure measure passage having an opening in said outer surface, said outer surface being contacted with the suction device, and said measure passage being communicated with the suction device, when a negative pressure in the measure passage is measured;

a negative-pressure sensor which is connected to the negative-pressure measure passage and measures the negative pressure in said measure passage; and a leakage control device which is connected to the negative-pressure measure passage and which is selectively operable in a leakage-permitting state in which the leakage control device permits an air leakage to the negative-pressure measure passage and a leakage-inhibiting state in which the leakage control device substantially inhibits the air leakage to said measure passage, the negative-pressure sensor measuring, in a measurement state in which the outer surface of the base frame is held in contact with the suction device and the negative-pressure measure passage thereof is held in communication with the suction device, a first negative pressure value in said measure passage when the leakage control device is operated in the leakage-permitting state, and measuring, in said measurement state, a second negative pressure value in said measure passage when the leakage control device is operated in the leakage-inhibiting state.

27. An apparatus according to claim 26, wherein the leakage control device comprises a communication-state changing device which is provided in a branch passage which communicates with the negative-pressure measure passage and which is selectively operable in a connecting state as the leakage-permitting state in which the changing device connects the branch passage to an external space via a restrictor passage and in a disconnecting state as the leakage-inhibiting state in which the changing device disconnects the branch passage from the external space.

28. An apparatus according to claim 27, wherein the communication-state changing device comprises a blind plug which is usable to substantially airtightly close an opening of the branch passage; and a restrictor member which is attachable to the opening of the branch passage in place of the blind plug and which has the restrictor passage having a predetermined flow area via which the branch passage is connectable to the external space.

29. An apparatus according to claim 27, wherein the communication-state changing device comprises a switch device which is switchable to the connecting state in which the switch device connects the branch passage to the external space via the restrictor passage and in the disconnecting state in which the switch device disconnects the branch passage from the external space.

30. An apparatus according to claim 29, wherein the switch device comprises a displaceable switch member which is provided at the opening of the branch passage and which is displaceable to a first position corresponding to the connecting state and to a second position corresponding to the disconnecting state.

31. An apparatus according to claim 30, wherein the displaceable switch member comprises a rotatable switch member which is attached to the base frame such that the rotatable switch member is rotatable about an axis line thereof and which has a plurality of restrictor passages having different flow areas, respectively, on a circle having a center at the axis line, the rotatable switch member being rotatable about the axis line to select one of the restrictor passages so that the selected restrictor passage connects the branch passage to the external space.

32. An apparatus according to claim 31, wherein the rotatable switch member is fit in a receiving hole formed in the base frame such that the rotatable switch member is rotatable about the axis line and communicates with the branch passage, the rotatable switch member being rotatable about the axis line to select one of the restrictor passages so that the selected restrictor passage connects the branch passage to a release passage connected to the external space.

33. An apparatus according to claim 31, wherein the rotatable switch member comprises a manually rotatable switch member which is rotatable about the axis line manually by an operator.

34. An apparatus according to claim 31, wherein the communication-state changing device further comprises a positioning device which positions the rotatable switch member at each of a plurality of communication positions where a corresponding one of the restrictor passages connects the branch passage to the external space.

35. An apparatus according to claim 34, wherein the positioning device comprises a first device including a plurality of positioning recesses which are provided on one of the base frame and the manually rotatable switch member such that the positioning recesses correspond to the restrictor passages, respectively; and a second device which is provided on the other of the base frame and the manually rotatable switch member and which cooperates with each of the positioning recesses to position, by snap action, the manually rotatable switch member at a corresponding one of the communication positions, and wherein the second device comprises a positioning member which engages said each positioning recess and thereby positions the manually rotatable switch member at the corresponding one communication position; a positioning-member holder which holds the positioning member such that the positioning member is movable to an operative position thereof where the positioning member engages said each positioning recess and to an inoperative position thereof where the positioning member does not engage said each positioning recess; and a biasing member which biases the positioning member toward the operative position.

36. An apparatus according to claim 27, wherein the negative-pressure sensor is attached to the base frame via an adaptor which is airtightly fit in the base frame and which defines at least a portion of the branch passage.

37. An apparatus according to claim 27, wherein the negative-pressure sensor comprises a housing including a portion which is airtightly fit in the base frame and which defines at least a portion of the branch passage.

38. An apparatus according to claim 26, wherein the suction device sucks up the electric components from an electric-component supply device comprising a plurality of electric-component supply cartridges each of which carries a number of electric components of a corresponding one of a plurality of sorts and has a component-supply portion from which said each cartridge supplies the electric components one by one to the suction device; and a table which supports the cartridges such that the respective component-supply portions of the cartridges are arranged along a line, and wherein the base frame is attachable to the table such that the negative-pressure measure passage opens in alignment with the straight line.

39. An apparatus according to claim 38, wherein the base frame corresponds to a base frame of said each cartridge and is attachable to the table by an attaching device which is usable to attach at least one of the cartridges to the table.

40. A method of testing a suction device which sucks and holds, by a negative pressure, an electric component supplied from an electric-component supply device, for evaluating the sucking function of the suction device, comprising the steps of:

moving at least one of the suction device and a negative-pressure measuring device which has a contact surface and a negative-pressure measure passage having an opening in said contact surface, relative to each other in a same manner as a manner in which at least one of the suction device and the electric-component supply device is moved relative to each other when the suction device is supplied with the electric component from the supply device, so as to place the suction device in a measurement state in which the suction device is held in contact with the contact surface of the negative-pressure measuring device and is held in communication with the negative-pressure measure passage thereof, measuring, in said measurement state and using the negative-pressure measuring device, a first negative pressure value in the negative-pressure measure passage in a first state in which a predetermined air leakage to the negative-pressure measure passage is permitted, and measuring a second negative pressure value in said measure passage in a second state in which the air leakage to said measure passage is not permitted, and evaluating the component sucking function of the suction device, based on the measured first and second negative pressure values.

41. An electric-component transferring apparatus having a suction testing function, comprising:

a plurality of suction devices each of which sucks and holds an electric component by a negative pressure;

a suction-device moving device which moves each of the suction devices;

a negative-pressure control device which controls the negative pressure supplied to said each suction device;

a negative-pressure measuring device which measures the negative pressure of said each suction device;

a test control device which controls the suction-device moving device, the negative-pressure control device, and the negative-pressure measuring device so that the suction-device moving device moves the suction device to a position where the negative-pressure measuring device is present and the measuring device measures the negative pressure of said each suction device, the negative-pressure measuring device comprising a base frame; a negative-pressure measure passage which is formed in the base frame and has an opening in an outer surface of the base frame; and a negative-pressure sensor which measures a negative pressure in the measure passage, the negative-pressure sensor being fixed to the base frame in a state in which the sensor can measure the negative pressure in the negative-pressure measure passage, the negative-pressure sensor being airtightly fit in the base frame via an adapter including a portion which defines at least a portion of the negative-pressure measure passage.

42. An electric-component transferring apparatus having a suction testing function, comprising:

a plurality of suction devices each of which sucks and holds an electric component by a negative pressure;

a suction-device moving device which moves each of the suction devices;

a negative-pressure control device which controls the negative pressure supplied to said each suction device;

a negative-pressure measuring device which measures the negative pressure of said each suction device;

a test control device which controls the suction-device moving device, the negative-pressure control device, and the negative-pressure measuring device so that the suction-device moving device moves the suction device to a position where the negative-pressure measuring device is present and the measuring device measures the negative pressure of said each suction device;

the negative-pressure measuring device comprising a base frame; a negative-pressure measure passage which is formed in the base frame and has an opening in an outer surface of the base frame; and a negative-pressure sensor which measures a negative pressure in the measure passage;

the negative-pressure sensor being fixed to the base frame in a state in which the sensor can measure the negative pressure in the negative-pressure measure passage;

the negative-pressure sensor comprising a housing including a portion which is airtightly fit in the base frame and which defines at least a portion of the negative-pressure measure passage.

43. An electric-component transferring apparatus having a suction testing function, comprising:

at least one suction device which sucks and holds an electric component by a negative pressure;

a suction-device moving device which moves the suction device;

a negative-pressure control device which controls the negative pressure supplied to the suction device;

a negative-pressure measuring device which measures the negative pressure of the suction device, the negative-pressure measuring device comprising a base frame, a negative-pressure measure passage which is formed in the base frame and has an opening in an outer surface of the base frame, and a negative-pressure sensor which is connected to the negative-pressure measure passage and measures a negative pressure in said measure passage;

a test control device which controls the suction-device moving device, the negative-pressure control device, and the negative-pressure measuring device so that the suction-device moving device moves the suction device relative to the measuring device to a position where the suction device is contacted with the outer surface of the base frame of the measuring device and is communicated with the negative-pressure measure passage thereof and the negative-pressure sensor measures the negative pressure of the suctioned device by measuring the negative pressure in said measure passage, the negative-pressure measuring device further comprising a leakage control device which is connected to the negative-pressure measure passage and which is selectively operable in a leakage-permitting state in which the leakage control device permits air leakage to the negative-pressure measure passage and a leakage-inhibiting state in which the leakage control device substantially inhibits the air leakage to said measure passage, the negative-pressure sensor measuring, in a measurement state in which the suction device is held in contact with the outer surface of the base frame of the negative-pressure measuring device and is held in communication with the negative-pressure measure passage thereof, a first negative pressure value in said measure passage when the leakage control device is operated in the leakage-permitting state, and measuring, in said measurement state, a second negative pressure value in said measure passage when the leakage control device is operated in the leakage-inhibiting state.

44. A method of testing a suction device including a suction nozzle which, at a free end thereof, sucks and holds, by a negative pressure, an electric component supplied from an electric-component supply device, for evaluating the sucking function of the suction device, comprising the steps of:

moving, while the suction device is not supplied with any electric components from the electric-component supply device, at least one of the suction device and a contact member different from the electric components, relative to each other, so that the free end of the suction nozzle and the contact member contact each other, measuring, using a negative-pressure measuring device, a first negative pressure value in the suction device in a first state in which the free end of the suction nozzle is held in contact with the contact member and substantially no air is permitted to enter the suction nozzle via the free end thereof, intentionally placing, while the suction device is not supplied with any electric components from the electric-component supply device, the suction device in a second state in which air is permitted to enter the suction nozzle via the free end thereof, measuring, using the negative-pressure measuring device, a second negative pressure value in the suction device in said second state, and evaluation the sucking function of the suction device, based on the measured first and second negative pressure values.

* * * * *